United States Patent
Kobayashi et al.

(12) 
(10) Patent No.: US 6,619,301 B2
(45) Date of Patent: Sep. 16, 2003

(54) ULTRASONIC PROCESSING DEVICE AND ELECTRONIC PARTS FABRICATION METHOD USING THE SAME

(75) Inventors: Kazuki Kobayashi, Izumi (JP); Hitoshi Ono, Nara (JP); Yasunobu Tagusa, Ikoma (JP); Tomomi Hikida, Hamana-gun (JP); Yuichi Maida, Toyohashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 220 days.

(21) Appl. No.: 09/738,851

(22) Filed: Dec. 15, 2000

(65) Prior Publication Data

US 2001/0006072 A1 Jul. 5, 2001

(30) Foreign Application Priority Data

Dec. 17, 1999 (JP) .............................. 11-359776
Dec. 17, 1999 (JP) .............................. 11-359805
Dec. 17, 1999 (JP) .............................. 11-359816

(51) Int. Cl.$^7$ .............................................. B08B 3/10
(52) U.S. Cl. ................. 134/1.3; 134/64 R; 134/122 R; 134/131; 134/199; 134/902; 134/25.4
(58) Field of Search .......................... 134/64 R, 122 R, 134/64 P, 122 P, 902, 199, 131, 1, 1.3, 25.4

(56) References Cited

U.S. PATENT DOCUMENTS

| | | | |
|---|---|---|---|
| 3,066,686 A | * | 12/1962 | O'Neill |
| 4,483,571 A | * | 11/1984 | Mishiro |
| 4,504,539 A | * | 3/1985 | Petracek et al. |
| 5,368,054 A | | 11/1994 | Koretsky et al. |
| 5,741,173 A | | 4/1998 | Lundt et al. |
| 5,906,687 A | * | 5/1999 | Masui et al. |
| 6,230,722 B1 | * | 5/2001 | Mitsumori et al. |

FOREIGN PATENT DOCUMENTS

| | | | |
|---|---|---|---|
| DE | 199 39 514 | * | 2/2001 |
| JP | 63-266831 | * | 11/1988 |
| JP | 6-106144 | * | 4/1994 |
| JP | 7-6991 | * | 1/1995 |
| JP | 8-57435 | * | 3/1996 |
| JP | 8-267028 | * | 10/1996 |

(List continued on next page.)

OTHER PUBLICATIONS

Korean Intellectual Property Office First Office Action dated Dec. 23, 2002 (2pp.) and English translation (2pp.).

*Primary Examiner*—Frankie L. Stinson
(74) *Attorney, Agent, or Firm*—Edwards & Angell, LLP; David G. Conlin; George W. Hartnell, III

(57) ABSTRACT

To provide an ultrasonic processing device that is capable of effectively carrying out a cleaning operation, a resist-stripping operation, etc. by projecting ultrasonic uniformly over an entirety of the ultrasonic processing target region by means of ultrasonic oscillation elements each having a width smaller than an ultrasonic processing target region of a processing object, as well as to provide an electronic parts fabrication method using the foregoing device, a plurality of ultrasonic oscillation elements are arranged so as to planarly extend in a glass substrate transport direction and in a glass substrate width direction, and projected figures obtained by projecting said ultrasonic oscillation elements to a plane perpendicular to the glass substrate transport direction form a single belt-like region of a width exceeding a width of the ultrasonic processing target region. The foregoing arrangement causes ultrasonic-projected regions of the ultrasonic oscillation elements to partly overlap each other on a surface of the glass substrate when the glass substrate is transported by transport rollers in the transport direction, thereby enabling ultrasonic projection over the complete entirety of the ultrasonic processing target region.

53 Claims, 49 Drawing Sheets

FOREIGN PATENT DOCUMENTS

| | | | |
|---|---|---|---|
| JP | 8-318235 | * | 12/1996 |
| JP | 9-19667 | * | 1/1997 |
| JP | 9-192618 | * | 7/1997 |
| JP | 9-206715 | * | 8/1997 |
| JP | 9-327671 | * | 12/1997 |
| JP | 10-106998 | | 4/1998 |
| JP | 10-177978 | | 6/1998 |
| JP | 10-189528 | * | 7/1998 |
| JP | 2001-104897 | * | 4/2001 |
| JP | 2001-334222 | * | 12/2001 |
| KR | 0146272 | | 5/1998 |

\* cited by examiner

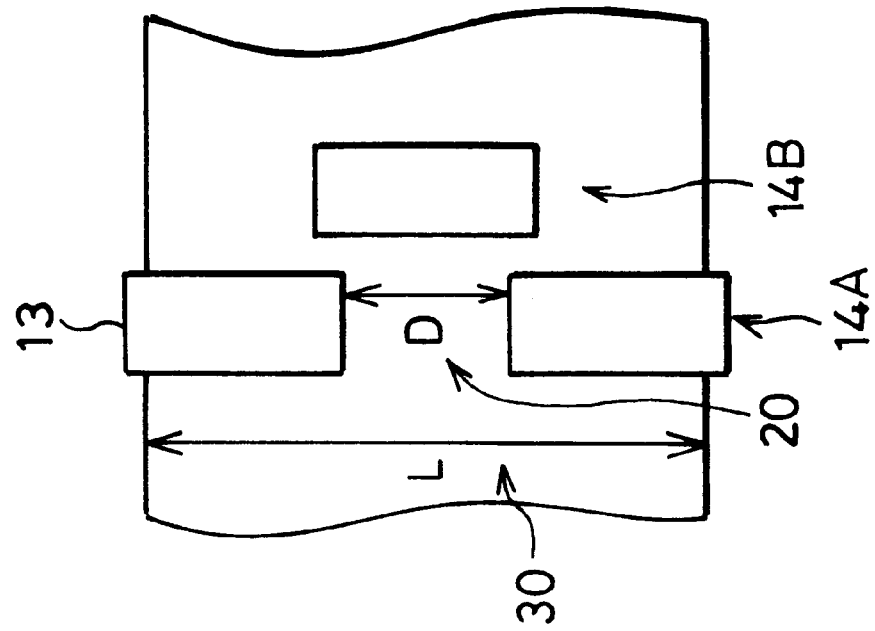
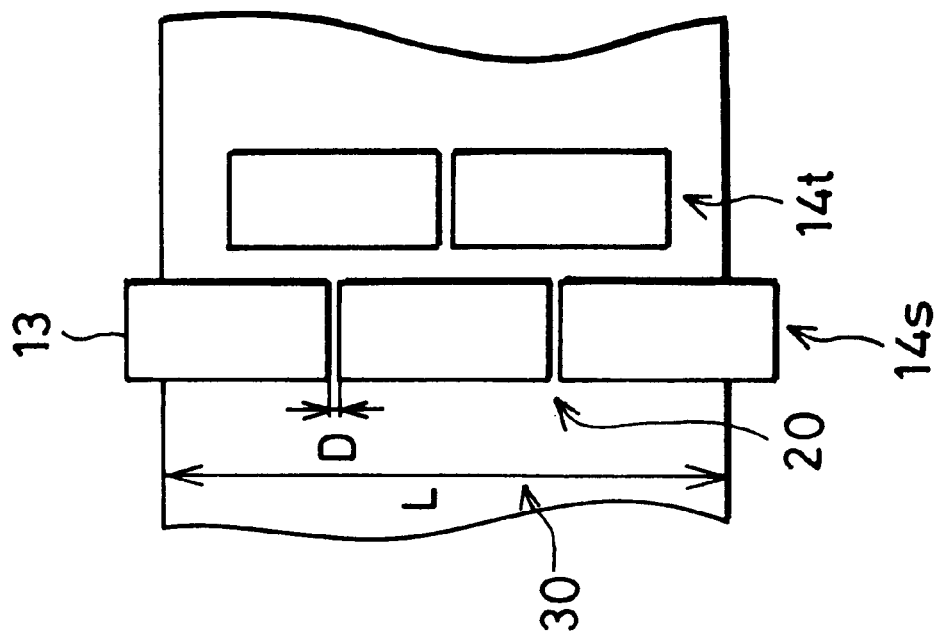

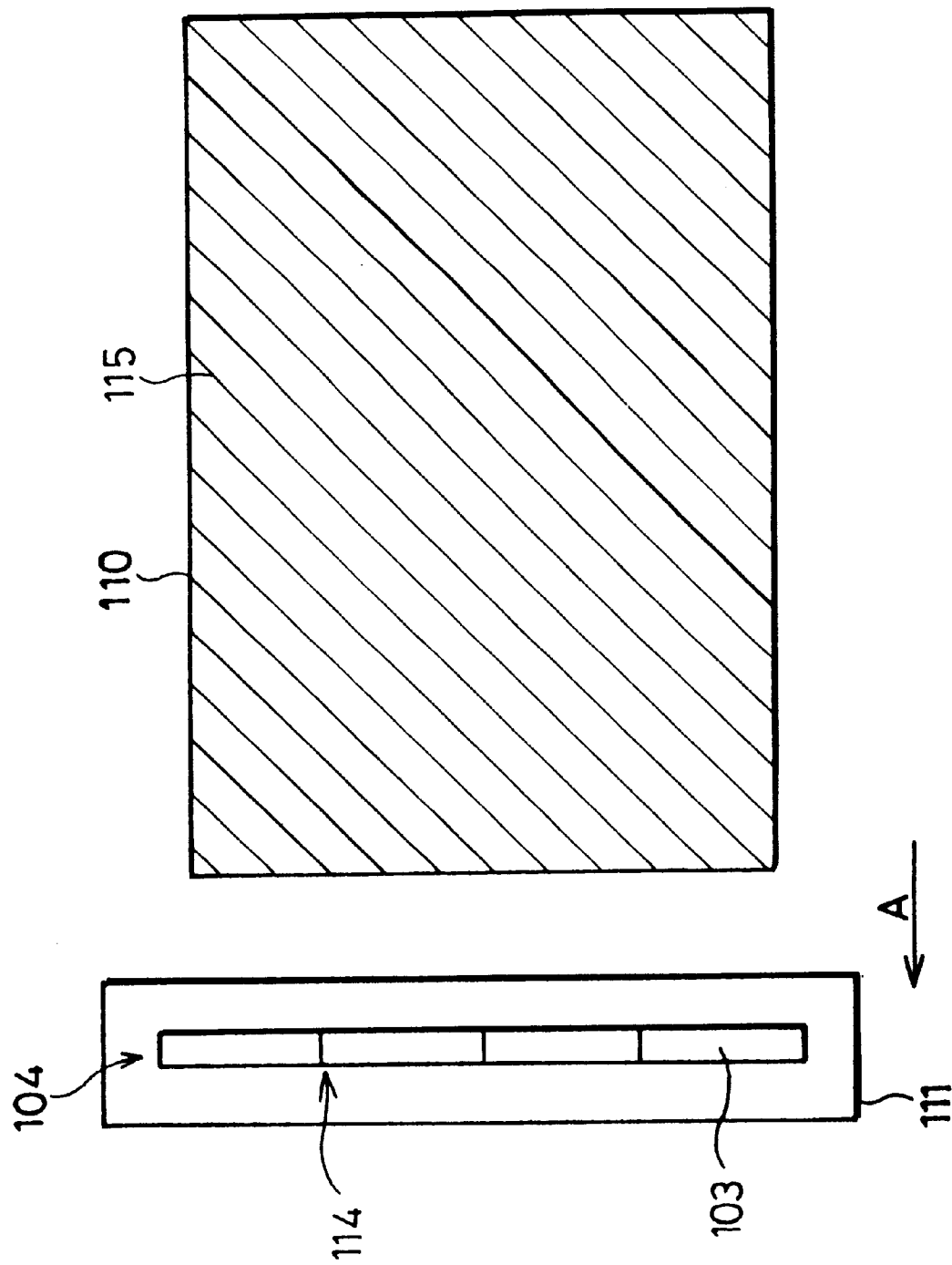

ULTRASONIC PROCESSING DEVICE AND ELECTRONIC PARTS FABRICATION METHOD USING THE SAME

FIELD OF THE INVENTION

The present invention relates to:

(i) an ultrasonic processing device (for instance, an ultrasonic cleaning device, a resist-stripping device) used in a process for fabricating electronic parts of, for example, flat displays such as a liquid crystal display element, a PDP (plasma display panel), and an EL (electro-luminescent) panel, sensor elements of plane- or line-scanning types such as an image sensor, semiconductors such as LSI, solar butteries, and printed-circuit substrates; and (ii) a method for fabricating electronic parts, using the foregoing device.

The present invention particularly relates to an ultrasonic processing device that can be adapted as an ultrasonic cleaning device and as a resist-stripping device effective for processing a large-size substrate with a width of several hundreds millimeters or over, as well as to a method for fabricating electronic parts using the foregoing device.

BACKGROUND OF THE INVENTION

Conventionally, in fabrication of electronic parts of flat displays such as a liquid crystal display element, a PDP (plasma display panel), and an EL (electro-luminescent) panel, sensor elements of plane- or line-scanning types such as an image sensor, and semiconductors, a cleaning process for removing particles, soils, and the like adhering to substrates, etc. is indispensable.

Further, in fabrication of such electronic parts, a photo-lithography process with use of resist is repeatedly applied so as to form predetermined patterns on a substrate. Since the resist need be removed from the substrate upon completion of the photolithography process, the resist-stripping process is indispensable in fabrication of electronic parts in many cases.

Therefore, to efficiently execute the foregoing cleaning process and the resist removing process, cleaning devices or resist-stripping devices of various arrangements have been used conventionally. As the cleaning device or the resist-stripping device, an ultrasonic processing device is often used, since the foregoing cleaning process and the resist-stripping process, in particular, become more efficient if they are executed with projection of ultrasonic.

For instance, a first example of the same is a batch-type ultrasonic processing device (ultrasonic cleaning device). A cleaning section provided in an ultrasonic processing device of this type is arranged so as to be equipped with, as shown in FIG. 35, an ultrasonic oscillation element (vibrating element) 103 such as a vibrating plate (diaphragm), at a bottom of a cleaning bath 101 reservoiring cleaning liquid (liquid). In the cleaning section, flow 102 is formed in the cleaning liquid while a processing object such as a substrate 110 is dipped in the cleaning liquid, and in this state the ultrasonic oscillation element 103 is caused to generate ultrasonic. This causes ultrasonic to be projected to the cleaning liquid, then to the processing object via the cleaning liquid, thereby causing the processing object to be cleaned. Incidentally, in FIG. 35, the device is drawn in a simplified manner for conveniences' sake, and a concrete arrangement for forming the flow 102 of the cleaning liquid in the cleaning bath 101 is omitted.

Next, a second example of the ultrasonic processing device is a nozzle-type ultrasonic processing device in which processing liquid (liquid) to which ultrasonic is projected is supplied through a nozzle to a processing object. A processing section provided in the ultrasonic processing device of this type is equipped with an ultrasonic processing nozzle 111 disposed above a substrate 110 as a processing object, as shown in FIG. 36. Besides, the ultrasonic processing nozzle 111 has a nozzle opening 112 in a slit form that is provided along a width direction substantially orthogonal to a transport direction of the substrate 110.

In the nozzle-type arrangement, the substrate 110 as the processing object is transported in the predetermined transport direction (indicated by an arrow A in the figure) while it is horizontally held. To an upper surface of the substrate 110 being transported, processing liquid (pure water, for instance, is used as cleaning liquid) 107 to which ultrasonic is projected (applied) by the ultrasonic oscillation element 103 is jetted through the nozzle opening 112 of the ultrasonic processing nozzle 111.

In other words, in the foregoing ultrasonic processing device of the nozzle type, processing liquid to which ultrasonic is projected is jetted through the ultrasonic processing nozzle 111 provided in the width direction, over the entire width-direction dimension of the processing object that is traveling. As a result, as the processing object is traveling, the whole surface of the processing object is subjected to the ultrasonic processing (for instance, cleaning). This, in the case of cleaning for instance, enables to efficiently remove fine particles (particles), soils or the like, made of an organic material and a metal, that adhere to the substrate 110, while in the case of resist stripping, this enables to efficiently remove resist.

Furthermore, a third example of the ultrasonic processing device is a wet processing device disclosed by the Japanese Publication for Laid-Open Patent Application No. 177978/1998 (Tokukaihei 10-177978 [Date of Publication: Jun. 30, 1998). As shown in FIG. 37, this wet processing device is provided with (i) an introduction path 122 having an inlet 121 at one end thereof for supplying wet processing liquid 117, (ii) a discharge path 124 having an outlet 123 at one end thereof for discharging wet processing liquid 117a having been used for wet processing, out of the wet processing system, and (iii) an opening section 126 that is opened toward a processing object such as a substrate 110, at an intersection 125 where the introduction path 122 and the discharge path 124 cross so that the other end of the introduction path 122 and the other end of the discharge path 124 meet each other.

The foregoing introduction path 122 inclines so that the inlet 121 side part is disposed upper than the intersection 125 side part, while the discharge path 124 likewise inclines so that the outlet 123 side part is disposed upper than the intersection 125 side part. The wet processing liquid 117 is introduced by the inclining introduction path 122 and supplied via the opening section 126 to the substrate 110 that travels in the arrow A direction in the figure, so that a desired wet processing operation is performed. The wet processing liquid 117a having been used in the processing operation is discharged out of the wet processing system through the discharge path 124.

In the wet processing device arranged as above, ultrasonic may be projected during the wet processing operation. For instance, as shown in FIGS. 38(a) and 38(b), a singularity of an ultrasonic oscillation element 103 may be provided above the intersection 125. Alternatively, as shown in FIG. 39, a plurality (three in the figure) of ultrasonic oscillation elements 103 may be linearly arranged in a width direction of the processing object (horizontal direction) above the intersection 125. Alternatively, as shown in FIGS. 40(a) and 40(b), a plurality (three in the figures) of ultrasonic oscillation elements 103 may be linearly arrayed in a transport direction of the processing object (in this case, in a lengthwise direction of the processing object). By so doing, projection of ultrasonic is enabled. (In FIGS. 38(b), 39, and 40(b) the position of the ultrasonic element(s) 103 falls on the position of the intersection 125, but the reference numeral thereof is omitted for conveniences' sake.)

The foregoing wet processing device, since being arranged as above, exhibits a higher processing capability than conventionally, while a quantity of the wet processing liquid 117 used can be decreased by not less than one tenth. Moreover, in the case where the ultrasonic oscillation element(s) 103 is (are) provided as described above, a processing object is subjected to projection of ultrasonic as well as the wet processing operation, whereby the processing capability is enhanced.

Furthermore, a fourth example of the ultrasonic processing device is an ultrasonic processing device disclosed in the Japanese Publication for Laid-Open Patent Application No. 106998 (Tokukaihei 10-106998 [Date of Publication: Apr. 24, 1998]). As shown in FIG. 41, this ultrasonic processing device, aimed for applying a predetermined processing operation to a substrate 230 such as a liquid-crystal-use glass substrate as a processing object with use of lower surface processing liquid $L_1$ and upper surface processing liquid $L_2$, is arranged to include: a transport system 231 for transporting the substrate 230 in a predetermined direction by means of a plurality of rollers that support the substrate 230 from its lower surface; an oscillation container 232 that opens upward and to whose inside the lower surface processing liquid $L_1$ is supplied; an ultrasonic vibrator 233 that is provided at the bottom of the oscillation container 232 and that applies ultrasonic vibration to the lower surface processing liquid $L_1$ supplied to the inside of the oscillation container 232 by means of a vibrating plate 233a; an ultrasonic oscillator including an electric circuit connected with the ultrasonic vibrator 233; and a plurality of nozzles 234 that are provided above the substrate 230 and that supply the upper surface processing liquid $L_2$ with respect to the upper surface of the substrate 230. Incidentally, the foregoing ultrasonic vibrator 233 and the vibrating plate 233a compose a vibrating element section (vibrating element) for applying ultrasonic vibration with respect to the lower surface processing liquid $L_1$.

In the foregoing ultrasonic processing device of the fourth example, the ultrasonic processing operation with respect to the substrate 230 is performed as follows: (1) the substrate 230 is transported in a manner such that the lower surface thereof is brought into contact with the lower surface processing liquid $L_1$ that is pushed up to above a level surface of the liquid in the oscillation container 232 by ultrasonic vibration applied thereto by the vibrating plate 233a; and (2) the upper surface processing liquid $L_2$ is supplied from two positions so that the two streams collide at an area of the upper surface of the substrate 230, opposite to the area of the lower surface of the substrate 230 in contact with the lower surface processing liquid $L_1$.

Incidentally, the recent tendency of the manufacture of electronic parts of semiconductor devices, liquid crystal display (LCD) elements, etc. is such that a large number of electronic parts are simultaneously fabricated for enhancement of productivity. Further, in the case of LCD elements in particular, larger-size base substrates from which electronic parts are produced are used, since LCD elements with large-size screens (for instance, those with diagonals of not less than 20 to 30 inches) are demanded.

The following is a concrete example of an LCD element. In the case of a TFT (thin film transistor)—type LCD element, when industrial mass production was substantially started, a size of a base substrate was more or less 300 mm×400 mm. Recently, however, the size of a base substrate is not less than several hundreds millimeters square, and those nearly 1 meter long in the lengthwise direction has become subjected to mass production.

Furthermore, from the viewpoint of enhancement of productivity of the foregoing electronic parts, the fabrication of electronic parts is preferably performed as incessantly as possible. For instance, it is not preferable that the fabrication process includes a process in which electronic parts are left to stand for a certain period, since it lowers productivity.

The ultrasonic processing devices or wet processing device of the foregoing first through fourth examples raise a problem that they cannot to fully meet requirements for such enhancement of productivity in the production of electronic parts.

First of all, in the case of the batch-type ultrasonic processing device of the first example, the processing object (substrate 110 shown in FIG. 35) has to be left to stand for a certain period during the ultrasonic processing operation. Therefore, the lowering of productivity in the production of electronic parts could possibly be caused. Furthermore, the ultrasonic processing device of this type requires volumes of processing liquid, and moreover, in the cleaning case, the processing operation tend to become non-uniform, since the processing liquid could be retained or the flow velocity could vary unless the flow 102 of the processing liquid (cleaning liquid) in the processing bath is sufficiently controlled.

Furthermore, to compensate the lowering of productivity, in using the foregoing batch-type ultrasonic processing device, usually a plurality of processing objects (electronic parts) are simultaneously processed, as shown in FIG. 35 (in FIG. 35, a plurality of substrates 110 are provided in the cleaning bath 101, with the lengthwise direction of the substrate 110 matched to the vertical direction). This simultaneous processing however tends to cause higher frequency of such processing liquid retention as well as an increase in variation of the flow velocity. Besides, in the cleaning case, the processing liquid reservoired in the processing bath is normally recycled through filters or the like and re-used, and replaced after a certain period elapsed, but the cleaning operations tend to vary as time passes, due to degradation of quality of the processing liquid.

Furthermore, in the case where a plurality of processing objects are simultaneously processed, or in the case where a larger-size processing object is processed, the foregoing processing bath (cleaning bath 101 in FIG. 35) need be in a larger size. This means that the entirety of the ultrasonic processing device need be in a larger size.

Next, in the nozzle-type ultrasonic processing device of the second example, in the case where the processing object is a large-size substrate 110, it is necessary to employ a singularity of a large and long ultrasonic oscillation element 113 in the ultrasonic processing nozzle 111, in place of the ultrasonic oscillation element 103 that is normally used, as shown in FIG. 42. This is for projection of ultrasonic over the entire width-direction dimension of a processing object. Such a large and long ultrasonic oscillation element 113, however, has a problem of insufficient reliability.

More specifically, since the foregoing ultrasonic oscillation elements 103 and 113 are made of ceramic, produced by baking, production of an ultrasonic oscillation element long in length such as the ultrasonic oscillation element 113 necessarily undergo the following drawbacks: (1) it is difficult to produce the elements in uniform sizes; (2) it is less resistible against local cracks due to stress caused by heating or the like, thereby having low reliability; (3) ultrasonic output is uneven inside the ultrasonic oscillation element 113; and (4) as to a plurality of ultrasonic oscillation elements 113, they have great differences between their ultrasonic outputs.

In other words, in the case of nozzle-type ultrasonic processing devices, they cost high since it is difficult to manufacture the ultrasonic oscillation elements 113 as a key of the processing operation in stable qualities. Besides, margins need be added to the period required for manufacture of the ultrasonic oscillation element 113, causing the manufacture period to be prolonged, thereby resulting in that it is not suitable for practical application.

Then, applied to the foregoing nozzle-type ultrasonic processing device is a technique of employing the ultrasonic oscillation element 103, which is a standard product, or a quasi-standard product, which is easily available, and which is highly reliable. In this technique, a plurality of the ultrasonic oscillation elements 103 are arrayed in series as shown in FIG. 43 over the width-direction dimension of the processing object, so as to form an element array 104. By so doing, it is theoretically possible to project ultrasonic over the entire width-direction dimension of the substrate 110 from the ultrasonic processing nozzle 111, in the case where the processing object is a large-size substrate 110 as above.

Actually, however, the foregoing technique of forming the element array 104 leads to a problem that uniform ultrasonic processing operations cannot be performed.

Even though the ultrasonic oscillation elements 103 are produced in the same manner, their ultrasonic outputs more or less vary from one another, and in forming the element array 104, a circuit for correcting the output variation is required in each of the ultrasonic oscillation elements 103. Therefore, in forming the element array 104, insulating regions (herein synonymous with element spaces) 114 in a predetermined width each must be formed between the ultrasonic oscillation elements 103.

Actual spaces as the insulating regions 114 depend on the type and size of the ultrasonic oscillation elements 103, but in the case where oscillation elements W-357LS-380 each equipped with a vibrating plate of 100 mm×15 mm in size (available from Honda Electronics Co., Ltd.) are used, spaces of at least about 0.2 mm each are formed as the insulating regions 114.

By forming the insulating regions 114, the ultrasonic oscillation elements 103 are insulated from each other, thereby causing variation of the outputs to be surely corrected, and in addition, suppressing an undesired interference effect of ultrasonic generated by adjacent ultrasonic oscillation elements 103.

At portions of the processing object corresponding to the foregoing insulating regions 114, however, ultrasonic is not sufficiently projected. Therefore, even if conditions such as the frequency of the ultrasonic, the output of the ultrasonic, and the flow rate of the processing liquid are optimized to some extent and the ultrasonic projection is carried out during a certain period, the foregoing portions corresponding to the insulating regions 114 cannot obtain the same effects of the ultrasonic projection as those at the other portions. Such non-uniformity in the processing operation causes a longer processing period to be required, or causes variation in processing periods thereby making efficient processing of an entire surface of the processing object difficult, as well as other problems.

Furthermore, the aforementioned value of about 0.2 mm as the space functioning as the insulating region (element space) 114 is a minimum requisite value that allows the region to exhibit effects such as suppression of the interference effect of ultrasonic and insulation, and a greater space is preferably provided so as to more efficiently avoid the interference effect and the like. Setting the space for the insulating region 114 greater, however, leads to a problem that the processing operation become further less uniform. Incidentally, the minimum requisite space (at, for instance, a value of about 0.2 mm) is hereinafter referred to as interference avoidance space.

The following description will explain how the processing operation becomes non-uniform. For instance, a substrate 110 to which not less than several hundreds of foreign substances (particles) or soils 100 adhere, as shown in FIG. 44, is subjected to a cleaning operation by means of an ultrasonic cleaning device adapting the foregoing technique that uses the foregoing element array 104, for a certain period (for instance, for a time of t). As a result, as shown in FIG. 45(a), the foreign substances or soils 100 remain at portions of the substrate 110 corresponding to the insulating regions 114 (indicated by two-dot chain lines in the figure).

On the other hand, in the case where the processing operation is continued for more than the foregoing period (for instance, for not less than a time of 2 t, which is twice the time of t), substantially all the foregoing substances or soils 100 are removed as shown in FIG. 45(b). However, it also results in an increase in the cleaning operation time, wasteful use of the cleaning liquid, and wasteful use of electric power by the device. Furthermore, an increase in the spaces for the insulating regions 114 could possibly make it difficult to eliminate non-uniformity of the cleaning operation, even with much time spent for the cleaning operation.

In the case where an adhesive force of the foreign substances or soils 100 is weak, or in the case where the foreign substances or soils 100 are few in number as shown in FIG. 46, however, it is possible to clean the same at a sufficient probability as shown in FIGS. 47(a) and 47(b), by means of the foregoing device, if it is used as a finishing cleaning bath. Incidentally, FIG. 47(a) illustrates a result of a cleaning operation carried out for a time of t, while FIG. 47(b) illustrates a result of a cleaning operation carried out for a time of not less than 2 t.

Furthermore, identical problems arise in the case of a resist-stripping device. For instance, as shown in FIG. 48, resist (photoresist) 115 for formation of patterns by photolithography is laminated in a film form (indicated by hatching in the figure) on a surface of the substrate 110. After the photolithography process, a resist-stripping operation is carried out for a certain period (for instance, for a time of t) by means of a resist-stripping device adapting the foregoing technique for forming the element array 104. As a result, as shown in FIG. 49(a), most of the resist can be stripped, but the resist remains in a line form at portions of the substrate 110 corresponding to the insulating regions 114.

To investigate the cause, strengths of ultrasonic were measured at a center of the ultrasonic oscillation element 103 and at the foregoing insulating region 114. As a result, it was discovered that the strength of ultrasonic lowers at the insulating region 114 to about 50% to 60% of that at the center of the ultrasonic oscillation element 103 (in-plane strength distribution occurs). This is because the element array 104 vibration does not show in-plane uniformity.

Furthermore, even in the case where the resist-stripping operation is continued for a period twice the normal period (for a time of not less than 2 t) like the case of the ultrasonic cleaning device, the resist cannot be completely removed, remaining at portions corresponding to the insulating regions 114, as shown in FIG. 49(b). Moreover, in the case where the output is forcibly increased so as to surely strip the resist from an entirety of the surface of the substrate 110, there is a possibility that characteristics of TFT elements and the like provided on the substrate 110 could shift, or such elements could be damaged.

Incidentally, the foregoing substrate 110 has a substrate size of, for instance, 360 mm×465 mm, and is provided with fine patterns in the μm order on its surface, but the patterns are omitted in the figures since it is impossible to illustrate such fine patterns. Further, it was discovered that, in the case where a process for stripping the resist by ultrasonic processing is applied after the resist is laminated on the entire surface of the substrate 110 as described above, uniformity of the ultrasonic projection ability of the ultrasonic processing device can be evaluated.

Furthermore, the foregoing ultrasonic oscillation element 103 is damaged or broken during a short period due to heat generated, unless it is operated in liquid without bubbles or the like. Therefore, during the ultrasonic oscillation, surroundings of the ultrasonic oscillation element 103 need be filled with liquid such as the processing liquid 107.

The above-described nozzle-type ultrasonic processing device, however, has a nozzle opening 112 facing downwards above the substrate 110 as the processing object, and is arranged so that the processing liquid 107 is jetted downwards through the nozzle opening 112 (see FIG. 36). Therefore, bubbles tend to intrude through the nozzle opening 112. Furthermore, a distribution path of the processing liquid 107 (more specifically, an ultrasonic processing nozzle 111, a cleaning-liquid-supply pipe, a cleaning-liquid-supply pump, etc.) extends downwards or diagonally downwards, and bubbles generated upon operation of the ultrasonic oscillation element 103 provided in the distribution path (more specifically, inside the ultrasonic processing nozzle 111) tend to remain therearound. Moreover, the bubbles having intruded therein are hardly discharged to outside the distribution path of the processing liquid 107.

Therefore, to flow the processing liquid 107 without stagnation so as to prevent bubbles from remaining around the ultrasonic oscillation element 103, a complex structure is required, which is, for instance, characterized as follows: (1) a plurality of processing liquid supply paths are provided inside the ultrasonic processing nozzle 111; and (2) the inside wall of the ultrasonic processing nozzle 111 is formed in a tapered shape. Besides, to discharge bubbles through the nozzle opening 112, it is necessary to flow a great quantity of the processing liquid 107 at all times, with the opening area of the nozzle opening 112 and the like taken into consideration. These problems have become severer as the substrate 110 processed becomes larger in size.

In the case of the foregoing wet processing device of the third example also, there arise identical problems to those of the nozzle-type device of the second example. Namely, it becomes difficult to adapt a longer ultrasonic oscillation element 113 suitable for a processing object that becomes in a larger size. On the other hand, in the case where an ultrasonic oscillation element 103 of a normal size is used, the processing operation becomes non-uniform, with resultant effects at portions corresponding to the insulating regions 114 differing from those of the other portions.

Finally, in the case of the ultrasonic processing device of the fourth example, it is difficult to push up the lower surface processing liquid $L_1$ uniformly to a large-size processing object such as a long substrate, and therefore, it is difficult to apply a uniform processing operation with respect to the foregoing processing object. Furthermore, since it is arranged so that the lower surface processing liquid $L_1$ supplied from the bottom of the oscillation container 232 is discharged over the upper edges of the oscillation container 232, the flow velocity of the lower surface processing liquid $L_1$ that is brought into contact with the substrate 230 is lower. Therefore, the processing operation of spraying the upper surface processing liquid $L_2$ in a shower form over an upper surface of the substrate 230 provides high effects, while the processing operation with respect to the lower surface of the substrate 230 provides effects relatively low. As a result, there arise, for example, the following problems: (1) the upper surface processing liquid supplied to the upper surface of the substrate 230 goes round to the lower surface, thereby causing foreign substances to adhere to the lower surface again; and (2) since the simultaneous processing with respect to the both surfaces is not highly effective, inversion processing of the substrate 230, for example, is required. Furthermore, like in the cases of the second and third examples, it becomes difficult to adapt a longer ultrasonic oscillation element suitable for a processing object (equivalent to the substrate 230) that becomes in a larger size. On the other hand, in the case where an ultrasonic oscillation element (here, equivalent to a vibrating plate 233a disposed inside the oscillation container 232) of a normal size is used, the processing operation becomes non-uniform, with resultant effects at portions corresponding to the insulating regions between the ultrasonic oscillation elements differing from those of the other portions.

SUMMARY OF THE INVENTION

The present invention was made to solve the aforementioned problems, and an object of the present invention is to provide an ultrasonic processing device that is capable of effectively carrying out a cleaning operation, a resist-stripping operation, etc. by projecting ultrasonic uniformly over an entirety of the a large region by means of vibrating elements each having a size smaller than a region to be subjected to ultrasonic, as well as to provide an electronic parts fabrication method using the foregoing device.

To achieve the foregoing object, an ultrasonic processing device in accordance with the present invention is an ultrasonic processing device for applying an ultrasonic processing operation to a processing object, the device is arranged so as to include (1) plurality of vibrating elements for generating ultrasonic, and (2) means for moving the processing object in a predetermined direction relatively with respect to the vibrating elements, and the device is further arranged so that (i) regions to which the vibrating elements project ultrasonic are ultrasonic-projected regions each having a predetermined width in a width direction that is substantially orthogonal to the predetermined direction, and a whole arrangement of the plurality of vibrating elements planarly extend in the predetermined direction and in the width direction, and that (ii) by moving the processing object relatively in the predetermined direction, ultrasonic-projected regions of the vibrating elements are caused to cover an ultrasonic processing target region of the processing object, so that ultrasonic should be projected to a complete entirety of the ultrasonic processing target region.

For instance, in the case where a width of an ultrasonic-projected region by each vibrating element (equivalent to the foregoing predetermined width) is smaller than a width of the ultrasonic processing target region of the processing object, ultrasonic projection to an entirety of the ultrasonic processing target region was conventionally impossible without a vibrating element as long as or longer than the width of the ultrasonic processing target region.

However, according to the foregoing arrangement, a plurality of vibrating elements are arranged so as to planarly extend in the predetermined direction and the width direction both, as well as so that, when the respective ultrasonic-projected regions by the vibrating elements fall on the ultrasonic processing target region, the foregoing ultrasonic processing target region is completely (non-defectively) covered with the ultrasonic-projected regions, resulting in that ultrasonic is projected throughout the entirety of the ultrasonic processing target region non-defectively. Therefore, uniform projection of ultrasonic to a large region is ensured with use of vibrating elements that are easy to get and have high reliability, standard products or quasi-standard products.

Therefore, a uniform ultrasonic processing operation with respect to an entirety of a surface of a large-size processing object can be realized, and ultrasonic processing operations can be uniformly applied to a plurality of processing objects under the same conditions. Consequently, it is possible to realize a uniform ultrasonic processing operation of high performance. Besides, since the processing time can be shortened, processing costs can be reduced.

Therefore, this enables uniform ultrasonic projection to a large-area region by means of a combination of a plurality of vibrating elements that are easy to get and have high reliability such as standard products or quasi-standard products, not requiring preparation of a long vibrating element.

Incidentally, needless to say, "ultrasonic-projected regions of the vibrating elements are caused to overlap each other on an ultrasonic processing target region" may indicate that "the ultrasonic-projected regions are caused to partly overlap each other so as to completely cover the ultrasonic processing target region.

Furthermore, to achieve the aforementioned object, an electronic parts fabrication method in accordance with the present invention is an electronic parts fabrication method including the ultrasonic processing step for applying an ultrasonic processing operation to a processing object, and the method is arranged so that (i) in the ultrasonic processing step, a plurality of vibrating elements for generating ultrasonic are used, and that (ii) the ultrasonic processing step includes the sub-step of moving the processing object in a predetermined direction relatively with respect to the vibrating elements, so that ultrasonic-projected regions of the vibrating elements should be caused to partly overlap each other on an ultrasonic processing target region of the processing object, in order to cause ultrasonic to be projected to a complete entirety of the ultrasonic processing target region.

According to the foregoing method, the vibrating elements are arranged so that their ultrasonic-projected regions partly overlap each other so as to completely cover the entirety of the foregoing ultrasonic-processing region, resulting in that ultrasonic is projected throughout the entirety of the ultrasonic processing target region non-defectively. Therefore, uniform projection of ultrasonic to a large region is ensured with use of vibrating elements that are easy to get and have high reliability, standard products or quasi-standard products. Besides, since the processing time can be shortened, processing costs can be reduced.

For a fuller understanding of the nature and advantages of the invention, reference should be made to the ensuing detailed description taken in conjunction with the accompanying drawings.

BRIEF DESCRIPTION OF THE DRAWINGS

FIG. 10(a) is an explanatory view illustrating relationship between a length of an element array in the first line in the ultrasonic processing device shown in FIG. 7 and a width of an ultrasonic processing target region, and FIG. 10(b) is an explanatory view illustrating relationship between a length of an element array in the second line in the ultrasonic processing device shown in FIG. 7 and the width of the ultrasonic processing target region.

FIG. 48 is an explanatory view illustrating an example of a state in which a resist-stripping operation is carried out by means of a nozzle-type ultrasonic processing device shown in FIG. 43.

DESCRIPTION OF THE PREFERRED EMBODIMENTS

[First Embodiment]

The following description will explain an embodiment of the present invention, while referring to FIGS. 1 through 6. However, note that the present invention is not limited to this embodiment.

An ultrasonic processing device in accordance with the present invention is arranged as follows: a plurality of vibrating elements each capable of projecting ultrasonic to a region with a width smaller than that of a desired processing region in a predetermined processing operation with respect to a processing object by supplying processing liquid to the processing object while projecting ultrasonic thereto, are arrayed in, for example, not less than two arrays so that vibrating elements in different arrays have a superimposition region in a direction in which the arrays are juxtaposed.

For explanation of the present embodiment, an ultrasonic cleaning device that cleans a processing object while projecting ultrasonic is taken as an example of the foregoing ultrasonic processing device.

An ultrasonic cleaning device in accordance with the present invention is used for, for example, cleaning a glass substrate for an LCD element, in a process of LCD element fabrication. In other words, in this case, the processing object (cleaning object) is a glass substrate.

Figure 2:
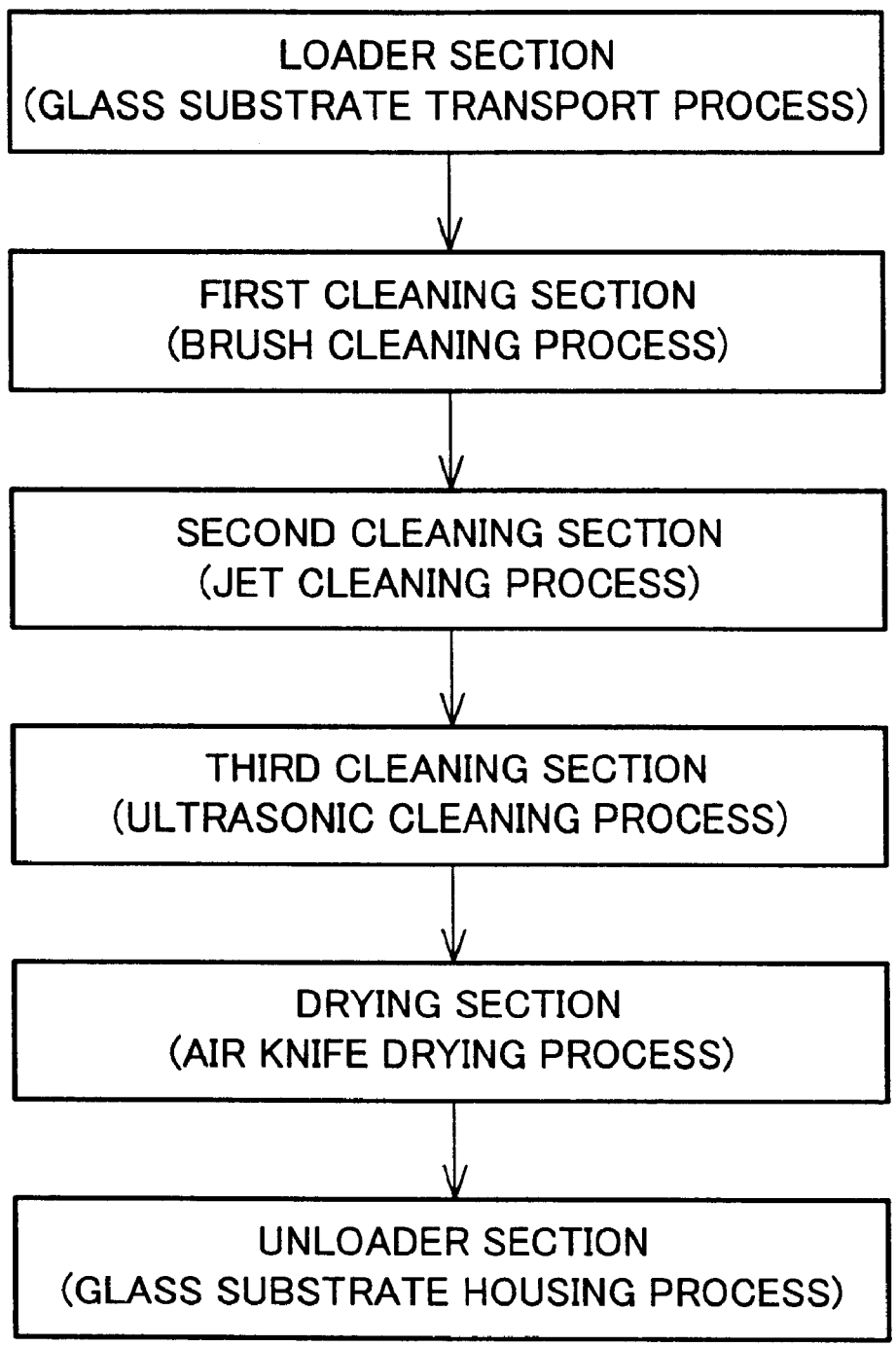
FIG. 2 is a flowchart illustrating a process of a cleaning operation applied to a glass substrate in an LCD element in which the ultrasonic processing device shown in FIG. 1 is employed.

A process of cleaning a glass substrate, taken as an example of the present embodiment, is performed by units including a loader section, a first cleaning section, a second cleaning section, a third cleaning section (ultrasonic cleaning section), a drying section, and an unloader section, in the stated order from an upstream side in a direction of transport of the glass substrate (travelling direction), as shown in FIG. 2. Incidentally, the first, second, and third cleaning sections are hereinafter collectively referred to as a cleaning section. In the foregoing cleaning process, the glass substrate is transported from one unit to another unit by means of transport means such as conveyer means, transport rollers, etc.

In the loader section, from a transport-use cassette that is capable of housing a plurality of glass substrates (for instance, 20 substrates), the glass substrates are taken out one by one successively, and are horizontally sent out to the cleaning section at uniform intervals (GLASS SUBSTRATE TRANSPORT PROCESS). Incidentally, the transport velocity of the glass substrates is, for instance, 600 mm/min., which is common to all the units involved in the cleaning process.

The cleaning operation with respect to the glass substrates transported to the cleaning section from the loader section is concretely performed as follows. First of all, cleaning by means of a brush in a disk form is carried out at the first cleaning section positioned at the upstream-side end in the transport direction. Here, mainly particles (fine particles) of organic substances and metals with a diameter of not less than 5 $\mu$m are removed (BRUSH CLEANING PROCESS). Subsequently, in the second cleaning section next thereto in the downstream side in the transport direction, particles with a diameter of about 3 $\mu$m to 5 $\mu$m are removed by high-pressure jet cleaning (JET CLEANING PROCESS). Then, in the third cleaning section positioned at the downstream-side end in the transport direction, the ultrasonic cleaning device (ultrasonic processing device) in accordance with the present invention is adapted, so that particles with a diameter of about 1 $\mu$m to 3 $\mu$m are removed (ULTRASONIC CLEANING PROCESS).

Figure 3:
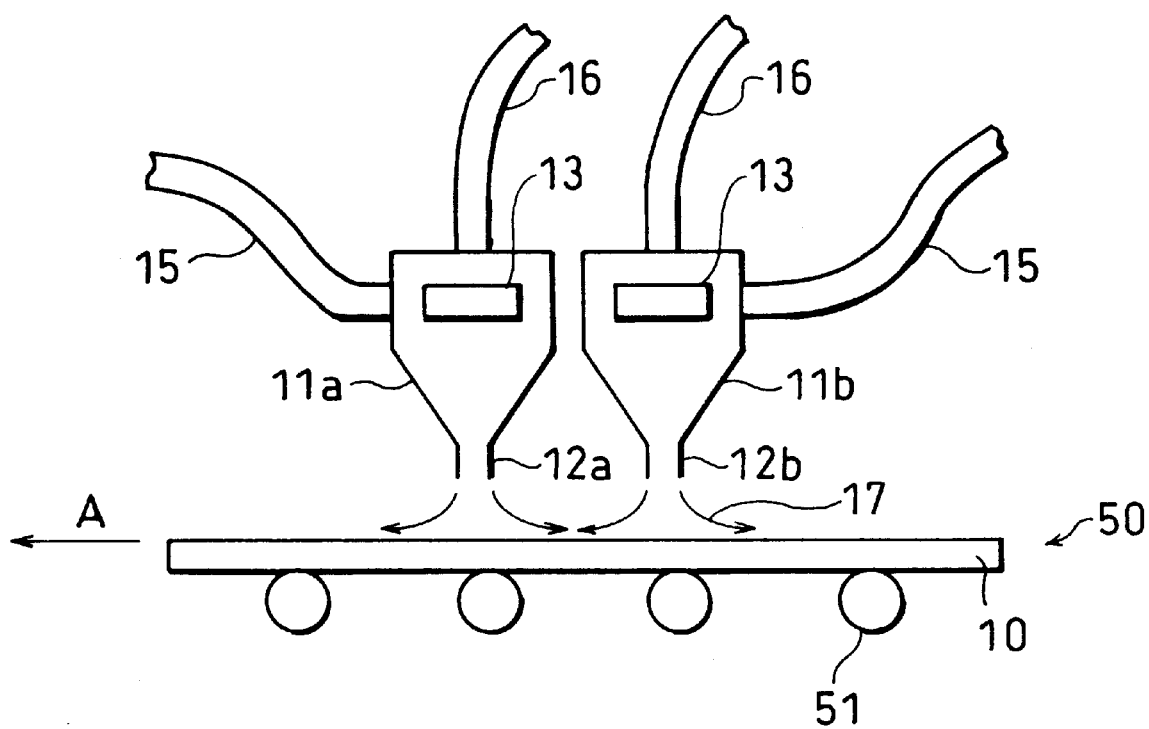
FIG. 3 is a cross-sectional view schematically illustrating an arrangement of the ultrasonic processing device (ultrasonic cleaning device) shown in FIG. 1.

The foregoing third cleaning section includes, as shown in FIG. 3, a transport path 50 equipped with a plurality of transport rollers 51 for transporting a glass substrate 10 in a horizontal direction by keeping the glass substrate 10 held on the transport rollers 51, and cleaning liquid supply nozzles (nozzle means) 11a and 11b provided above the glass substrate 10 (above the transport path 50). Incidentally, in the present embodiment as well as other embodiments described below, the foregoing transport rollers 51 functions as means for relatively moving the glass substrate (processing object) 10 in a predetermined direction with respect to vibrating elements (ultrasonic oscillation elements 13).

The cleaning liquid supply nozzles 11a and 11b are provided so as to cross the transport path 50 (not shown in FIG. 1), have slit-like nozzle openings 12a and 12b, respectively, and are equipped with a plurality of ultrasonic oscillation elements (vibrating elements) 13 for generating ultrasonic inside themselves.

Furthermore, as shown in FIG. 3, each of the cleaning liquid supply nozzles 11a and 11b is connected with a cleaning liquid supply pipe 15 for supplying cleaning liquid, while each of the ultrasonic oscillation elements 13 is connected with a power supply cord 16. Incidentally, in FIG. 1, the cleaning liquid supply pipes 15 and the power supply cords 16 are omitted for conveniences' sake in explaining the arrangement of the ultrasonic oscillation elements 13 with respect to the cleaning liquid supply nozzles 11a and 11b.

The foregoing cleaning liquid supply nozzles 11a and 11b are supplied with cleaning liquid (for instance, pure water) from the cleaning liquid supply pipes 15, and ultrasonic of a predetermined frequency (for instance, 0.4 MHz in the present embodiment) is projected from the ultrasonic oscillation elements 13 to the cleaning liquid. The cleaning liquid thus subjected to ultrasonic is jetted via the nozzle openings 12a and 12b, thereby becoming a line-like shower 17, to an upper surface of the glass substrate being transported in a horizontal direction on the transport path 50.

In other words, in the third cleaning section, the shower 17 of the cleaning liquid having subjected to ultrasonic is jetted to the glass substrate 10 from above, so that the upper surface of the glass substrate 10 is subjected to ultrasonic cleaning.

Thus, in the present invention, the glass substrate 10 as a cleaning object (processing object) moves in a predetermined traveling direction (indicated by the arrow A in the figure), and ultrasonic is projected to this glass substrate 10 from the ultrasonic oscillation elements 13. Here, ultrasonic is projected to a range, referred to as an ultrasonic-projected region, with a predetermined width in a width direction (indicated by an arrow B in the figure) that crosses the traveling direction. Here, the predetermined width of each ultrasonic-projected region is substantially equal to the width of the width of the ultrasonic oscillation element 13. Incidentally, in the description below, since the processing object is the glass substrate 10, the traveling direction is referred to as a transport direction (of the glass substrate 10) (equivalent to a "predetermined direction" set forth in claims).

In the present invention, the ultrasonic oscillation elements 13 are arranged so as to generate (project) ultrasonic with respect to the cleaning liquid. Further, in so doing, the cleaning liquid is preferably converged by the cleaning liquid supply nozzles 11a and 11b. By so doing, the ultrasonic and the cleaning liquid are brought into contact with the glass substrate 10 simultaneously, whereby the cleaning operation can be more efficiently performed. Incidentally, the cleaning liquid supply nozzles 11a and 11b are arranged to converge the cleaning liquid in the traveling direction in supplying the same to the glass substrate 10, but they may be arranged to converge the cleaning liquid in the width direction indicated by the arrow B in the figure, as required.

The ultrasonic oscillation elements 13 are preferably positioned on the upstream side to the nozzle openings 12a and 12b with reference to a direction in which the cleaning liquid flows, since the ultrasonic projection from the ultrasonic oscillation elements 13 is carried out via the cleaning liquid. Therefore, concrete positions of the ultrasonic oscillation elements 13 are not particularly limited as long as they are provided in a cleaning liquid distribution path, but it is more preferable that they are provided inside the cleaning liquid supply nozzles 11a and 11b, as shown in FIGS. 1 and 3.

Incidentally, the foregoing cleaning liquid distribution path is a path from a cleaning liquid supply source including a cleaning liquid supply pump (not shown), the cleaning liquid supply pipes 15, and the cleaning liquid supply nozzles 11a and 11b to a cleaning liquid supply opening that is the nozzle openings 12a and 12b. Further, the cleaning liquid supply source, including the cleaning liquid supply pump and the cleaning liquid supply pipes constitutes processing liquid supply means (cleaning liquid supply means).

Figure 1:
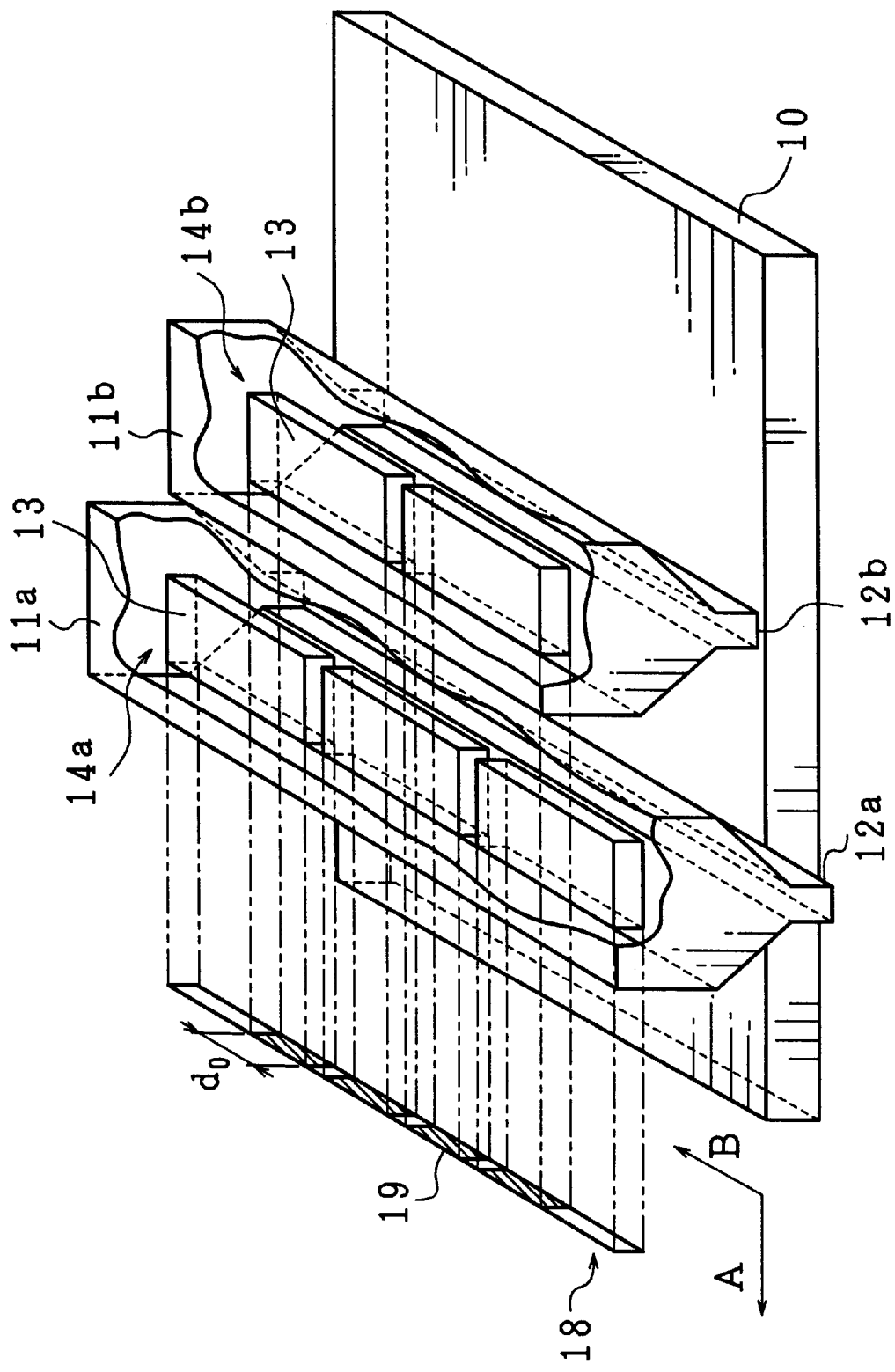
FIG. 1 is a perspective view schematically illustrating an example of an arrangement of ultrasonic oscillation elements in an ultrasonic processing device in accordance with the present invention.

The foregoing nozzle openings 12a and 12b are formed each in a shape like a slit being extended in the width direction B as shown in FIG. 1, but the shape thereof is not limited to this. In the present invention, since the ultrasonic oscillation elements 13 constitute element arrays 14a and 14b as described later, the nozzle openings 12a and 12b may be at least arranged so that the cleaning liquid to which ultrasonic has been projected by the element arrays 14a and 14b should be supplied to an entire width-direction-B dimension of the glass substrate 10 so as to clean an entirety of the upper surface of the glass substrate 10.

In the present embodiment, at least one of the nozzle openings 12a and 12b has a length not less than a length of the glass substrate 10 in the width direction B. For instance, in FIG. 1, the nozzle opening 12a has a length not less than the length of the glass substrate 10 in the width direction B. This enables supply of the cleaning liquid subjected to ultrasonic uniformly over the upper surface of the glass substrate 10.

Furthermore, a direction in which the nozzle openings 12a and 12b face is not particularly limited, and it may be appropriately set depending on a cleaning object and a purpose of cleaning. For instance, in the case of FIGS. 1 and 3, the nozzle openings 12a and 12b face substantially perpendicularly to the upper surface of the glass substrate 10, but they may be provided substantially diagonally to the upper surface of the glass substrate 10, or may be provided substantially in parallel to the upper surface of the glass substrate 10.

The foregoing ultrasonic oscillation element 13 is not particularly limited as long as it generates ultrasonic of a desired frequency for ultrasonic cleaning of a cleaning object. The ultrasonic oscillation element 13 applied in the present invention is normally in a plate shape or in a bar shape, and in the present embodiment, for instance, W-357LS-380 available from Honda Electronics Co., Ltd. equipped with a vibrating plate in 100 mm×15 mm size is used. Incidentally, needless to say, the ultrasonic oscillation element (vibrating element) in the present invention indicates an entirety of an element structure that generates ultrasonic by a vibrating action, and is composed of (1) a first conversion section (piezoelectric ceramics, etc.) that is supplied with a power source voltage directly, for converting electric vibration into mechanical vibration; and (2) a second conversion section (the foregoing vibrating plate, etc.) for converting the mechanical vibration into ultrasonic. Incidentally, for conveniences' sake, the first and second conversion sections are collectively shown as one ultrasonic oscillation element 13 in the drawings.

The glass substrate 10 of the LCD element as a cleaning object (processing object) in accordance with the present embodiment is in a size of 360 mm×465 mm. Furthermore, a whole upper surface of the glass substrate 10 is an ultrasonic processing target region.

Figure 4:
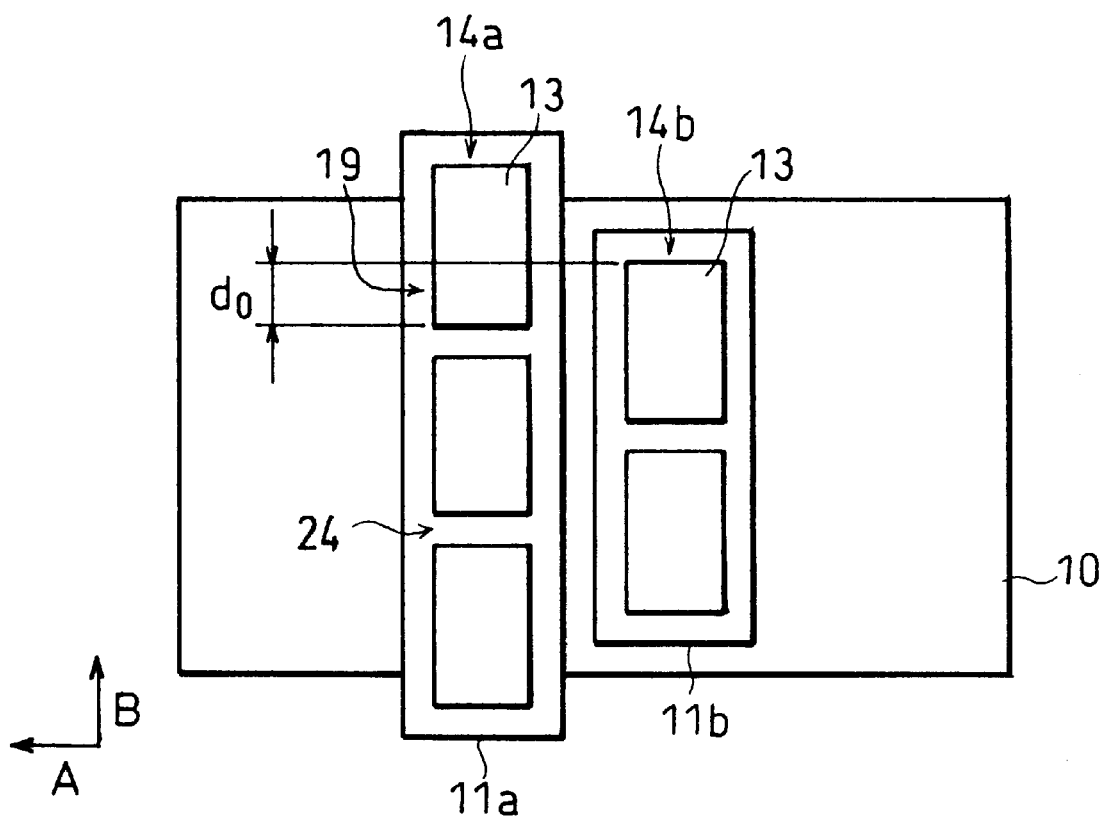
FIG. 4 is an explanatory view illustrating position relationship between the ultrasonic oscillation elements arranged in the ultrasonic processing device shown in FIG. 1 and a glass substrate.

In the present embodiment, the dimension (360 mm) of the cleaning object in the width direction B is greater than the dimension (100 mm) of the ultrasonic oscillation element 13 in the lengthwise direction. Therefore, the ultrasonic cleaning device in accordance with the present embodiment is arranged, as shown in FIGS. 1 and 4, so that a plurality of the ultrasonic oscillation elements 13 should be arrayed in plane extending in the transport direction A and the width direction B, and that regions of projection (projection regions) obtained in the case where the ultrasonic oscillation elements 13 are projected on a plane on the transport-direction-A side should form one belt-like region that has a width exceeding a predetermined width of the ultrasonic processing target region. This arrangement enables projection of ultrasonic over an entire width-direction-B dimension of the cleaning object (glass substrate 10).

Incidentally, the foregoing "projection" indicates that by projecting collimated light directed in the transport direction A to the ultrasonic oscillation elements 13, shadows of the ultrasonic oscillation elements 13 are projected on a plane on the transport direction A side whose normal direction is matched with the foregoing collimated light, and the foregoing projection regions indicate the shadows of the ultrasonic oscillation elements 13 projected on the foregoing plane. In other words, the plane on the transport direction A side is a plane orthogonal to the transport direction A (predetermined direction).

The following description will more concretely explain a whole arrangement of the foregoing ultrasonic oscillation elements 13. In the present embodiment, as shown in FIGS. 1, 3, and 4, the plurality of the foregoing ultrasonic oscillation elements 13 are arranged so as to compose element arrays 14a and 14b each linearly aligned in two lines directed in the width direction B, the element arrays 14a and 14b being juxtaposed in the transport direction A so as to be parallel to each other. Therefore, when viewing the element arrays 14a and 14b at once, the ultrasonic oscillation elements 13 are provided so as to form a planar array. Incidentally, in the present embodiment, the ultrasonic oscillation elements 13 compose element arrays 14a and 14b in two lines, but they may compose arrays provided in more than two lines.

In the case where the foregoing element arrays 14a and 14b are projected on a plane on the foregoing transport direction A side (a projected FIG. 18 in FIG. 1), projection regions of the ultrasonic oscillation elements 13 composing the element array 14a and projection regions of the ultrasonic oscillation elements 13 composing the element array 14b overlap each other, thereby forming superimposition regions 19 with a width of $d_0$. Consequently, projection regions (see the foregoing projected FIG. 18) of the element arrays 14a and 14b become a single belt-like region (continuous shape).

Generally, to form element arrays by linearly providing ultrasonic oscillation elements, it is necessary to form, for instance, insulating regions (in FIG. 4, a region 24 with a width of $d_i$) with a width of not less than 0.2 mm each (in the case where the ultrasonic oscillation element is the aforementioned W-357LS-380) between the ultrasonic oscillation elements, so as to isolate each ultrasonic oscillation element. This is because a power source circuit or a control circuit is provided in each ultrasonic oscillation element, so as to adjust outputs of the ultrasonic oscillation elements to eliminate variation of outputs thereof.

However, provision of such insulating regions in an element array could result in that insufficient ultrasonic is projected to portions corresponding to the insulating regions upon cleaning (cleaning operation), or that substantially no ultrasonic is projected to the portions. Consequently, the processing object becomes non-uniformly processed. Incidentally, the foregoing portions of the processing object corresponding to the insulating regions, to which insufficient ultrasonic is projected, is hereinafter referred to as non-projection regions.

Figure 18:
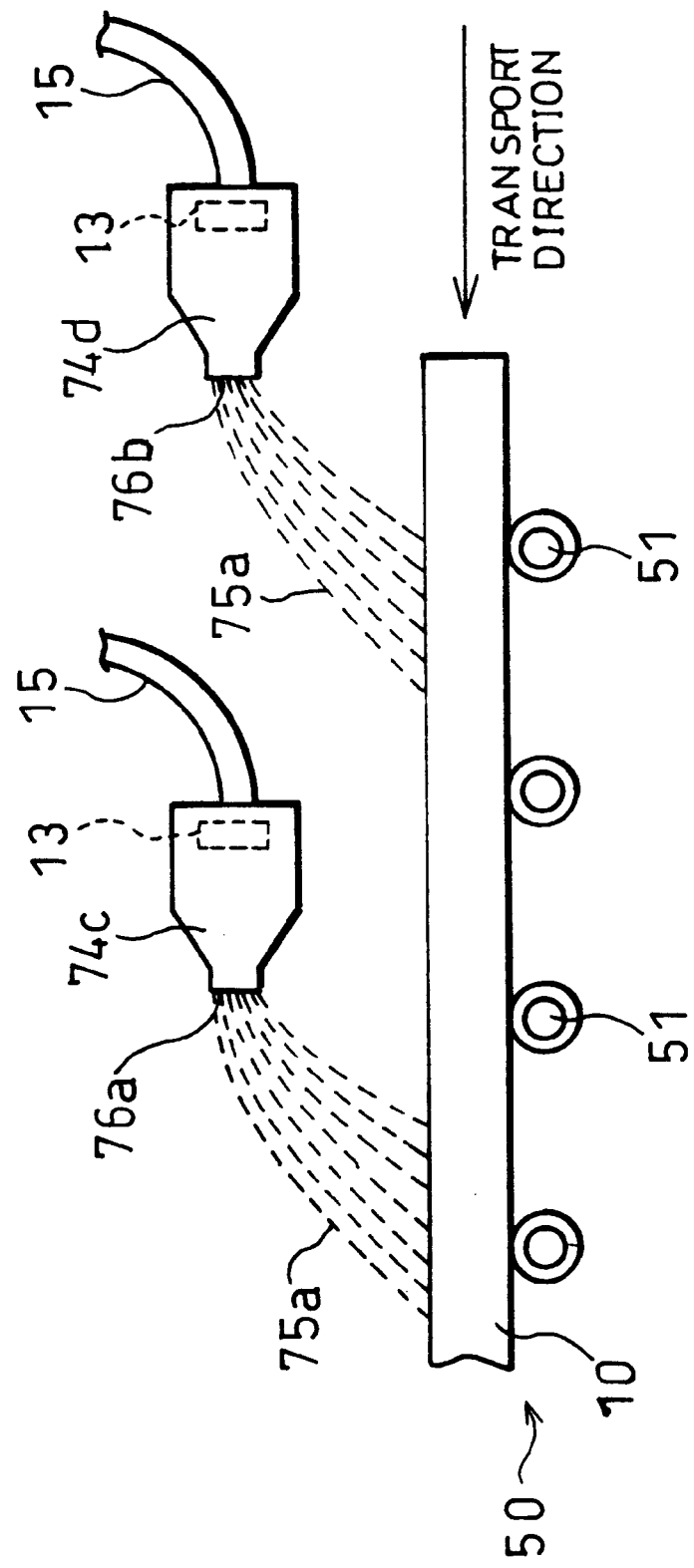
FIG. 18 is a side view schematically illustrating an arrangement of an ultrasonic processing device (ultrasonic cleaning device) in accordance with still another embodiment of the present invention.

On the contrary, in the present invention, the plurality of ultrasonic oscillation elements 13 are arranged in whole so as to form the superimposition regions 19 on the projected FIG. 18. Therefore, the foregoing non-projection regions produced upon projection of ultrasonic from the element array 14a to the glass substrate can be covered by ultrasonic projected from the element array 14b. In other words, by moving the glass substrate 10 in the transport direction, the ultrasonic-projected regions by the ultrasonic oscillation elements 13 composing the element array 14a and the ultrasonic-projected regions by the ultrasonic oscillation elements 13 composing the element array 14b are combined (caused to overlap) each other on the upper surface of the glass substrate 11, so that ultrasonic should be projected to an entirety of the upper surface.

Therefore, even in the case where a region requiring ultrasonic projection is larger than the size of the ultrasonic oscillation element 13, ultrasonic can be uniformly projected on an entirety of the same. Consequently, an entirety of a surface of the cleaning object (glass substrate 10) can be uniformly cleaned, thereby ensuring further enhancement of the cleaning effect as compared with the conventional cases, while allowing the cleaning time to be shortened.

Incidentally, the foregoing element arrays 14a and 14b are provided adjacent to each other in the present embodiment, but the arrangement thereof is not limited to this: the element arrays 14a and 14b may be disposed at a distance therebetween.

Here, the manner how the superimposition regions 19 are formed is not particularly limited. For instance, in a projected FIG. 18a shown in FIG. 5(a), an insulating region 24 between ultrasonic oscillation elements 131 and 132 (indicated with solid lines in the figure) composing an element array 14a is covered by an ultrasonic oscillation element 133 (indicated with broken lines in the figure) composing an element array 14b, while a width of $d_0=d_{o1}$ of a superimposition region 19a of the ultrasonic oscillation elements 131 and 133 is substantially equal to a width of $d_0=d_{o2}$ of a superimposition region 19b of the ultrasonic oscillation elements 132 and 133 ($d_{o1} \approx d_{o2}$)

Figure 5A:
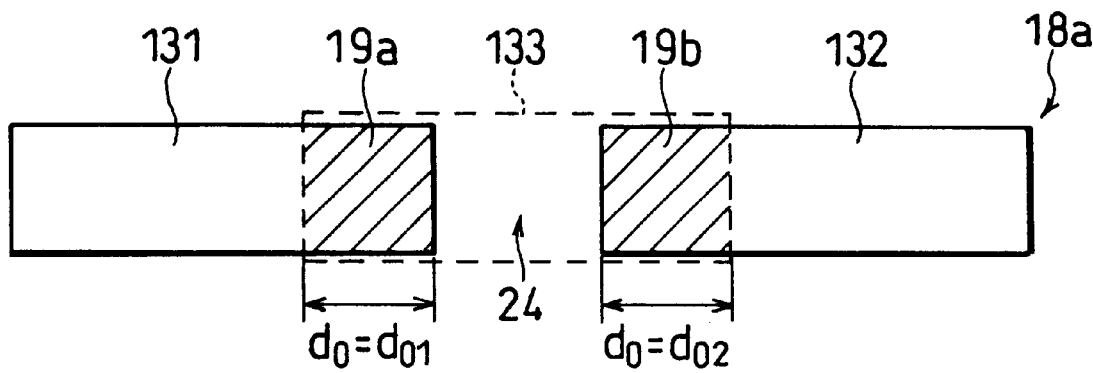
FIGS. 5(a), 5(b), and 5(c) are explanatory views explaining variations of superimposition regions formed by the ultrasonic oscillation elements provided shown in FIG. 1.
Figure 5B:
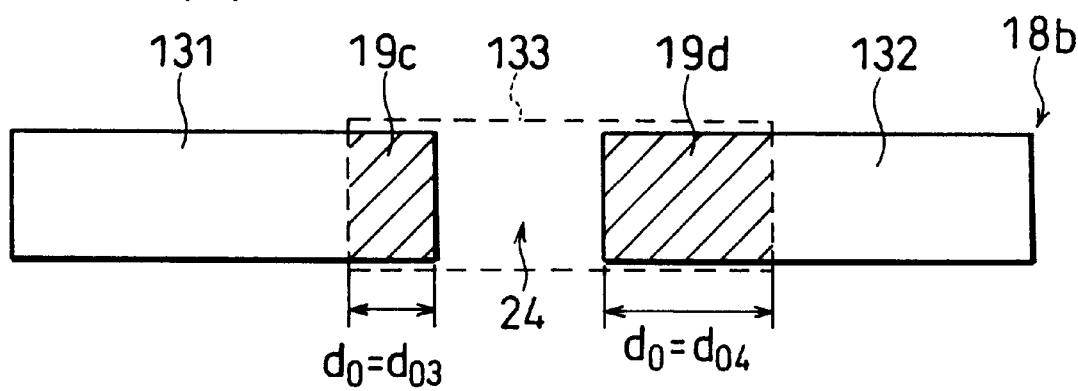

On the other hand, in a projected FIG. 18b shown in FIG. 5(b), the insulating region 24 between the ultrasonic oscillation elements 131 and 132 composing the element array 14a are covered by the ultrasonic oscillation elements 133 (indicated with broken lines in the figure) composing an element array 14b, which is identical to the aforementioned arrangement, while, unlike the foregoing arrangement, a width of $d_0=d_{o3}$ of a superimposition region 19c of the ultrasonic oscillation elements 131 and 133 is not equal to a width of $d_0=d_{o4}$ of a superimposition region 19d of the ultrasonic oscillation elements 132 and 133: in FIG. 5, $d_{o3}$ is smaller than $d_{o4}$ ($d_{o3}<d_{o4}$).

Thus, the width $d_0$ of the superimposition region 19 varies depending on the arrangement of the ultrasonic oscillation elements 13 (here, the ultrasonic oscillation elements 131 through 133), but in any one of the cases of the superimposition regions 19a through 19d, the projected FIG. 18a or 18b forms a belt-like region as a whole. Therefore, in any case, it is possible to uniformly and non-defectively project ultrasonic throughout the entire width-direction-B dimension of the glass substrate while the substrate 10 is being transported.

Accordingly, the manner how the superimposition regions 19 are formed is not particularly limited. Likewise, a range of the width $d_0$ of each superimposition region is not particularly limited.

Here, since performance of the ultrasonic oscillation element 13 varies depending on a manufacturer, a purpose of use, a type of a product, etc., the width of the insulating region 24 and a size of the ultrasonic oscillation element 13 in the lengthwise direction also vary depending on the type of the ultrasonic oscillation element 13. Therefore, a more desirable manner how the superimposition regions 19 are formed is experimentally discovered, as to each type of the ultrasonic oscillation elements 13.

The foregoing W-357LS-380 as the ultrasonic oscillation element 13 used in the present embodiment has a size of 100 mm×15 mm, and a width of the insulating region 24 in the case where the same is used is about 0.2 mm. Therefore, the ultrasonic oscillation elements 13 to compose the element array 14b may be arranged so that they cover 0.2 mm-wide spaces in the element array 14a.

Figure 5C:
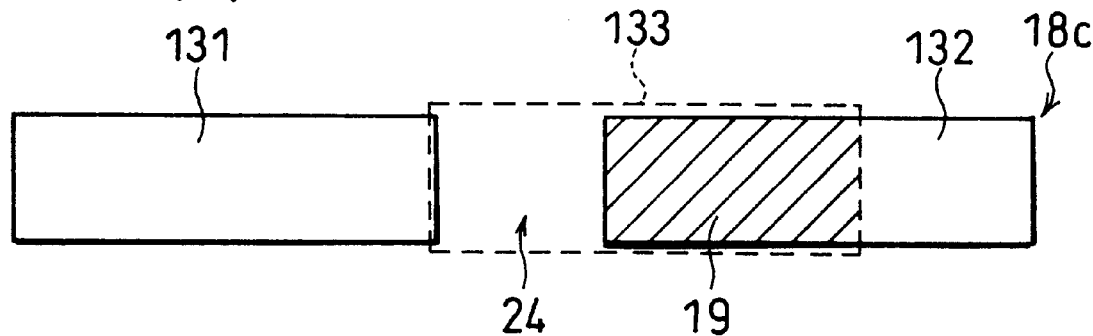

However, positions of the ultrasonic oscillation elements 132 to cover the insulating region 24 between the ultrasonic oscillation elements 131 and 132, apart from those described above, may be such that only the insulating region 24 should be simply covered. More concretely, as shown in FIG. 5(c), a position of an end of the ultrasonic oscillation element 131 falls on a position of an end of the ultrasonic oscillation element 133, and the ultrasonic oscillation elements 131 and 133 form substantially no superimposition region 19.

In this case, theoretically, a projected FIG. 18c as a whole becomes a belt-like region, but actually, depending on position accuracy of the ultrasonic oscillation elements 131 and 133, a non-projection region could be more or less produced between the ultrasonic oscillation elements 131 and 133. Therefore, the ultrasonic oscillation elements 132 are preferably positioned so as not to cover only the insulating region 24 but to necessarily form the superimposition regions 19.

Furthermore, the insulating region 24 provided between the ultrasonic oscillation elements 131 and 133 may be expanded to more than a minimum requisite width. This ensures suppression of an interference effect of ultrasonic, while it may be possible to decrease the number of the ultrasonic oscillation elements 13 composing the element arrays 14a and 14b, depending on the width as a result of expansion.

Furthermore, the desirable range of the superimposition region 19 can be determined according to the width of the insulating region 24. For instance, the desirable range of the superimposition region 19 may be set to greater than the space between insulating region 24 and smaller than a half of a size of one ultrasonic oscillation element 13. Incidentally, needless to say, a width $d_0$ of the superimposition region 19 differs depending on a type of the ultrasonic oscillation element 13 used.

The foregoing W-357LS-380 is used as the ultrasonic oscillation element 13 in the present embodiment, but in this case, if the insulating element is expanded to not less than 0.2 mm in width, a desirable range width $d_0$ of the superimposition region 19 can be set to not less than 0.2 mm and not more than 50 mm, or more desirably, not less than 5 mm and not more than 10 mm.

The concrete arrangement of the foregoing ultrasonic oscillation elements 13 is not particularly limited, either. In other words, the ultrasonic oscillation elements 13 may be provided in any manner as long as they are provided so as to planarly extend in the transport direction A and in the width direction B, and that a projected FIG. 18 obtained when the ultrasonic oscillation elements 13 are projected onto a plane on the transport direction A side forms a belt-like region having no space, such as a space corresponding to the insulating region 24, in which no projected region of ultrasonic oscillation elements 13 is present. In the present embodiment, as shown in FIGS. 1 through 4, a whole arrangement of the ultrasonic oscillation elements 13 of the element arrays 14a and 14b is in a stagger form.

Figure 6:
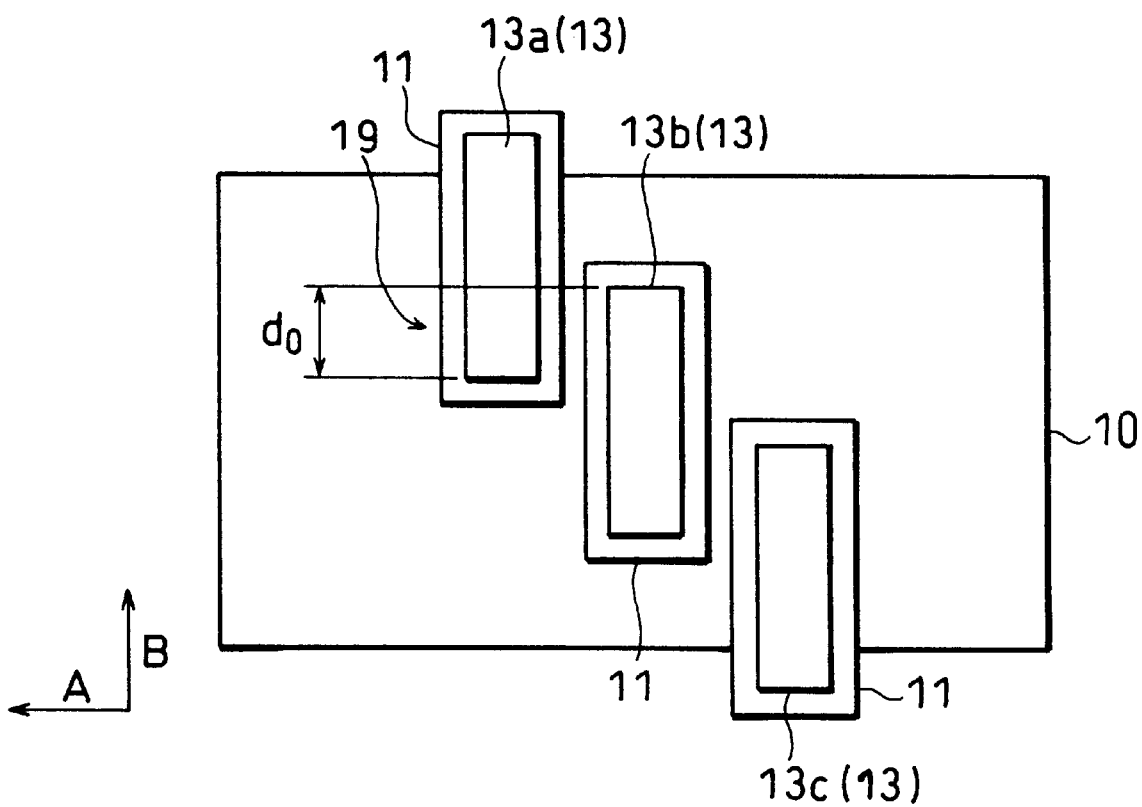
FIG. 6 is an explanatory view illustrating another example of an arrangement of ultrasonic oscillation elements in the ultrasonic processing device shown in FIG. 1.

Another example of the arrangement is an arrangement as shown in FIG. 6 in which the ultrasonic oscillation elements 13 (three ultrasonic oscillation elements 13a, 13b, and 13c in FIG. 6) are provided in a substantially diagonal direction with respect to the glass substrate 10 transport direction A.

In this example, only one of the individual ultrasonic oscillation elements 13a, 13b, and 13c is not capable of covering the region to be exposed to ultrasonic (ultrasonic processing target region), but regions which one ultrasonic oscillation element 13 (for instance, 13a) cannot cover is covered by the other two ultrasonic oscillation elements 13 (for instance, 13b and 13c).

Incidentally, in this example, one cleaning liquid supply nozzle 11 is provided for each ultrasonic oscillation element 13, and correspondence between the cleaning liquid supply nozzle 11 and the ultrasonic oscillation element 13 is not particularly limited to this. For instance, though not shown, a large-size cleaning liquid supply nozzle 11 containing these three ultrasonic oscillation elements 13a, 13b, and 13c all together may be used.

Incidentally, in FIGS. 4, 6, and others, a figure equivalent to the projected FIG. 18 resulting from projection onto a plane on the transport direction A side is not shown. However, regions in which the ultrasonic oscillation elements 13 overlap when viewed in the transport direction A result in the superimposition regions 19, and hence, these overlap regions are hereinafter referred to the superimposition regions 19, as shown in the figures.

The oscillation frequency of the ultrasonic oscillation elements 13, that is, the frequency of ultrasonic projected to the cleaning liquid is appropriately selected depending on the purpose of cleaning and the type of the cleaning object, and is not particularly limited. In the present embodiment, a frequency of ultrasonic is preferably in a range of several hundreds of kHz to several MHz, or more preferably in a range of 0.1 MHz to 5 MHz. By projecting ultrasonic having such a frequency to a glass substrate 10, particle and soil removing ability can be further enhanced.

A cleaning liquid used in the ultrasonic cleaning device of the present invention is not particularly limited as long as it is applicable for ultrasonic cleaning. Examples of cleaning liquid applicable for removing particles and soils in normal electronic parts fabrication include conventional known cleaning liquids used in ultrasonic cleaning, such as pure water, ultrapure water, hydrogen water, ozone water, a dilute hydrofluoric acid aqueous solution, and a surfactant solution. The cleaning liquid is appropriately selected from among those mentioned above and others, depending on the purpose of cleaning and the type of a cleaning object.

A timing of supply of the cleaning liquid to the upper surface of the glass substrate 10 is not particularly limited. For example, taking as an example the case where the cleaning liquid is supplied to the glass substrate 10 being transported, the operation may be controlled so that the cleaning liquid should be supplied only when the glass substrate 10 comes to below the nozzle openings 12a and 12b of the cleaning liquid supply nozzles 11a and 11b.

Such control of cleaning liquid supply timings enables further reduction of usage of the cleaning liquid. To more accurately control the timings of supply of the cleaning liquid, a substrate position detecting sensor (not shown in figures) or the like may be additionally provided in the transport path 50. Note that, depending on conditions, the glass substrate 10 is not necessarily being transported, but may be stopped.

The glass substrates 10 thus cleaned by the foregoing cleaning section are transported into the drying section as shown in FIG. 2, where they are dried by air knife drying (AIR KNIFE DRYING PROCESS). Subsequently, the glass substrates 10 are transported to the unloader section, where they are one by one housed in a cassette (GLASS SUBSTRATE HOUSING PROCESS). Thus, the cleaning treatment with respect to the glass substrates 10 is finished.

As described above, in the ultrasonic cleaning device in accordance with the present embodiment, a plurality of element arrays are provided, each extending in the transport direction, in each of which ultrasonic oscillation elements are provided linearly in a direction substantially perpendicular to a glass substrate transport direction, and further, projected figures obtained when the ultrasonic oscillation elements are projected onto a plane on the transport direction side include superimposition regions in which projected figures of the ultrasonic oscillation elements composing one element array are partly superimposed on projected figures of the ultrasonic oscillation elements composing the other element array.

Therefore, since a plurality of element arrays are provided, insulating regions in one element array that do not contribute ultrasonic projection are covered by the other element array. Consequently, ultrasonic projection to the glass substrate is further uniform as compared with the conventional case. This enables to ensure a sufficient cleaning effect while to reduce usage of cleaning liquid, thereby realizing sure and efficient cleaning as well as a lower running cost.

Incidentally, the ultrasonic cleaning device in the present embodiment may include cleaning liquid collecting means for collecting cleaning liquid having been supplied to a cleaning object, or filtering means for filtering cleaning liquid collected. This ensures recycle and reuse of cleaning liquid, as well as further reduction of usage of the cleaning liquid.

The foregoing embodiment is explained by taking as an example a case in which the present invention is applied to fabrication of a glass substrate for use in an LCD element, but, needless to say, the present invention is not limited to this. In other words, the present invention is suitably applicable to a fabrication method of electronic parts that includes a cleaning process.

To state differently, the electronic parts fabrication method in accordance with the present invention includes an ultrasonic cleaning process in which, the processing object that is relatively moved in a predetermined direction, while supplied with cleaning liquid, is subjected to ultrasonic that is projected from a plurality of ultrasonic oscillation elements so that respective ultrasonic-projected regions by the ultrasonic oscillation elements partly overlap each other to completely cover an ultrasonic processing target region with a predetermined width.

This allows the present invention to be suitably applied to, apart from the above-described electronic parts fabrication method using the glass substrate, an electronic parts fabrication method with an ultrasonic cleaning process, particularly an electronic parts fabrication method in which an ultrasonic processing target region to be subjected to ultrasonic is large.

Incidentally, in the foregoing fabrication method, it is necessary to relatively move the cleaning object in a predetermined direction with respect to the ultrasonic oscillation elements, since the ultrasonic oscillation elements are required to scan the processing object in the traveling direction A. For instance, in some cases the processing object (glass substrate 10) per se is moved by transport means as shown in FIG. 1, or in other cases the nozzle means incorporating the ultrasonic oscillation elements is moved horizontally with respect to the processing object. Among those, to move the processing object by transport means is more preferable since it allows uniform projection of ultrasonic to be carried out more easily.

[Second Embodiment]

The following description will explain another embodiment of the present invention, while referring to FIGS. 2, and 7 through 12(c). However, the present invention is not particularly limited to this. Note that the members having the same structure (function) as those in the first embodiment will be designated by the same reference numerals and their description will be omitted.

An ultrasonic processing device in accordance with the present invention is arranged as follows: a plurality of vibrating elements each capable of projecting ultrasonic to a region with a width smaller than a desired processing region in a predetermined processing operation with respect to a processing object by supplying processing liquid to the processing object while projecting ultrasonic thereto, are arrayed in, for example, not less than two arrays so that vibrating elements in different adjacent arrays have a superimposition region in a direction in which the arrays are juxtaposed, while adjacent vibrating elements in the same array are separated from each other so that ultrasonic projected therefrom do not interfere each other.

For explanation of the present embodiment, an ultrasonic cleaning device that cleans a processing object while projecting ultrasonic is taken as an example of the foregoing ultrasonic processing device. Incidentally, a glass substrate is taken as an example of a processing object (cleaning object), which is also taken as an example in the description of the first embodiment.

A process of cleaning a glass substrate, taken as an example of the present embodiment, is performed by units including a loader section, a first cleaning section, a second cleaning section, a third cleaning section (ultrasonic cleaning section), a drying section, and an unloader section, in the stated order from an upstream side in a direction of transport of the glass substrate (travelling direction), as shown in FIG. 2, like in the first embodiment. Incidentally, arrangements of the foregoing units are substantially identical to those explained in the description of the first embodiment. Therefore, the following description will explain the arrangement of the third cleaning unit in detail, which is the characteristic point of the present invention.

Figure 8:
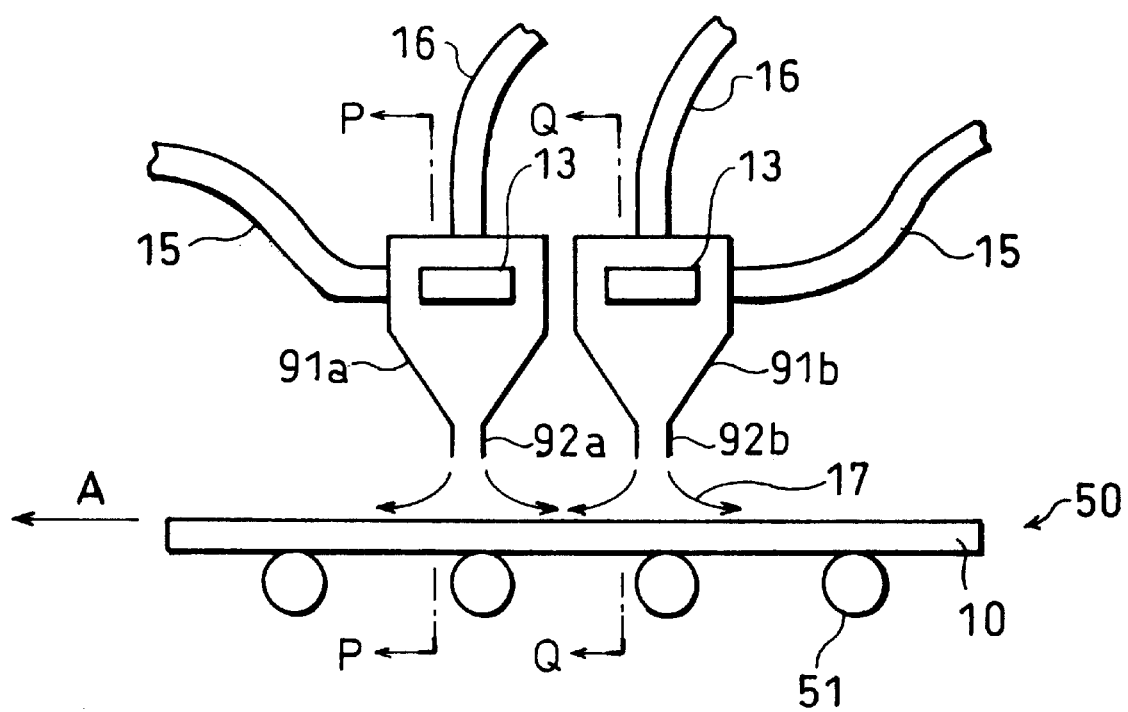
FIG. 8 is a cross-sectional view schematically illustrating an arrangement of the ultrasonic processing device (ultrasonic cleaning device) shown in FIG. 7.

The third cleaning section includes, as shown in FIG. 8, a transport path 50 equipped with a plurality of transport rollers 51 for transporting a glass substrate 10 in a horizontal direction by keeping the glass substrate 10 held on the transport rollers 51, and cleaning liquid supply nozzles (nozzle means) 91a and 91b provided above the glass substrate 10 (above the transport path 50).

Figure 9:
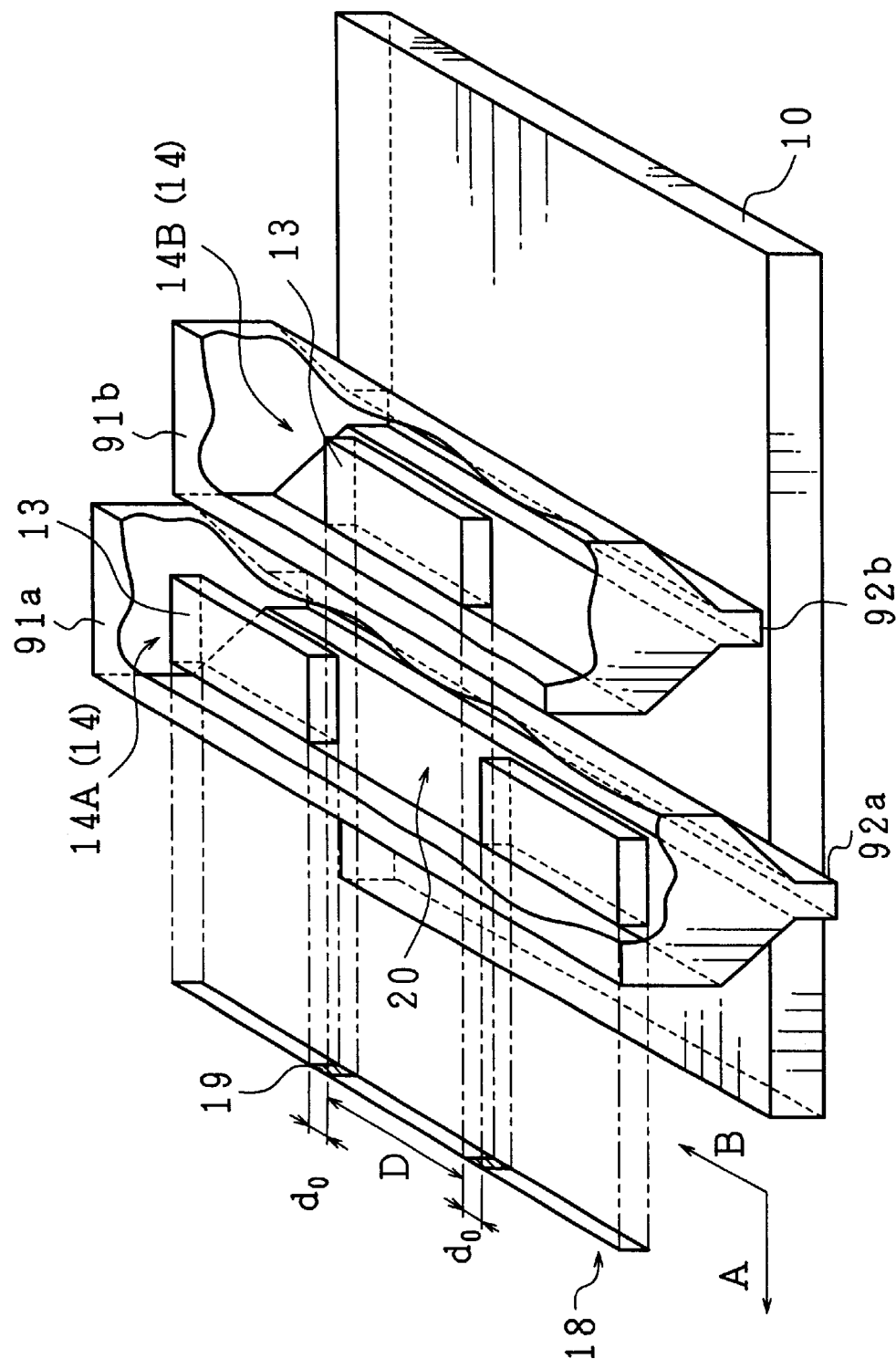
FIG. 9 is a perspective view schematically illustrating an example of an arrangement of ultrasonic oscillation elements in the ultrasonic processing device shown in FIG. 7.

As shown in FIG. 9, the cleaning liquid supply nozzles 91a and 91b are provided so as to cross the transport path 50 (not shown in FIG. 9), have slit-like nozzle openings 92a and 92b, respectively, and are equipped with a plurality of ultrasonic oscillation elements (vibrating elements) 13 for generating ultrasonic inside themselves.

Incidentally, the cleaning liquid supply nozzles 91a and 91b have an arrangement and functions substantially identical to those of the cleaning liquid supply nozzles 11a and 11b in the foregoing first embodiment, except that the size thereof in the width direction B and the number of ultrasonic oscillation elements 13 provided therein are different. Therefore, the arrangement and functions of the cleaning liquid supply nozzles 91a and 91b will be explained briefly below.

First of all, as in the first embodiment, each of the cleaning liquid supply nozzles 91a and 91b is connected with a cleaning liquid supply pipe 15 and a power supply cord 16.

Further, like in the first embodiment, the foregoing cleaning liquid supply nozzles 91a and 91b are arranged so as to jet cleaning liquid having been subjected to ultrasonic of a predetermined frequency (for instance, 0.4 MHz) from the ultrasonic oscillation elements 13, in a line-like shower 17, to an upper surface of the glass substrate. Here, it is preferable that the cleaning liquid is converged by the cleaning liquid supply nozzles 91a and 91b.

Thus, in the present invention as well, the glass substrate 10 moves in a predetermined traveling direction (indicated by the arrow A in the figure), and ultrasonic is projected to this glass substrate 10 from the ultrasonic oscillation elements 13. Here, ultrasonic projection is arranged so as to be applied to an ultrasonic-projected region with a predetermined width in a width direction (indicated by an arrow B in the figure) that crosses the travelling direction.

Furthermore, the ultrasonic oscillation elements 13 are positioned, as depicted in the description of the first embodiment, in the cleaning liquid distribution path.

The foregoing nozzle openings 92a and 92b are formed each in a shape like a slit being extended in the width direction B as shown in FIG. 9, but the shape thereof is not limited to this. In the present invention, since the ultrasonic oscillation elements 13 constitute element arrays 14A and 14B as described later, the nozzle openings 92a and 92b may be at least arranged so that the cleaning liquid to which ultrasonic has been projected by the element arrays 14A and 14B should be supplied to an entire width-direction-B dimension of the glass substrate 10 so as to clean an entirety of the glass substrate 10.

In the present embodiment, at least one of the nozzle openings 92a and 92b has a length not less than a length of the glass substrate 10 in the width direction B. For instance, in FIG. 9, the nozzle opening 92a has a length not less than the length of the glass substrate 10 in the width direction B. This further facilitates supply of the cleaning liquid subjected to ultrasonic uniformly over the upper surface of the glass substrate 10.

Furthermore, a direction in which the nozzle openings 92a and 92b face is not particularly limited, and it may be appropriately set depending on a cleaning object and a purpose of cleaning. Concrete variations of the direction of the nozzle openings are as depicted in the foregoing description of the first embodiment as variations of the direction in which the nozzle openings 12a and 12b.

Incidentally, in the present embodiment also, W-357LS-380 available from Honda Electronics Co., Ltd. equipped with a vibrating plate in 100 mm×15 mm size is used as an ultrasonic oscillation element 13, and a glass substrate in a size of 360 mm×465 mm is used as the glass substrate 10 of the LCD element.

Thus, in the present embodiment, the dimension (360 mm) of the cleaning object in the width direction B is greater than the dimension (100 mm) of the ultrasonic oscillation element 13 in the lengthwise direction. Therefore, the ultrasonic cleaning device in accordance with the present embodiment is arranged, as shown in FIGS. 7 and 9, so that a plurality of element arrays 14 (two element arrays 14A and 14B in the case shown in FIGS. 7 and 9) are provided, each being composed of a plurality of the ultrasonic oscillation elements 13 arrayed in the foregoing width direction B, with an element space 20 having a predetermined width D being provided between each pair of adjacent ultrasonic oscillation elements 13 in the same element array 14.

The element arrays 14 are juxtaposed in the foregoing transport direction A in parallel, and at positions corresponding to the foregoing element spaces 20 in an element array 14 in the k'th line (k: natural number) (element array 14A in the case shown in FIGS. 7 and 9), the ultrasonic oscillation elements 13 composing the element array 14 in the k+1'th line (element array 14B in the case shown in FIGS. 7 and 9) are provided, so that ultrasonic oscillation elements 13 in the element array 14 in the k+1'th line form superimposition regions 19 with a predetermined width $d_0$ each with the ultrasonic oscillation elements 13 in the element array 14 in the k'th line.

Figure 7:
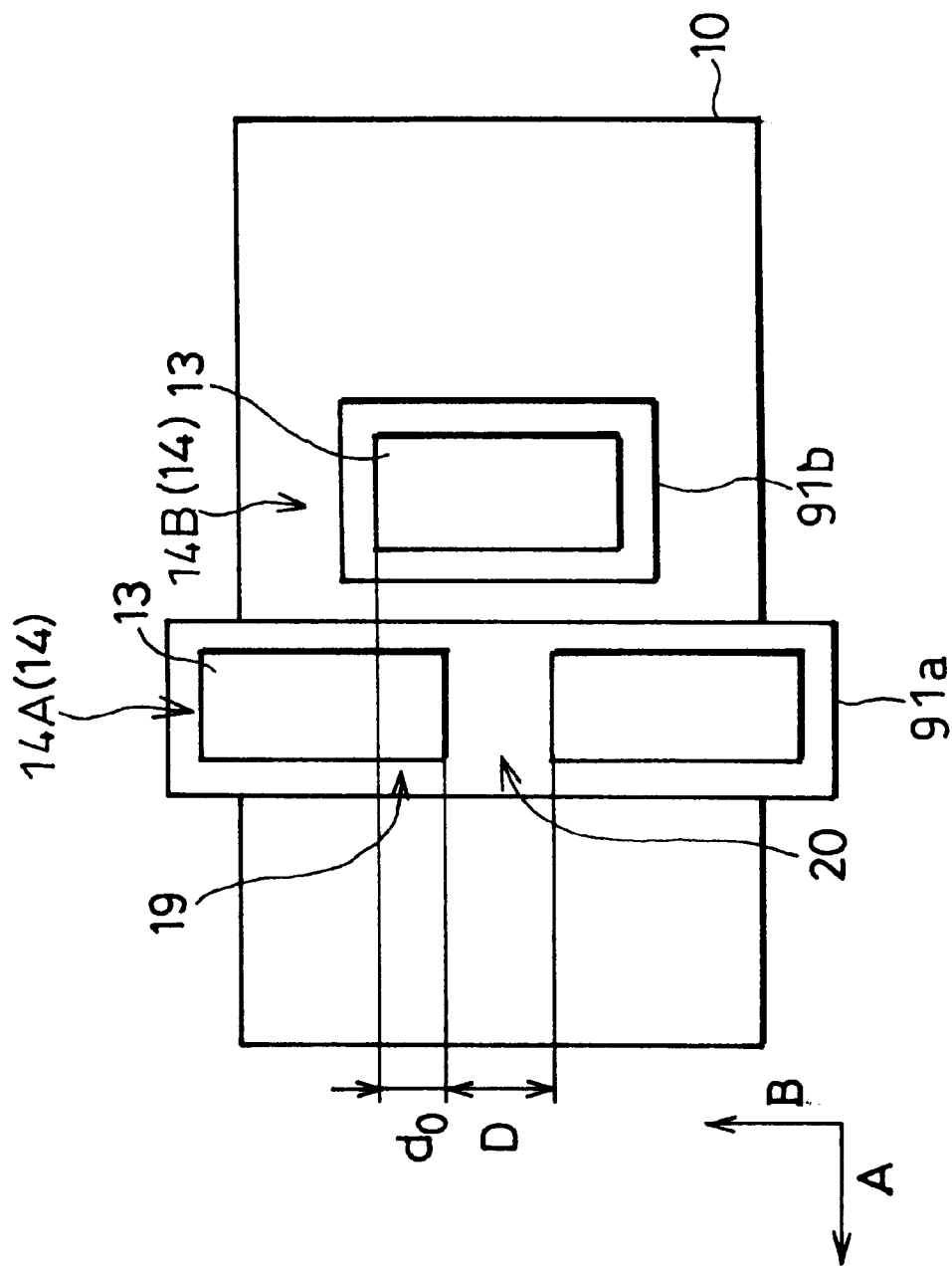
FIG. 7 is an explanatory view illustrating position relationship between the ultrasonic oscillation elements arranged in an ultrasonic processing device in accordance with another embodiment of the present invention and a glass substrate.

In FIGS. 7 and 9 in particular, the ultrasonic oscillation elements 13 are provided in a stagger form when the element arrays 14A and 14B are viewed all together. This arrangement of the ultrasonic oscillation elements 13 enables projection of ultrasonic over an entire width-direction-B dimension of the cleaning object (glass substrate 10).

Incidentally, not shown in the figures, in the following explanation, the element array 14 in the k'th line is referred to as "element array $14^k$", and the element array 14 in the k+1'th line is referred to as "element array $14^{k+1}$". The element arrays 14A and 14B are provided adjacent in the present embodiment, but the arrangement of the same is not limited to this. The element arrays 14A and 14B may be provided distantly.

The following description will explain a reason why a plurality of ultrasonic oscillation elements 13 are provided so as to form a plurality of element arrays 14, with the foregoing element spaces 20.

As shown in FIGS. 10(a) and 10(b), in the present invention, let the ultrasonic processing target region (herein, an upper surface of the glass substrate 10) have a predetermined width Lmm, while let a dimension of each of the ultrasonic oscillation elements 13 (in this case, a size in the lengthwise direction) be Mmm, then, the dimension Mmm is set smaller than the width Lmm (M<L). Nevertheless, ultrasonic has to be non-defectively projected throughout an entirety of the Lmm-wide ultrasonic processing target region by means of the Mmm-wide ultrasonic oscillation element 13.

For example, in the present embodiment, since the ultrasonic processing target region is a region covering an entire width-direction-B dimension of the glass substrate 10, the foregoing width Lmm of the foregoing ultrasonic processing target region is equal to the dimension of the glass substrate 10 in the width direction. Note that the width of the ultrasonic processing target region is not limited to this, but it appropriately varies depending on a shape of a processing object, a manner of ultrasonic projection, etc. For instance, in the case where ultrasonic is projected only on a part of the upper surface of the glass substrate 10, the width Lmm of the ultrasonic processing target region is, in some cases, smaller than the width of the glass substrate 10.

Here, since the glass substrate 10 used in the present embodiment is 360 mm×465 mm in size, the dimension thereof in the width direction is 360 mm in the case where the glass substrate 10 is transported in its lengthwise direction. Therefore, the predetermined width L of the ultrasonic processing target region 30 is 360 mm. On the other hand, the ultrasonic oscillation elements 13 used in the present embodiment are W-357LS-380 of 100 mm×15 mm in size. Therefore, the foregoing dimension M is 100 mm, which is smaller than the width L=360 mm.

Therefore, by linearly and densely providing a plurality of ultrasonic oscillation elements 13 in a width direction B so as to form the element array 14 with a width of not less than Lmm, the dimension Lmm can be covered. Let the number n (n: natural number of not less than 3) of the ultrasonic oscillation elements 13 necessary for forming the element array 14, and the dimension (length) nMmm of the element array 14 in the width direction may exceed the width Lmm (nM>L).

However, generally, to form an element array by linearly providing ultrasonic oscillation elements, it is necessary to form, for instance, element spaces with a width of not less than 0.2 mm each (in FIG. 1, a region 20 with a width of D) between the ultrasonic oscillation elements (in the case where the ultrasonic oscillation element is the aforementioned W-357LS-380), so as to isolate each ultrasonic oscillation element.

Normally, a power source circuit or a control circuit is provided in each ultrasonic oscillation element, so as to adjust outputs of the ultrasonic oscillation elements to eliminate variation of outputs thereof. Besides, if ultrasonic oscillation elements are too close to each other, ultrasonic generated by the ultrasonic oscillation elements tends to interfere each other, thereby causing ultrasonic outputs to further vary. Therefore, it is preferable to provide spaces each of which is not less than a predetermined width.

Therefore, arises necessity to form element spaces with a width each such that at least an insulating effect can be provided, and preferably that an interference effect of ultrasonic can be suppressed. Note that a minimum requisite distance that allows at least an insulating effect to be exhibited is referred to as an insulation distance $d_t$ in the present embodiment. The insulation distance $d_t$ varies depending on a type or a size of the ultrasonic oscillation element: for instance, in the case where the ultrasonic oscillation element is W-357LS-380, the insulation distance $d_t$ is about 0.2 mm. The insulation distance is not shown in the figures.

Provision of such element spaces (insulating regions) in an element array, however, could result in that insufficient ultrasonic is projected to portions corresponding to the element spaces upon cleaning (cleaning operation), or that substantially no ultrasonic is projected to the portions. Consequently, the processing object becomes non-uniformly processed. Incidentally, the foregoing portions of the processing object corresponding to the element spaces, to which insufficient ultrasonic is projected, is hereinafter referred to as non-projection regions.

Therefore, as shown in FIGS. 7, 8, and 9, the element arrays 14 are juxtaposed in the foregoing transport direction A in parallel, and the ultrasonic oscillation elements 13 composing the element array 14B in the second line are provided at positions corresponding to the foregoing element spaces 20 in the element array 14A in the first line (k=1). This arrangement allows the non-projection regions for the element array A to be covered by the element array B in the second line.

Consequently, it is possible to project ultrasonic throughout an entirety of the ultrasonic processing target region uniformly and non-defectively by means of the ultrasonic oscillation elements 13 with a dimension Mmm which is smaller than the predetermined width Lmm.

Further, in the present invention, by setting the number of the ultrasonic oscillation elements 13 composing the element arrays 14 according to the predetermined width of the ultrasonic processing target region and the size of the ultrasonic oscillation element 13, the width D of the element space 20 can be set as great as possible. This enables to avoid the interference effect of ultrasonic more surely, thereby to suppress generation of non-uniform ultrasonic projection more surely. Consequently, this enables to avoid variation of ultrasonic processing (cleaning processing)

Moreover, as compared with an arrangement of the element arrays 14s and 14t in which ultrasonic oscillation elements 13 are densely provided as shown in FIG. 10(a), an arrangement of the element arrays 14A and 14B in which the element space D is set as great as possible as shown in FIG. 10(b) allows the number of ultrasonic oscillation elements used to be decreased.

More specifically, in the case where the ultrasonic oscillation elements 13 are densely arranged so as to completely cover the ultrasonic processing target region 30 as shown in FIG. 10(a), three ultrasonic oscillation elements 13 are required in the element array 14s in the first line, while two ultrasonic oscillation elements 13 are required in the element array 14t in the second line. On the contrary, in the case where the width D of each element space 20 is set greater, the numbers of the ultrasonic oscillation elements 13 in the element arrays 14A and 14B are only two and one, respectively. Thus, the number of the ultrasonic oscillation elements 13 can be decreased, resulting in further reduction of costs.

Therefore, to set the width D of each element space 20 as great as possible, the number of the ultrasonic oscillation elements 13 composing the element array 14 is determined according to the predetermined width Lmm of the ultrasonic processing target region and the dimension Mmm of the ultrasonic oscillation element 13. This determination will be explained below.

For instance, assuming that the plurality of element arrays 14 are two of the element arrays 14A and 14B, to decrease the number of the ultrasonic oscillation elements 13 composing the element arrays 14A and 14B to a minimum number, a result is different depending on whether the predetermined width Lmm of the ultrasonic processing target region 30 is less than an even number of times of the dimension Mmm of the ultrasonic oscillation element 13, or it is less than an odd number of times of the same.

Figure 11A:
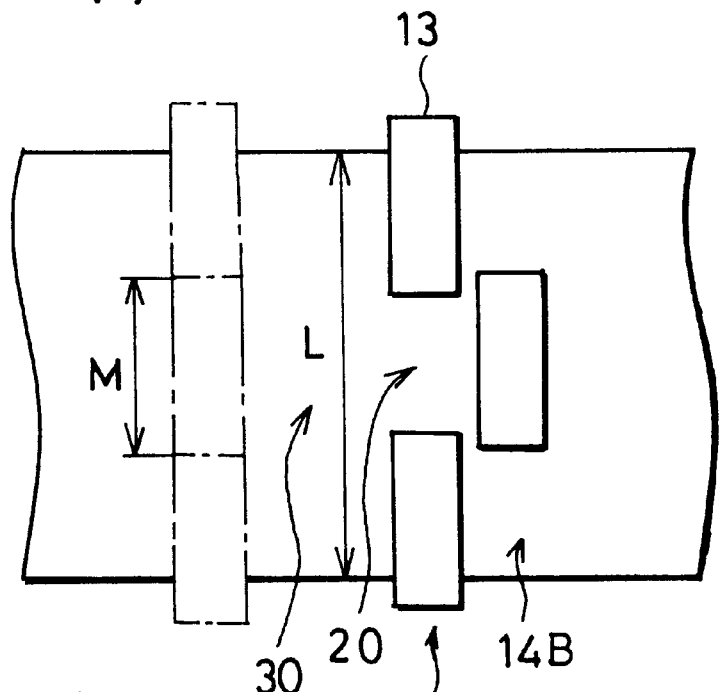
FIGS. 11(a) and 11(b) are explanatory views illustrating relationship between the width of the ultrasonic processing target region and the number of ultrasonic oscillation elements composing element arrays in the ultrasonic processing device shown in FIG. 7.
Figure 11B:
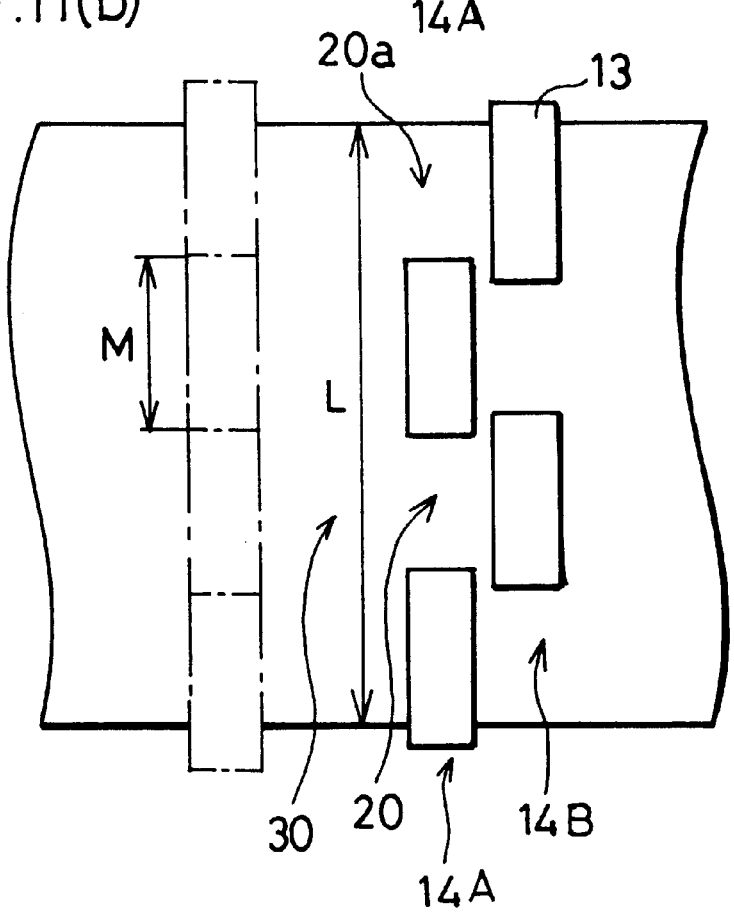

Assume that the predetermined width Lmm is not less than twice and less than three times of the dimension Mmm, as shown in FIG. 11(a) (dot lines in the figure show a state in which the ultrasonic oscillation elements 13 are densely provided). In this case, two ultrasonic oscillation elements 13 are provided to compose the element array 14A in the first line, while one ultrasonic oscillation element 13 is provided to compose the element array 14B in the second line so as to cover the element space 20 in the element array 14A. Note that in the present invention an element array 14 is composed of at least one ultrasonic oscillation element 13 in a plate-like form or in a bar-like form.

On the other hand, in the case where the predetermined width Lmm is, for instance, not less than three times, less than four times of the dimension Mmm, two ultrasonic oscillation elements 13 are provided in each of the element arrays 14A and 14B in the first and second lines. In other words, in the case where the element arrays 14A and 14B cover the element spaces 20 thereof each other and the element arrays 14A and 14B are shorter than the predetermined length Lmm, the ultrasonic oscillation element 13 is provided so as to cover a space 20a where no ultrasonic oscillation element 13 is provided (non-provision space) at an end of the element arrays 14A and 14B.

Incidentally, since the foregoing element spaces 20 are also regarded as spaces where no ultrasonic oscillation element 13 is provided, the foregoing element spaces 20 and the non-provision spaces 20a, which are present at ends of the element arrays 14A and 14B shorter than the predetermined width Lmm are collectively referred to as a non-provision region where no ultrasonic oscillation element (vibrating element) 13 is provided.

Therefore, a range of the width Lmm of the ultrasonic processing target region can be determined according to the number n of the ultrasonic oscillation elements 13 when densely provided and a dimension Mmm of the ultrasonic oscillation element 13, and the following expression (1) is established:

$$(n-1)M \leq L < nM \tag{1}$$

As n is varied from 2 to 9 when the foregoing expression (1) is established, the number of the ultrasonic oscillation elements 13 composing the element array $14^k$ in the k'th line and the number of the ultrasonic oscillation elements 13 composing the element array $14^{k+1}$ in the k+1'th line are as follows:

TABLE 1

| n | RANGE OF WIDTH L OF Ultrasonic processing target region | NUMBER OF ULTRASONIC OSCILLATION ELEMENTS | |
|---|---|---|---|
| | | k'TH LINE | k + 1'TH LINE |
| 2 | 1M ≤ L < 2M | 1 | 1 |
| 3 | 2M ≤ L < 3M | 2 | 1 |
| 4 | 3M ≤ L < 4M | 2 | 2 |
| 5 | 4M ≤ L < 5M | 3 | 2 |
| 6 | 5M ≤ L < 6M | 3 | 3 |
| 7 | 6M ≤ L < 7M | 4 | 3 |
| 8 | 7M ≤ L < 8M | 4 | 4 |
| 9 | 8M ≤ L < 9M | 5 | 4 |
| . | . | . | . |
| . | . | . | . |
| . | . | . | . |
| n | (n − 1) M ≤ L < nM | | |
| | → n: ODD NUMBER | (n + 1)/2 | (n − 1)/2 |
| | → n: EVEN NUMBER | n/2 | n/2 |

*L: PREDETERMINED WIDTH OF Ultrasonic processing target region
*M: DIMENSION OF ULTRASONIC OSCILLATION ELEMENT Therefore, in the case where the width Lmm of the region to be subjected to ultrasonic (ultrasonic processing target region) satisfies the foregoing expression (1), the number of the ultrasonic oscillation elements 13 composing the element array $14^k$ in the k'th line and the number of the ultrasonic oscillation elements 13 composing the element array $14^{k+1}$ in the k+1'th line are set to (n+1)/2 and (n−1)/2, respectively, when n is an odd number, while the number of the ultrasonic oscillation elements 13 composing the element array $14^k$ in the k'th line and the number of the ultrasonic oscillation elements 13 composing the element array $14^{k+1}$ in the k+1'th line are set to n/2 each, when n is an even number. By so doing, the element arrays 14 can be formed with a minimum number of the ultrasonic oscillation elements 13.

Consequently, this allows the width D of the element space 20 to be set to maximum, thereby ensuring that the interference effect between the ultrasonic oscillation elements 13 can be further surely suppressed, and that the number of the ultrasonic oscillation elements 13 can be decreased in the case of the element arrays 14A and 14B with the element spaces 20 being set to maximum.

Incidentally, since the present embodiment focuses a case in which at least one element array includes not less than 2 ultrasonic oscillation elements, n is set to a natural number of not less than 3 herein, but the foregoing expression (1) can be established when n=2 as shown in Table 1 for reference.

Furthermore, viewing a plurality of element arrays 14 all together, that is, viewing a whole arrangement of a plurality of ultrasonic oscillation elements 13, as shown in FIG. 9, when the foregoing element arrays 14 are projected on a plane on the foregoing transport direction A side (a projected FIG. 18 in FIG. 9), projection regions of the ultrasonic oscillation elements 13 composing the element array 14A and projections regions of the ultrasonic oscillation elements 13 composing the element array 14B overlap each other, thereby forming superimposition regions 19. Consequently, projection regions (the foregoing projected FIG. 18) of the element arrays 14A and 14B become a single belt-like region.

The foregoing "projection" indicates that by projecting collimated light directed in the transport direction A to the ultrasonic oscillation elements 13, a shadow of the ultrasonic oscillation elements 13 is projected on a plane on the transport direction A side whose normal direction is matched with the foregoing collimated light, and the foregoing projection region indicates the shadow of the ultrasonic oscillation elements 13 projected on the foregoing plane.

Thus, by arranging the plurality of ultrasonic oscillation elements 13 in whole so as to form the superimposition regions 19 on the projected FIG. 18, the foregoing non-projection regions produced upon projection of ultrasonic from the element array 14A to the glass substrate can be covered by ultrasonic projected from the element array 14B. Therefore, even in the case where a region requiring ultrasonic projection is larger than the size of the ultrasonic oscillation element 13, ultrasonic can be uniformly projected on an entirety of the same. Consequently, an entirety of a surface of the cleaning object (glass substrate 10) can be uniformly cleaned, thereby ensuring further enhancement of the cleaning effect as compared with the conventional cases, while allowing the cleaning time to be shortened.

In the ultrasonic processing device in accordance with the present invention, as described above, it is possible to ensure a maximum width D of the element space 20 by determining the number of the ultrasonic oscillation elements 13 in the element arrays 14 depending on the predetermined width Lmm of the ultrasonic processing target region and the dimension Mmm of the ultrasonic oscillation element 13. The present invention, however, is not limited to this.

The width D of the element space 20 is not particularly limited as long as it exceeds the foregoing insulation distance $d_t$ for insulation between the ultrasonic oscillation elements 13, but it is preferably set to not less than half of the dimension Mmm ($D \geq M/2$), though depending on a concrete value of the dimension Mmm. In the case where a lower limit value of the width D of the element space 20 exceeds the foregoing value, it is possible to decrease the number of the ultrasonic oscillation elements 13 used, as described above, as well as to avoid the interference effect.

On the other hand, an upper limit value of the width D of the element space 20 is preferably a value determined according to the number of the ultrasonic oscillation elements 13 composing the element arrays 14 as described above, but it is not particularly limited as long as the foregoing superimposition regions 19 with a minimum requisite width $d_0$ each can be formed. In other words, the upper limit value of the width D of the element space 20 can be determined according to the width $d_0$ of the superimposition region 19. The width $d_0$ of the superimposition region 19 is preferably in a range of greater than the insulation distance $d_t$, to smaller than half of the dimension Mmm of the ultrasonic oscillation element 13.

A desirable range of the width $d_0$ of the foregoing superimposition region 19 will be explained below. In the present invention, the ultrasonic oscillation elements 13 are arranged so that the ultrasonic oscillation elements 13 in the element array $14^{k+1}$ in the k+1'th line cover the element space 20 or the non-provision region 20a in the element array $14^k$ in the k'th line. For instance, in the case where, as shown in FIGS. 7 and 9, the element array 14A in the first line is composed of two ultrasonic oscillation elements 13, and the element array 14B in the second line is composed of one ultrasonic oscillation element 13 provided so as to cover the element space 20, two superimposition regions 19 are formed by the foregoing three ultrasonic oscillation elements 13.

Here, the manner how the superimposition regions 19 are formed is not particularly limited, but in the case where the width D of the element space 20 is set as great as possible like in the present invention, the widths $d_0$ of the two superimposition regions 19 are preferably equal to each other.

Figure 12A:
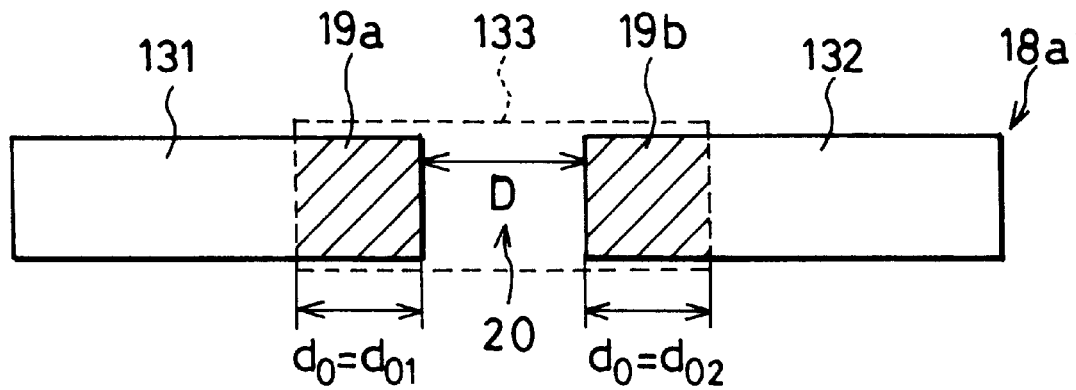
FIGS. 12(a), 12(b), and 12(c) are explanatory views explaining variations of superimposition regions formed by the ultrasonic oscillation elements provided as shown in FIG. 7.

For instance, in a projected FIG. 18a shown in FIG. 12(a), a width of $d_0=d_{01}$ of a superimposition region 19a of the ultrasonic oscillation element 131 (indicated with solid lines) composing the element array 14A and the ultrasonic oscillation element 133 composing the element array 14B (indicated with dot lines) is substantially equal to a width of $d_0=d_{02}$ of a superimposition region 19b of the ultrasonic oscillation elements 132 composing the element array 14A and the ultrasonic oscillation elements 133 composing the element array 14B ($d_{01} \approx d_{02}$).

Figure 12B:
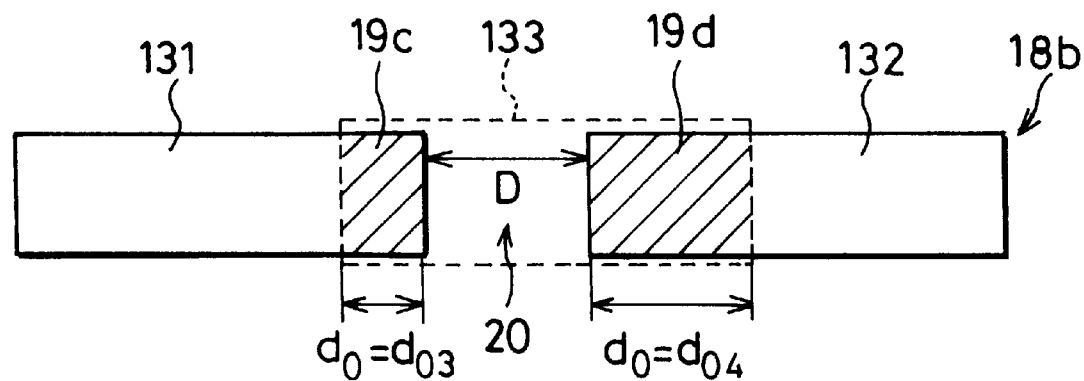

On the other hand, in a projected FIG. 18b shown in FIG. 12(b), a width of $d_0=d_{03}$ of a superimposition region 19c of the ultrasonic oscillation elements 131 and 133 is not equal to a width of $d_0=d_{04}$ of a superimposition region 19d of the ultrasonic oscillation elements 132 and 133: $d_{03}$ is smaller than $d_{04}$ ($d_{03}<d_{04}$)

Thus, the width $d_0$ of the superimposition region 19 varies depending on the arrangement of the ultrasonic oscillation elements 13 (here, the ultrasonic oscillation elements 131 through 133), but in any one of the cases of the superimposition regions 19a through 19d, the projected FIG. 18a or 18b forms a belt-like region as a whole. Therefore, in any case, it is possible to uniformly and non-defectively project ultrasonic throughout the entire width-direction-B dimension of the glass substrate while the substrate 10 is being transported.

In the case where it is aimed to make the width D of the element space 20 as great as possible, however, that the width $d_0=d_{03}$ of the superimposition region 19c is smaller than the width $d_0=d_{04}$ means that it is possible to increase the element space 20 by a difference between the widths of the superimposition regions 19c and 19d. Therefore, the widths $d_0$ of the two superimposition regions 19 are preferably substantially equal.

Figure 12C:
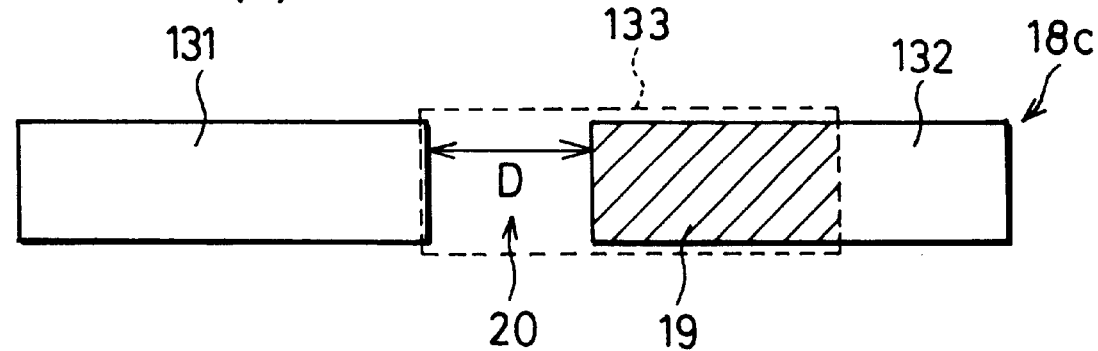

Furthermore, an arrangement as shown in the projected FIG. 18c of FIG. 12(c), in which a position of an end of the ultrasonic oscillation element 131 falls on a position of an end of the ultrasonic oscillation element 133, and the ultrasonic oscillation elements 131 and 133 form substantially no superimposition region 19, that is, an arrangement in which only the element space 20 with the width D is simply covered, is not preferable.

In this case, theoretically, a projected FIG. 18c as a whole becomes a belt-like region, but actually, depending on position accuracy of the ultrasonic oscillation elements 131 and 133, a non-projection region could be more or less produced between the ultrasonic oscillation elements 131 and 133.

For instance, in the case where the ultrasonic oscillation elements 13 are provided closely in terms of distance to a cleaning object (glass substrate 10), progress of ultrasonic is regarded as substantially straight. Therefore, the width D of the element space 20 is substantially equal to the width of the non-projection region. Accordingly, by arranging the ultrasonic oscillation elements 13 so that the width $d_0$ of the superimposition region 19 should be set to at least not greater than the width $d_t$ of the insulating region, non-uniformity in the processing operation (non-uniformity in the cleaning operation) can be avoided, theoretically.

However, to more surely achieve uniform ultrasonic projection by considering variation of position accuracy, the ultrasonic oscillation elements 13 are preferably arranged so that they form superimposition regions 19 without failure. This allows portions not subjected to ultrasonic to be surely covered, thereby further ensuring avoidance of non-uniformity in the processing operation.

In the case where the widths $d_0$ of the two superimposition regions 19 are substantially equal, each width do of the superimposition regions 19 is preferably more than the insulation distance $d_t$ and less than ¼ of the dimension Mmm of the ultrasonic oscillation element 13.

As described in conjunction with FIG. 12(c), depending on position accuracy, there is a possibility that a non-projection region could be present even in the case where the ultrasonic oscillation elements 13 form superimposition regions 19. Then, by securing the insulation distance $d_t$ as a minimum width of the element space 20 as the width $d_0$ of the superimposition region 19, this results in that the insulation distance $d_t$ is added as a margin. Consequently, even with variation of position accuracy, production of non-projection region can be surely avoided ($d_0>d_t$).

On the other hand, in the present invention, in order to secure the element spaces 20 maximum possible to an extent such that the number of the ultrasonic oscillation elements 13 can be made as small as possible, the width of the element space 20 is preferably not smaller than half of the dimension Mmm of the ultrasonic oscillation element 13. Therefore, in the case where one of the widths $d_0$ of the two superimposition regions 19 is smaller than ¼ of the dimension Mmm of the ultrasonic oscillation element 13 ($d_0<M/4$), the element space 20 can be secured to a width of not smaller than half of the dimension Mmm of the ultrasonic oscillation element 13.

Incidentally, since performance of the ultrasonic oscillation element 13 varies depending on a manufacturer, a purpose of use, a type of a product, etc., the dimension Mmm of the ultrasonic oscillation element 13 and the insulation distance $d_t$ also vary depending on the type of the ultrasonic oscillation element 13. Therefore, the width of the element space 20, a desirable range of the width $d_0$ of the superimposition region 19, etc. are experimentally discovered, as to each type of the ultrasonic oscillation elements 13.

The foregoing W-357LS-380 as the ultrasonic oscillation element 13 used in the present embodiment has a size of 100 mm×15 mm, and the insulation distance $d_t$ in the case where the same is used is about 0.2 mm. Therefore, the width of the foregoing element space 20 is at least more than 0.2 mm, or preferably not less than 50 mm, or more preferably not less than 75 mm. Besides, the width $d_0$ of the superimposition region 19 is preferably in a range of not less than 0.2 mm and not more than 50 mm, or more preferably in a range of not less than 5 mm and not more than 10 mm.

The number of the plurality of the element arrays 14 is not particularly limited, either, as long as at least two of them are provided, as shown in FIGS. 7, 8, and 9. In the case where more uniform and surer projection of ultrasonic throughout an entirety of a processing object (glass substrate 10), they may be provided in not less than three lines. More specifically, in element arrays 14 provided in not less than two lines, there should be at least one combination of element arrays 14 in which each non-provision region in one of the element arrays 14 is covered by the ultrasonic oscillation element(s) 13 in the other element array 14.

Incidentally, a frequency of ultrasonic generated by the foregoing ultrasonic oscillation elements 13, a type of a cleaning liquid used, a timing of supply of the cleaning liquid to the upper surface of the glass substrate 10, etc. are as depicted in the description of the first embodiment.

The glass substrates 10 thus cleaned by the foregoing cleaning section are transported into the drying section as shown in FIG. 2, where they are dried by air knife drying (AIR KNIFE DRYING PROCESS). Subsequently, the glass substrates 10 are transported to the unloader section, where they are one by one housed in a cassette (GLASS SUB- STRATE HOUSING PROCESS). Thus, the cleaning treatment with respect to the glass substrates 10 is finished.

Thus, the ultrasonic cleaning device in accordance with the present embodiment is equipped with a plurality of ultrasonic oscillation elements forming a plurality of element arrays that are arranged so that ultrasonic oscillation element non-provision regions in one element array are covered by ultrasonic oscillation elements in another element array, and besides, the ultrasonic oscillation elements are arranged so as to form superimposition regions, and so that a width of spaces between the ultrasonic oscillation elements exceeds an insulation distance.

This arrangement ensures that the entirety of the ultrasonic processing target region is completely covered by using ultrasonic oscillation elements that are easy to get and have high reliability. Therefore, more uniform ultrasonic projection can be achieved as compared with conventional cases. This allows the usage of cleaning liquid to be reduced with a sufficient cleaning effect ensured, thereby realizing a sure and efficient cleaning operation as well as lowering running costs. Furthermore, since the element spaces are set sufficiently large, the individual ultrasonic oscillation elements are sufficiently separated, and this allows the interference effect between the elements to be suppressed, thereby ensuring stable generation of ultrasonic.

In the present embodiment, furthermore, the following arrangement is preferable: let the predetermined width of the ultrasonic processing target region be Lmm, let the dimension of the ultrasonic oscillation element be Mmm, and let the number of the oscillation elements be n (n>2), then, in the case where the width Lmm and the dimension Mmm satisfy $(n-1)M \leq L < nM$, the number of the ultrasonic oscillation elements 13 composing the element array in the k'th line and the number of the ultrasonic oscillation elements 13 composing the element array in the k+1'th line are set to $(n+1)/2$ and $(n-1)/2$, respectively, when n is an odd number, while the numbers of the ultrasonic oscillation elements 13 composing the element arrays in the k'th and k+1'th lines are set to $n/2$ each, when n is an even number.

This allows the width of the element space to be maximized, thereby enabling stable generation of ultrasonic by drastically suppressing the interference effect between the elements, while allowing the number of elements to be decreased as compared with a state in which the elements are densely provided. Therefore, it is possible to further simplify the power supply system and control system for the vibrating elements.

Incidentally, the ultrasonic cleaning device in the present embodiment may include cleaning liquid collecting means for collecting cleaning liquid having been supplied to a cleaning object, or filtering means for filtering cleaning liquid collected. This ensures recycle and reuse of cleaning liquid, as well as further reduction of usage of the cleaning liquid.

The foregoing embodiment is explained by taking as an example a case in which the present invention is applied to fabrication of a glass substrate for use in an LCD element, but, needless to say, the present invention is not limited to this. In other words, the present invention is suitably applicable to a fabrication method of electronic parts that includes a cleaning process.

To state differently, the electronic parts fabrication method in accordance with the present invention includes an ultrasonic cleaning process in which, the processing object that is transported in a predetermined direction, while supplied with cleaning liquid, is subjected ultrasonic that is projected from a plurality of ultrasonic oscillation elements between which element spaces each exceeding an insulation distance that allows insulation between the elements, so that respective ultrasonic-projected regions by the ultrasonic oscillation elements partly overlap each other to completely cover an ultrasonic processing target region with a predetermined width.

This allows the present invention to be suitably applied to, other than that using the glass substrate as described above, an electronic parts fabrication method with an ultrasonic cleaning process, particularly an electronic parts fabrication method in which an ultrasonic processing target region to be subjected to ultrasonic is large.

[Third Embodiment]

Figure 13:
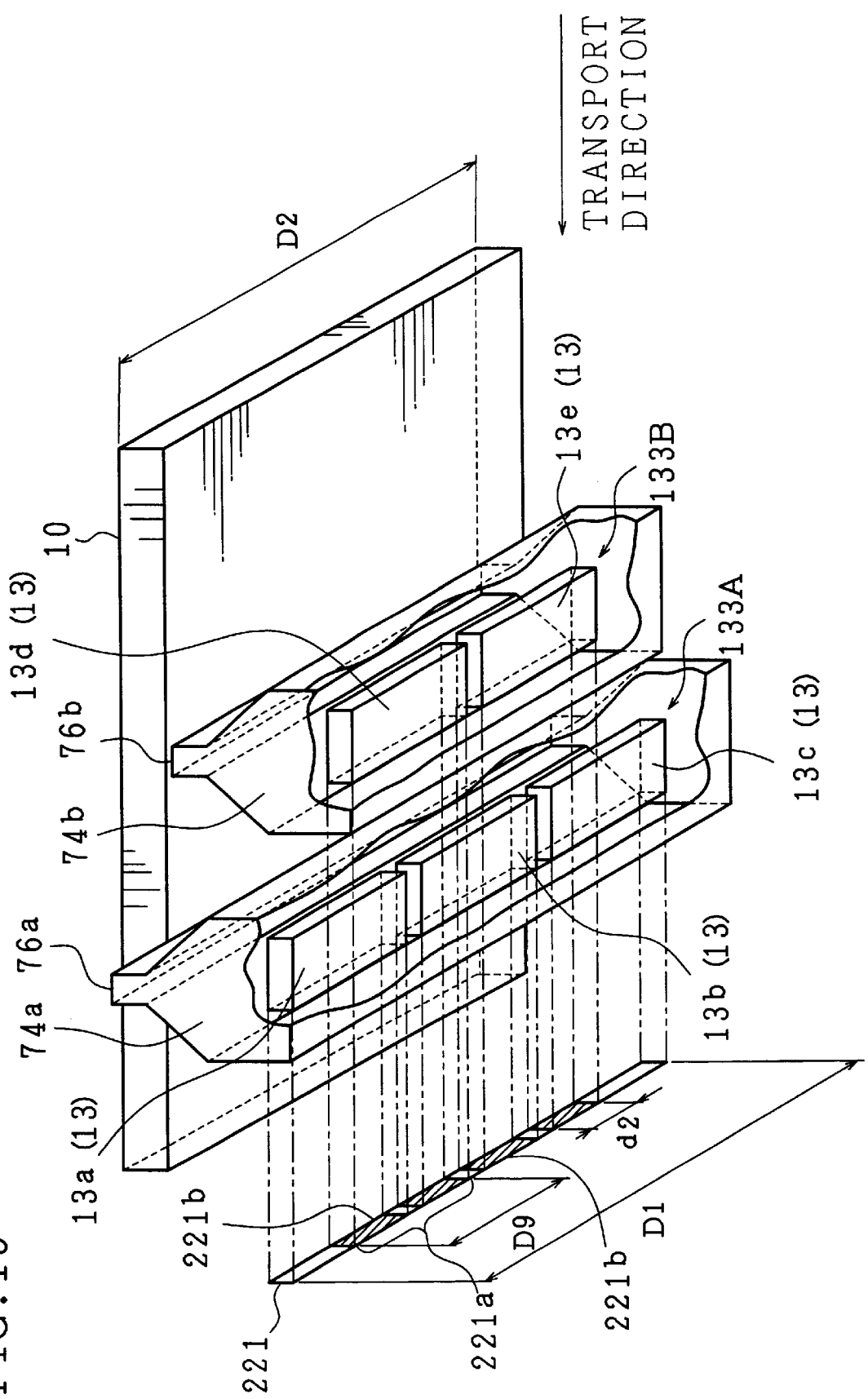
FIG. 13 is a perspective view schematically illustrating an example of an arrangement of ultrasonic oscillation elements in an ultrasonic processing device (ultrasonic cleaning device) in accordance with still another embodiment of the present invention.
Figure 17:
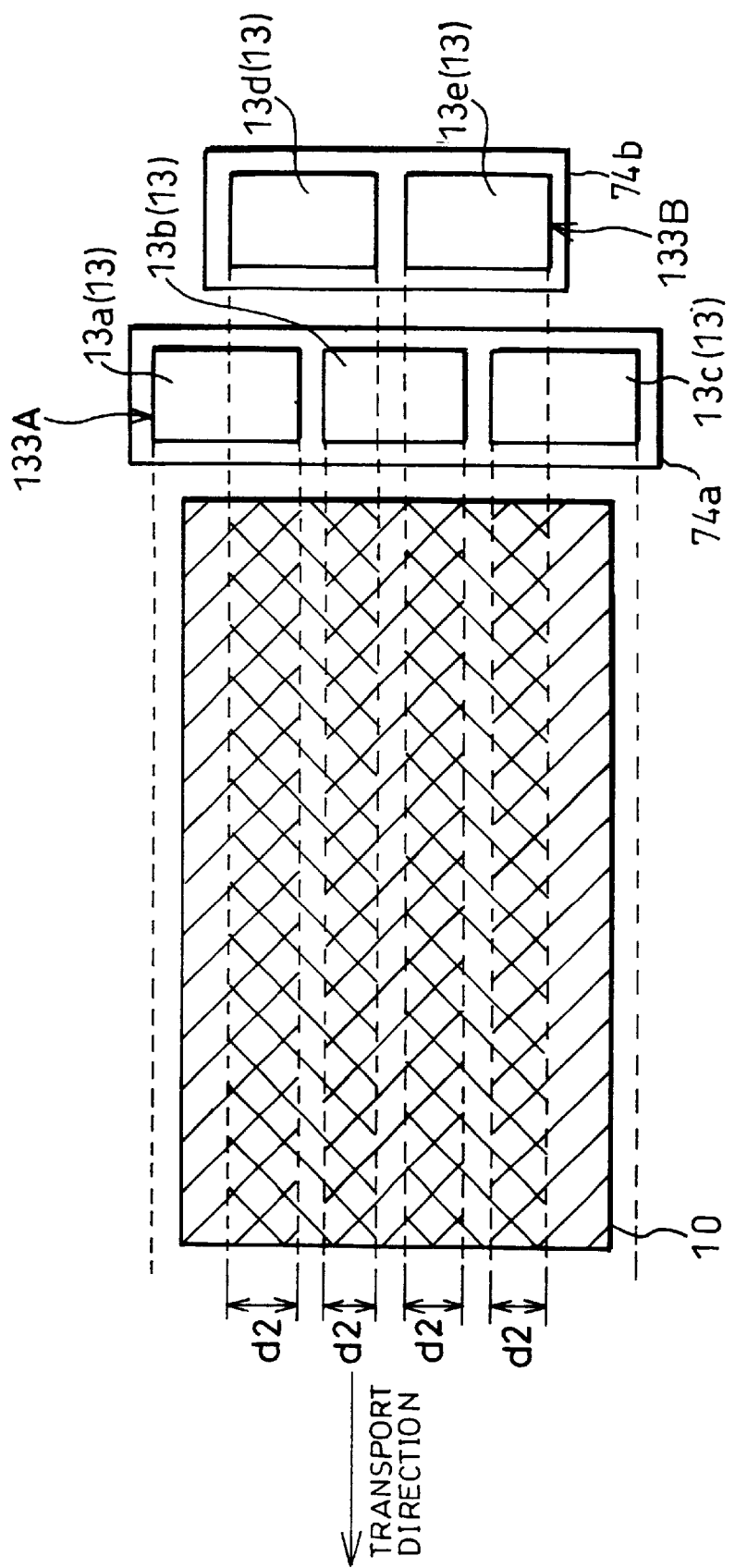
FIG. 17 is an explanatory view illustrating, from the vertical direction, a state in which ultrasonic is projected to a glass substrate by means of the ultrasonic processing device shown in FIG. 13.

The following description will explain still another embodiment of the present invention while referring to FIGS. 2, 13, and 17. However, the present invention is not particularly limited to this. Note that the members having the same structure and function as those in the first and second embodiments will be designated by the same reference numerals and their description will be omitted.

An ultrasonic oscillation device in accordance with the present embodiment is an ultrasonic cleaning device adapted for cleaning a glass substrate (processing object, cleaning object) for use in an LCD element, as in the first and second embodiments described above.

The glass substrate cleaning process is performed by units including a loader section, a first cleaning section, a second cleaning section, a third cleaning section (ultrasonic cleaning section), a drying section, and an unloader section, in the stated order from an upstream side in a direction of transport of the glass substrate (travelling direction), as shown in FIG. 2, like in the first embodiment. Incidentally, arrangements of the foregoing units are substantially identical to those explained in the description of the first embodiment. Therefore, the following description will explain the arrangement of the third cleaning unit in detail, which is the characteristic point of the present invention.

Figure 14:
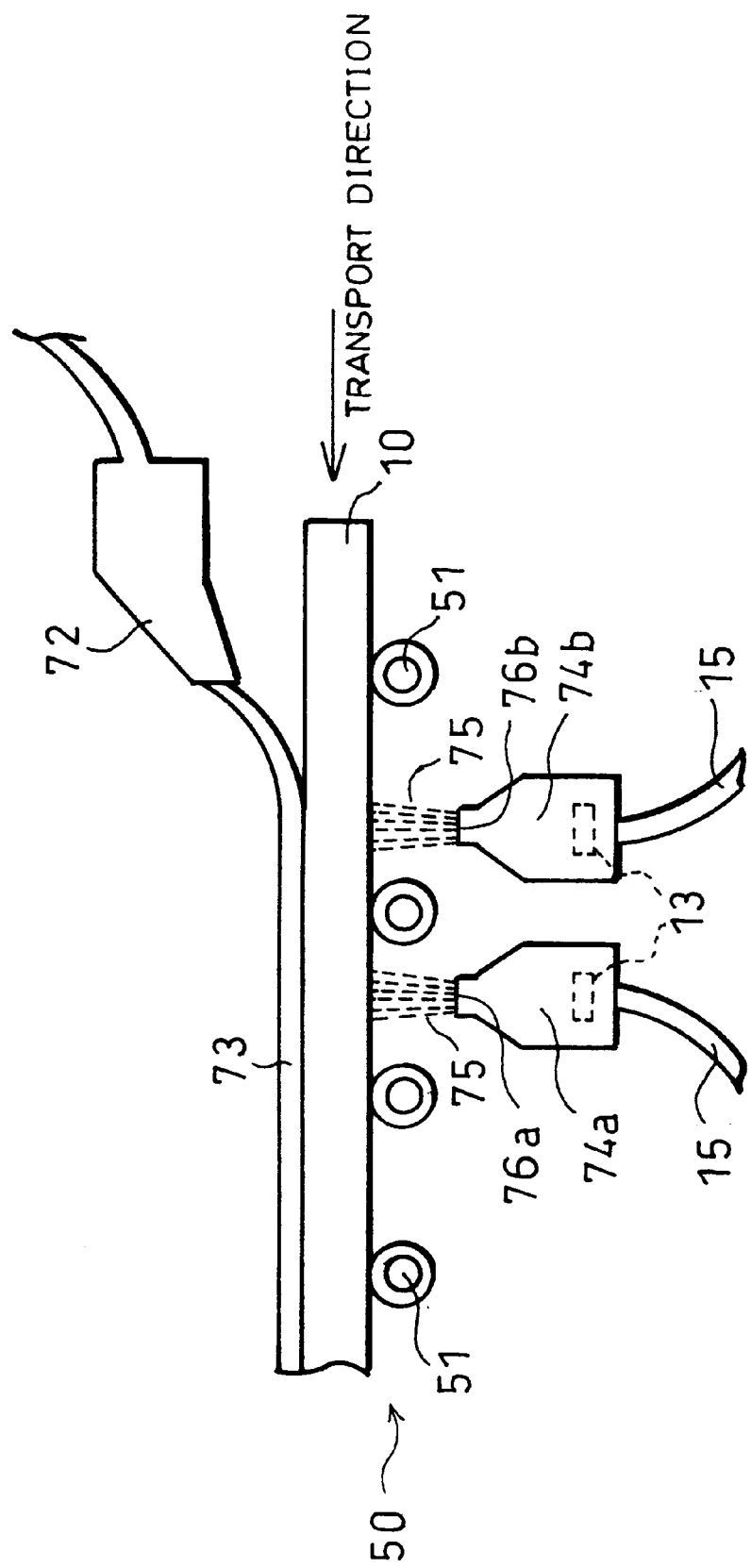
FIG. 14 is a side view schematically illustrating an example of an arrangement of the ultrasonic processing device shown in FIG. 13.

The third cleaning section includes, as shown in FIG. 14, a transport path 50 equipped with a plurality of transport rollers 51 for transporting a glass substrate 10 in a horizontal direction by keeping the glass substrate 10 held on the transport rollers 51, and an upper cleaning-liquid-supply nozzle (composing a part of processing liquid supply means) 72 provided above the glass substrate 10 (above the transport path 50), and two lower cleaning-liquid-supply nozzles (nozzle means) 74a and 74b provided below the glass substrate 10. Furthermore, the lower cleaning-liquid-supply nozzles 74a and 74b are arranged so that both are disposed on the downstream side in the glass substrate 10 transport direction with respect to the upper cleaning-liquid-supply nozzle 72, while the lower cleaning-liquid-supply nozzle 74a is disposed on the transport direction downstream side, with respect to the lower cleaning-liquid-supply nozzle 74b.

The upper cleaning-liquid-supply nozzle 72 has a slit-like nozzle opening, and supplies pure water as upper surface cleaning liquid (processing liquid, cleaning liquid) 73 by converging, onto the upper surface of the glass substrate 10 being horizontally transported by the transport rollers 51. On the other hand, the lower cleaning-liquid-supply nozzles 74a and 74b supply pure water as lower surface cleaning liquid (liquid, processing liquid, cleaning liquid) 75 by converging in a line-form shower to which ultrasonic is projected by the ultrasonic oscillation elements (vibrating elements) 13, onto the lower surface of the glass substrate 10 (ultrasonic processing target region).

In other words, in the foregoing third cleaning section, the ultrasonicated shower in a line form is projected to the glass substrate 10 from below while the pure water as the upper surface cleaning liquid 73 is supplied thereto from above, thereby allowing ultrasonic to be transmitted not only to the lower surface of the glass substrate 10 but also to the upper surface cleaning liquid 73 supplied to the upper surface of the glass substrate 10. This enables simultaneous ultrasonic cleaning with respect to the upper and lower surfaces of the glass substrate 10. Incidentally, in the present embodiment, the upper surface of the glass substrate 10, out of contact with the plurality of transport rollers 51 and the like, is an object of a more accurate cleaning operation. Furthermore, in the present embodiment, a frequency of ultrasonic to be projected to pure water as the lower surface cleaning liquid 75 is 0.4 MHz.

A shape of the upper cleaning-liquid-supply nozzle 72 is not particularly limited to the above-described shape, but a shape with a width substantially equal to the width of the glass substrate 10 is preferable since it allows uniform supply of the same to the upper surface of the glass substrate 10. Furthermore, a direction in which a nozzle opening of the upper cleaning-liquid-supply nozzle 72 faces is not particularly limited. For instance, as shown in FIG. 14, the opening may be provided substantially perpendicularly to the upper surface of the glass substrate 10, provided vis-a-vis the upper surface of the glass substrate 10, or diagonally with respect to the upper surface of the same.

Furthermore, a position at which the upper cleaning-liquid-supply nozzle 72 is provided is not particularly limited as long as it is provided so that it should not be on the downstream side in the glass substrate 10 transport direction with respect to both the lower cleaning-liquid-supply nozzles 74a and 74b. In other words, the upper cleaning-liquid-supply nozzle 72 may be provided right above the lower cleaning-liquid-supply nozzle 74b disposed on the upstream side in the transport direction with respect to the lower cleaning-liquid-supply nozzle 74a. This is because the ultrasonic cleaning device in accordance with the present embodiment is intended to simultaneously clean the upper and lower surfaces of the glass substrate 10, and is not intended to supply the lower surface cleaning liquid 75 subjected to ultrasonic to a region of the lower surface that is opposite to a region of the upper surface of the glass substrate 10 to which the upper surface cleaning liquid 73 is not supplied.

A method for forming a layer of the upper surface cleaning liquid 73 (that is, a method for supplying the upper surface cleaning liquid 73) on the glass substrate 10 is not particularly limited to the aforementioned method using the upper cleaning-liquid-supply nozzle 72, which is described above by way of example. Concretely, a cleaning liquid bath reservoiring the upper surface cleaning liquid 73 may be provided, and the glass substrate 10 may be dipped in the cleaning liquid bath once, and after pulled up, it may be horizontally transported.

In other words, in the present invention, the processing liquid supply means is not particularly limited as long as it is arranged so as to be capable of supply processing liquid to a cleaning object, and it may not necessarily include nozzle means for converging processing liquid and supplying the same to a processing object. For instance, according to necessity, a cleaning liquid jetting or spraying device (processing liquid supply means) that jets or sprays the upper surface cleaning liquid 73 in a shower form, in the place of the foregoing upper cleaning-liquid-supply nozzle 72. Furthermore, the processing liquid supply means may share a cleaning liquid (processing liquid) supply pump, not shown, with liquid supply means described later.

Incidentally, in the case where the cleaning of the glass substrate 10 is carried out only with respect to the lower surface thereof, the processing liquid supply means can be omitted.

The lower cleaning liquid supply nozzles 74a and 74b, as explained above, supply the lower surface cleaning liquid 75 to the lower surface (ultrasonic processing target region) of the glass substrate 10 via liquid supply openings 76a and 76b. Therefore, the lower cleaning-liquid-supply nozzles 74a and 74b may be arranged at least so that the liquid supply openings 76a and 76b are provided so as to supply the lower surface cleaning liquid 75 in a direction in a range of the diagonally upward direction to the upward direction: in the present embodiment, the liquid supply openings 76a and 76b are provided so as to supply the lower surface cleaning liquid 75 in an upward direction, as shown in FIG. 14.

Furthermore, the foregoing liquid supply openings 76a and 76b are arranged in slit-like forms with certain lengths in the width direction (corresponding to widths (width dimension) D3 and D4 shown in FIG. 14, respectively) defined as below. Incidentally, relative relationship between the foregoing widths D3 and D4, the width of the glass substrate 10, the arrangement of the ultrasonic oscillation elements 13 will be explained in detail in description of a whole arrangement of the ultrasonic oscillation elements 13.

For uniform and stable supply of the lower surface cleaning liquid 75 by the lower cleaning-liquid-supply nozzles 74a and 74b, position relationship between the lower cleaning-liquid-supply nozzles 74a and 74b and the transport rollers 51, etc. is important. The position relationship therebetween is not particularly limited, but they are preferably designed in a manner that can suppresses a possibility that the lower surface cleaning liquid 75 supplied from the lower cleaning-liquid-supply nozzles 74a and 74b is brought into contact with the transport rollers 51, thereby blocked before reaching the lower surface of the glass substrate 10. In other words, the position relationship therebetween is preferably determined so that the lower surface cleaning liquid 75 should be supplied to a region of the lower surface of the glass substrate 10 positioned between the transport rollers 51 that are provided adjacent in the glass substrate 10 transport direction. More specifically, (1) in the case where the lower surface cleaning liquid 75 is supplied upward as in the present embodiment, the lower cleaning-liquid-supply nozzles 74a and 74b are preferably provided below a space between the transport rollers 51 provided adjacent in the glass substrate 10 transport direction. On the other hand, (2) in the case where the lower surface cleaning liquid is supplied diagonally upward, at least one of the lower cleaning-liquid-supply nozzles 74a and 74b may be positioned right below the transport rollers 51.

Furthermore, as described above, by designing the transport rollers 51 so as to support only the lower surface end portions of the glass substrate 10, (1) the possibility that the lower surface cleaning liquid 75 supplied via the lower cleaning liquid supply nozzles 74a and 74b is brought into contact with the transport rollers 51 can be suppressed, and (2) soiling and damaging of the lower surface of the glass substrate 10 can be prevented.

Incidentally, the liquid supply means in the present embodiment includes paths for the lower surface cleaning liquid 75 as well as the ultrasonic oscillation elements 13 provided in the foregoing paths. The paths herein are concretely structures from cleaning liquid supply pumps (not shown), the cleaning liquid supply pipes 15, the lower cleaning-liquid-supply nozzles 74a and 74b, etc., to the liquid supply openings 76a and 76b. The foregoing liquid supply means are not particularly limited to those including nozzle means for converging liquid and supplying the same to a processing object, such as the lower cleaning-liquid-supply nozzles 74a and 74b, as long as they are provided with liquid supply openings. From the viewpoint that an effect of the processing operation is further improved, by converging liquid subjected to ultrasonic so as to intensify an output of the liquid, the liquid supply means is more preferably nozzle means.

The foregoing ultrasonic projected to the lower surface cleaning liquid 75 is generated by five ultrasonic oscillation elements 13 in the present embodiment. The foregoing ultrasonic oscillation element 13 is not particularly limited as long as it generates ultrasonic of a desired frequency for ultrasonic cleaning of a cleaning object. The ultrasonic oscillation element 13 applied in the present invention is normally in a plate shape or in a bar shape, and in the present embodiment, for instance, W-357LS-380 available from Honda Electronics Co., Ltd. equipped with a vibrating plate in 100 mm×15 mm size is used. Incidentally, an electric circuit that is provided in each ultrasonic oscillation element 13 so as to cause the ultrasonic oscillation element 13 to generate mechanical vibration is not shown in the figures. The number, size, etc. of the ultrasonic oscillation elements are not particularly limited to those described above.

Figure 15:
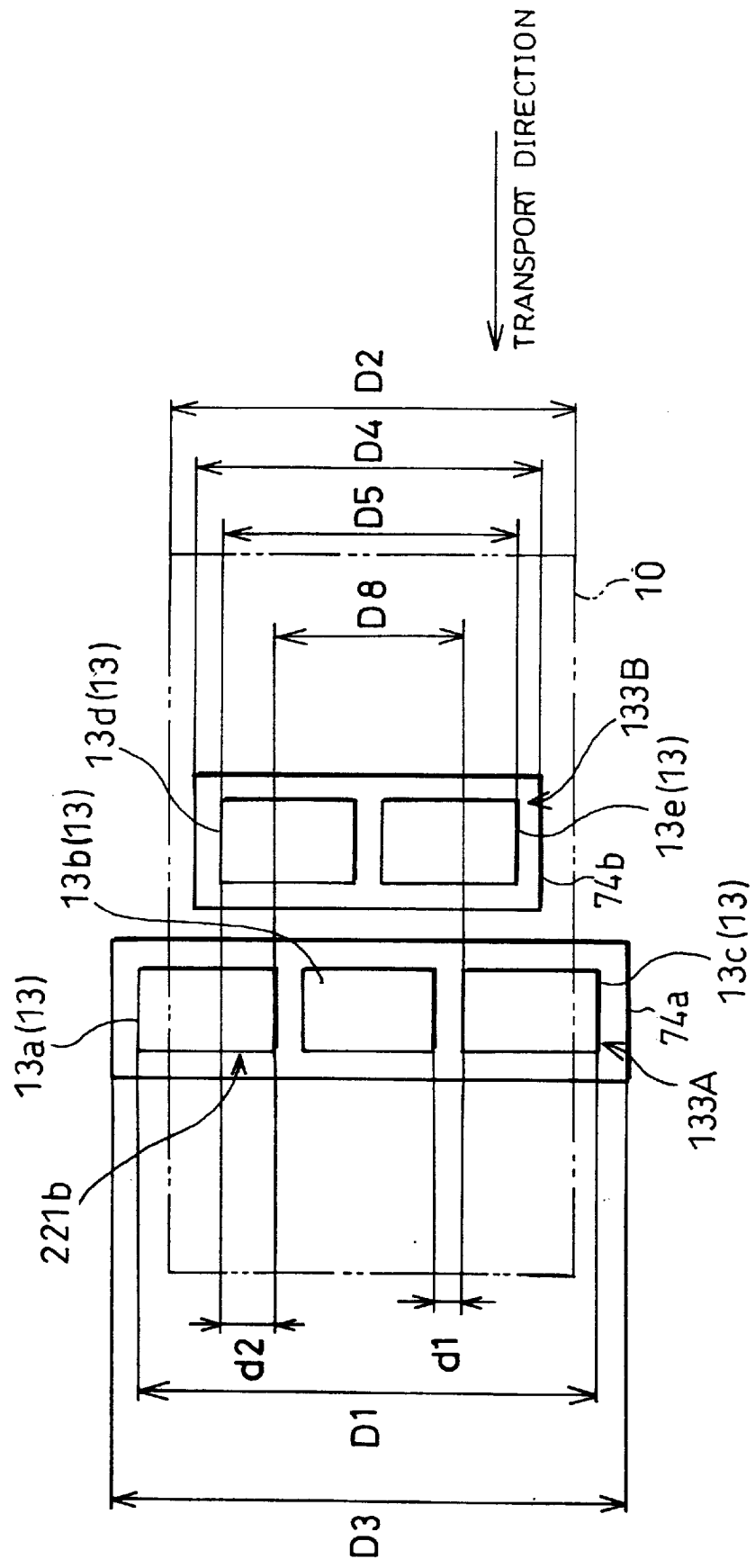
FIG. 15 is an explanatory view illustrating position relationship between the ultrasonic oscillation elements arranged in the ultrasonic processing device shown in FIG. 13 and a glass substrate from a vertical direction.

On the other hand, the glass substrate 10 as cleaning object in the present embodiment has a size of 400 mm in width×500 mm in length. In other words, the width of the processing object has a width greater than the dimension of the ultrasonic oscillation element 13 in the lengthwise direction. Therefore, the ultrasonic cleaning device in accordance with the present embodiment is arranged so that a plurality of the ultrasonic oscillation elements 13 are arrayed in the width direction as shown in FIG. 15, to make ultrasonic be non-defectively projected throughout the entire width-direction dimension of the glass substrate 10. The following description will explain in detail the arrangement of the ultrasonic oscillation elements 13 (distinguished as ultrasonic oscillation elements 13a through 13e as shown in FIG. 15, when necessary).

The foregoing ultrasonic oscillation elements 13 are arranged so that three of them are linearly arrayed at predetermined uniform spaces d1 inside the lower cleaning-liquid-supply nozzle 74a (hereinafter referred to as element array 133A), while the other two are linearly arrays at predetermined uniform spaces d1 inside the lower cleaning-liquid-supply nozzle 74b (element arrays 133B). Each of the foregoing element arrays 133A and 133B is disposed in a direction of a line at which a plane perpendicular to the transport direction of the glass substrate 10 and a horizontal plane intersect (hereinafter referred to as intersection line direction), while the element arrays 133A and 133B are disposed in parallel in the glass substrate 10 transport direction (predetermined direction). Incidentally, the "intersection line direction" indicates the same matter as the "width direction" indicates, and the "width" of a matter, a segment, a region, etc. indicates a length of the matter, the segment, the region, etc. in the foregoing intersection line direction (width direction). Furthermore, the number of the foregoing element arrays is not particularly limited as long as it is not less than two.

The following description will explain in more detail the whole arrangement of the foregoing five ultrasonic oscillation elements 13. Note that the whole arrangement herein explained is referred to as a whole arrangement (A), for conveniences' sake. As shown in FIG. 14, the ultrasonic oscillation elements 13 are arranged so that a projection region (equivalent to a projection region A set forth in claims) 221 obtained by projecting all the ultrasonic oscillation elements 13 onto a plane perpendicular to the glass substrate 10 transport direction should be formed in one continuous shape, as well as should have a larger area than a projection region (equivalent to a projection region B set forth in claims) 221a obtained by projecting one ultrasonic oscillation element 13 appropriately selected from among the ultrasonic oscillation elements 13a through 13e (here, the ultrasonic oscillation element 13e is taken as an example) onto the plane perpendicular to the transport direction. More specifically, the ultrasonic oscillation elements 13 are arranged so that the projection region 221 of the ultrasonic oscillation elements 13 in whole should have a width D1 greater than a width D9 of the projection region 221a of one selected from among the ultrasonic oscillation elements 13. The foregoing five ultrasonic oscillation elements 13 are, as shown in FIG. 15, are formed so that the width D1 of the projection region 221 should be equal to or more than the width D2 (400 mm in the present embodiment) of the ultrasonic processing target region (an entirety of a lower surface of the glass substrate 10 in the present embodiment) of the glass substrate 10.

Incidentally, in the case where all the foregoing ultrasonic oscillation elements 13 are provided at substantially same heights like in the present embodiment, the foregoing continuous shape is a rectangular shape (belt-like shape). In this case, the ultrasonic oscillation elements 13a through 13e are kept at substantially equal distances from the glass substrate 10 as the cleaning object. This allows an ultrasonic processing operation to be applied to the glass substrate 10 under substantially uniform conditions, and hence, it is more preferable.

In the present embodiment, the foregoing five ultrasonic oscillation elements 13 are provided in a whole arrangement (B) described below, which is based on the whole arrangement (A) described above. The whole arrangement (B) is an arrangement of the ultrasonic oscillation elements 13 as a whole, in which, when the foregoing element arrays 133A and 133B are projected to the plane perpendicular to the predetermined direction, projection regions of the ultrasonic oscillation elements 13a through 13c composing the element array 13A (equivalent to projection regions D set forth in claims) and projection regions of the ultrasonic oscillation elements 13d and 13e composing the element array 13B (equivalent to projection regions E set forth in claims) overlap each other, thereby forming superimposition regions 221b. Incidentally, the foregoing superimposition regions 221b are regions indicated by hatching, in the projection region 221 in FIG. 13.

To state differently, the foregoing whole arrangement (B) is an arrangement as a whole in which the ultrasonic oscillation elements 13a through 13c in the element arrays 133A and the ultrasonic oscillation elements 13d and 13e in the element array 133B adjacent to the element array 133A are arranged in a stagger form. Incidentally, the foregoing element arrays 133A and 133B are juxtaposed to each other in the present embodiment, but the arrangement is not particularly limited to this, and the element arrays 133A and 133B may be provided at a distance.

Generally, to form element arrays by linearly providing ultrasonic oscillation elements, for instance, insulating regions with a width of not less than 0.2 mm each are formed between the ultrasonic oscillation elements (in the case where the ultrasonic oscillation element is the aforementioned W-357LS-380), so as to isolate each ultrasonic oscillation element, intending to adjust outputs of the ultrasonic oscillation elements that tend to vary.

However, provision of such insulating regions in an element array could result in that insufficient ultrasonic is projected to portions corresponding to the insulating regions upon cleaning (cleaning operation), or that substantially no ultrasonic is projected to the portions. Consequently, the processing object becomes non-uniformly processed. Incidentally, the foregoing portions of the processing object corresponding to the insulating regions, to which insufficient ultrasonic is projected, is hereinafter referred to as non-projection regions.

On the contrary, in the present invention, the plurality of ultrasonic oscillation elements 13 are arranged in whole so as to form the superimposition regions 221*b* having substantially equal widths d2 in the projection region 221. Therefore, the foregoing non-projection regions produced upon projection of ultrasonic from the element array 133B to the glass substrate 10 can be covered by ultrasonic projected from the element array 133A. Therefore, even in the case where a region requiring ultrasonic projection in the glass substrate 10 is larger than the size of the ultrasonic oscillation element 13, ultrasonic can be uniformly projected onto an entirety of the lower surface thereof. This allows ultrasonic to be uniformly transmitted to the upper surface of the glass substrate 10 as well, and consequently, allowing an entirety of both the upper and lower surfaces thereof to be more uniformly cleaned. This ensures further enhancement of the cleaning effect as compared with the conventional cases, while allows the cleaning time to be shortened.

Furthermore, since the lower surface processing liquid 75 is supplied, foreign substances removed by the cleaning operation with respect to the upper surface are prevented from going round to the lower surface and adhering to the lower surface again. This prevention of re-adhesion of foreign substances to the lower surface of the glass substrate 10 is important, from the viewpoint that this will also prevent damaging of the glass substrate 10 by the foreign substances that likely occurs when the glass substrate 10 is made to adhere and fixed to an absorption stage in a process after a heating, exposing or beveling operation.

Incidentally, as explained in detail below, in the case the foregoing width d2 is 0, that is, even in the case where the whole arrangement of the plurality of ultrasonic oscillation elements 13 satisfies only requirements for the whole arrangement (A), an effect that the non-projection regions produced upon ultrasonic projection by the element array 133B onto the glass substrate 10 can be covered by ultrasonic projected by the element array 133A is achieved.

A pattern of formation of the foregoing superimposition regions 221*b* is not particularly limited to the above-described pattern. For instance, some of the foregoing plurality of superimposition regions 221*b* may have different widths. Furthermore, in the case where there are more than two element arrays provided along the transport direction, projection regions of two element arrays that are not adjacent to each other may overlap each other thereby to form superimposition regions.

To state differently, an ultrasonic cleaning device in accordance with the present embodiment is capable of projecting ultrasonic without any defect throughout an entirety of an ultrasonic-processing object having a predetermined width, and hence, the present invention enables uniform projection of ultrasonic to a large region by means of vibrating elements that are easy to get and have high reliability, such as standard products or quasi-standard products.

Therefore, a uniform ultrasonic processing operation with respect to an entirety of a surface of a processing object in a large size can be realized, and ultrasonic processing operations can be uniformly applied to a plurality of processing objects under the same conditions. Consequently, (1) it is possible to realize a uniform ultrasonic processing operation of high performance. Besides, (2) since the processing time can be shortened, processing costs can be reduced.

Here, since performance of the ultrasonic oscillation element 13 varies depending on a manufacturer, a purpose of use, a type of a product, etc., the width of the insulating region and a width of the ultrasonic oscillation element 13 also vary depending on the type of the ultrasonic oscillation element 13. Therefore, a more desirable manner how the superimposition regions 221 are formed is experimentally discovered, as to each type of the ultrasonic oscillation elements 13.

The foregoing W-357LS-380 as the ultrasonic oscillation element 13 used in the present embodiment has a size of 100 mm×15 mm, and at least about 0.2 mm is required for a width (that is, a space d1 shown in FIG. 15) of the insulating region in the case where the same is used. Therefore, the ultrasonic oscillation elements 13*d* and 13*e* to compose the element array 133B may be arranged so that they cover insulating regions formed in the element array 133A. In other words, examples of such an arrangement include cases where some one(s) of the superimposition regions 221*b* is (are) not formed (cases where d2=0 in FIGS. 13 and 15). In such cases, the projection region 221 is one belt-like region, but actually, a region on which ultrasonic projected thereto is weak could possibly be produced, even though it is small. Therefore, an arrangement in which superimposition regions 221*b* are formed is more preferable, rather than an arrangement in which only the foregoing insulating regions are simply covered.

More specifically, for instance, the ultrasonic oscillation elements 13 are preferably provided so that the width d2 of each superimposition region 221*b* is not less than the width of the insulating region (equivalent to the space d1). By providing margins of a width substantially equal to that of the insulating region, the insulating regions can be surely covered.

Furthermore, like in the cases of the first and second embodiments, the foregoing insulating regions may be expanded to a minimum requisite width or wider than that. In this case, a desirable range of the width d2 of each superimposition region 221*b* differs depending on a type of the ultrasonic oscillation element 13 used. In the present embodiment, the aforementioned W-357LS-380 is used as the ultrasonic oscillation element 13, and in this case, when the insulating region is expanded to 0.2 mm or more, the desirable range of the width d2 of the foregoing superimposition region 221*b* is, for instance, a range of not less than 0.2 mm and not more than 50 mm, or more preferably, a range of not less than 5 mm and not more than 10 mm.

Figure 16:
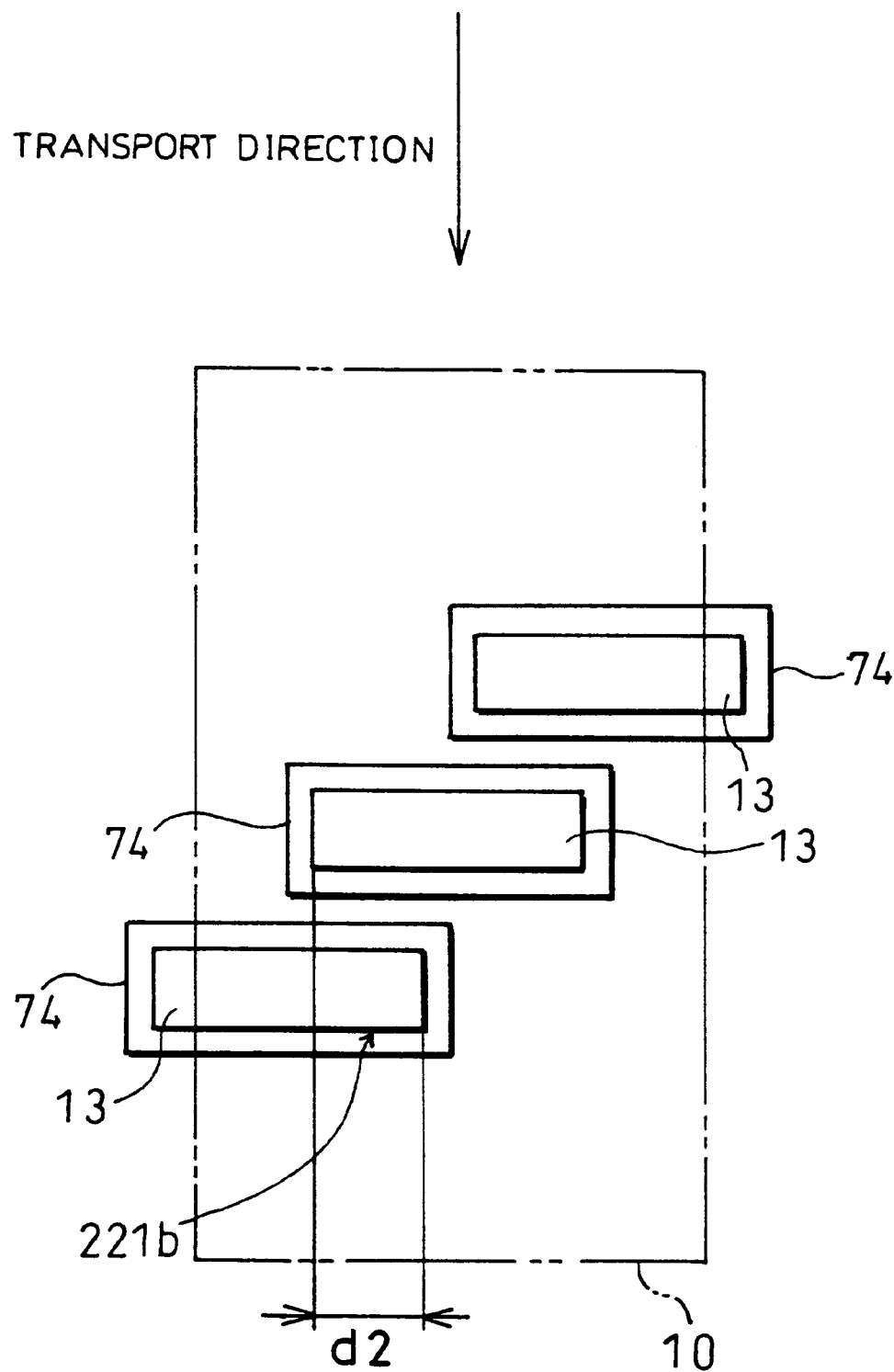
FIG. 16 is an explanatory view illustrating from a vertical direction another example of an arrangement of the ultrasonic oscillation elements in the ultrasonic processing device shown in FIG. 13.

Incidentally, a concrete arrangement of the foregoing ultrasonic oscillation elements 13 is not particularly limited as long as it satisfies the conditions of the whole arrangement (A) described above. Taken as another concrete example of an arrangement is an arrangement such that the ultrasonic oscillation elements 13 are provided substantially diagonally with respect to the glass substrate 10 transport direction so as to have superimposition regions 221*b*, as shown in FIG. 16. Note that in this case three element arrays each being composed of one ultrasonic oscillation element are provided.

Furthermore, in the example shown in FIG. 16, one ultrasonic cleaning nozzle (lower cleaning liquid supply nozzle) 74 corresponds to one ultrasonic oscillation element 13, but the correspondence between the ultrasonic cleaning nozzles 74 and the ultrasonic oscillation elements 13 is not limited to this.

In the present embodiment, the lower surface cleaning liquid 75 to which ultrasonic has been projected is supplied to the lower surface of the glass substrate 10 via the liquid supply openings 76a and 76b. Therefore, the aforementioned correspondence between the ultrasonic oscillation elements 13 and the liquid supply openings 76a and 76b becomes more significant. More specifically, as shown in FIG. 15, (1) the liquid supply opening 76a corresponding to the ultrasonic oscillation elements 13a through 13c is formed so that a width D3 of the same should be equal to or more than a maximum spread width D1 of a projection region (equivalent to a projection region C set forth in claims) that is obtained by projecting the ultrasonic oscillation elements 13a through 13c with correspondence to the liquid supply opening 76a onto a plane perpendicular to the glass substrate 10 transport direction, and (2) the liquid supply opening 76b corresponding to the ultrasonic oscillation elements 13d and 13e is formed so that a width D4 of the same should be equal to or more than a maximum spread width D5 of a projection region (equivalent to the projection region C set forth in claims) that is obtained by projecting the ultrasonic oscillation elements 13d and 13e with correspondence to the liquid supply opening 76b onto a plane perpendicular to the glass substrate 10 transport direction. With this arrangement, the lower surface cleaning liquid 75 to which ultrasonic is projected by the ultrasonic oscillation elements 13 is supplied to the lower surface of the glass substrate 10, without being converged in a width direction by the liquid supply openings 76a and 76b.

Incidentally, in the present invention, "a liquid supply opening corresponding to an ultrasonic oscillation element" indicates a liquid supply opening through which passes liquid to which ultrasonic has been projected by the ultrasonic oscillation element. Therefore thought of are (1) a case where one ultrasonic oscillation element corresponds to one liquid supply opening, and (2) a case where a plurality of ultrasonic oscillation elements correspond to one liquid supply opening. Further, the maximum spread width of the projection region C set forth in claims is, more concretely, (1) in the case where the projection region C is in one continuous shape, a width of the projection region C, or (2) in the case where the projection region C is in a non-continuous shape, a length of a segment connecting width-direction ends of the non-continuous shape.

Furthermore, an ultrasonic cleaning device in accordance with the present embodiment is, to state differently, by arranging an ultrasonic cleaning device so that ultrasonic-projected regions to which ultrasonic is projected by the ultrasonic oscillation elements 13 via the lower surface cleaning liquid overlap to each other, ultrasonic is projected to the lower surface of the glass substrate 10 as an ultrasonic processing target region so that ultrasonic projection completely covers the lower surface (ultrasonic processing target region) so as to clean the same.

FIG. 17 is a view illustrating ultrasonic-projected regions to which the ultrasonic oscillation elements 13 project ultrasonic, respectively, in the lower surface of the glass substrate 10. Note that in FIG. 17 the ultrasonic-projected regions of the ultrasonic oscillation elements 13a through 13c and the ultrasonic-projected regions of the ultrasonic oscillation elements 13d and 13e are indicated by patterns hatched with lines directed in different directions, respectively. According to this, the ultrasonic non-projection regions produced upon projection of ultrasonic from the element array 133B onto the glass substrate 10 can be covered by ultrasonic projection from the element array 133A. Incidentally, regions with a width equivalent to the width d2 of the superimposition regions 221b (indicated by cross-hatching) are ultrasonic-projected regions to which ultrasonic is projected by the element arrays 133A and 133B both.

Furthermore, in this case, the aforementioned ultrasonic oscillation elements 13 and liquid supply openings 76a and 76b may not necessarily have the aforementioned correspondence therebetween. For instance, if taking as an example a case where a width of the liquid supply opening 76b corresponding to the ultrasonic oscillation elements 13d and 13e is formed smaller than the maximum spread width D5 of the projection regions of the ultrasonic oscillation elements 13d and 13e (equivalent to the projection region C set forth in claims) (in other words, the liquid supply opening 76b is converged in the width direction, the width of the liquid supply opening 76b can be tapered to a width D8 shown in FIG. 15.

In other words, in the case where the width of the liquid supply opening 76b is within a range of not less than D8 and not more than D5, the ultrasonic non-projection region produced upon ultrasonic projection from the element array 133B onto the glass substrate 10 can be covered by ultrasonic projected from the element array 133A. Furthermore, since the liquid supply opening 76b is tapered in the width direction, it is possible to achieve (1) an effect that usage of the lower surface cleaning liquid 75 can be reduced, and (2) an effect that output of ultrasonic is intensified by conversion thereby resulting in further improvement of the efficiency of processing operations. Furthermore, there may be a case where the liquid supply opening 76a is tapered in the width direction, but in this case, the width resultant from tapering is required to be greater than the width D2 of the glass substrate 10.

Furthermore, for instance, there may be a case where the lower cleaning liquid supply nozzle 74a is provided with three liquid supply openings so that they should correspond to the ultrasonic oscillation elements 13a, 13b, and 13c, respectively, but in this case as well, it is possible to taper the three liquid supply openings in the width direction as long as the ultrasonic non-projection regions produced upon ultrasonic projection from the element array 133B to the glass substrate 10 should be covered by ultrasonic projected from the element array 133A (that is, equivalent to the ultrasonic oscillation elements 13a, 13b, and 13c). Incidentally, needless to say, in the case where the liquid supply means is nozzle means, it is possible to taper the liquid supply opening in the glass substrate 10 transport direction.

The following description will concretely explain positions of the ultrasonic oscillation elements 13 in the foregoing distribution path. The ultrasonic oscillation elements 13 that are actuated upon supply of the lower surface cleaning liquid 75 to generate (project) ultrasonic to the lower surface cleaning liquid 75 are provided inside a lower surface cleaning liquid 75 distribution path on an upstream side to the liquid supply openings 76a and 76b respectively provided to the lower cleaning-liquid-supply nozzles 74a and 74b (that is, on a side of upstream with reference to a direction of distribution of the lower surface cleaning liquid 75). The foregoing liquid distribution may be arranged so that a portion thereof positioned right on the downstream side to the ultrasonic oscillation elements 13 extends in a direction in a range from a horizontal direction to an upward direction from the upstream side to the downstream side.

Since the distribution path runs in the above-described direction immediately on the downstream side to the ultrasonic oscillation elements 13, bubbles produced upon actuation of the ultrasonic oscillation elements 13 are discharged to the downstream side easily by the lower surface cleaning liquid 75 when the lower surface cleaning liquid 75 is supplied. Furthermore, bubbles that have been once discharged to the downstream side to the ultrasonic oscillation elements 13 do not intrude into the surroundings of the ultrasonic oscillation elements 13.

Furthermore, as shown in FIG. 13 or the like, in the distribution path described above, the ultrasonic oscillation elements 13 are more preferably provided inside the lower cleaning-liquid-supply nozzles 74 and 74b. This results in that the ultrasonic oscillation elements 13 are disposed in the vicinity of the glass substrate 10, and makes it possible to suppress ultrasonic attenuating before the lower surface cleaning liquid 75 reaches the glass substrate 10. Incidentally, the distance between the ultrasonic oscillation elements 13 and the glass substrate 10 is not particularly limited, but it is preferably in a range of 10 mm to 100 mm.

Furthermore, in the present embodiment, since the liquid supply openings 76a and 76b are provided so as to supply the lower surface cleaning liquid 75 diagonally upward or upward (i.e., to the lower surface of the glass substrate 10), intrusion of bubbles through the liquid supply openings 76a and 76b hardly occurs. Therefore, bubbles never intrude and reside in the surroundings of the ultrasonic oscillation elements 13 disposed inside the distribution path positioned on the upstream side to the cleaning liquid supply openings 76a and 76b. Accordingly, the ultrasonic oscillation elements 13 are by no means damaged or broken by heat.

The oscillation frequency of the ultrasonic oscillation elements 13, that is, the frequency of ultrasonic projected to the lower surface cleaning liquid 75 is appropriately selected depending on the purpose of cleaning and the type of the cleaning object, and is not particularly limited. In the present embodiment, a frequency of ultrasonic is preferably in a range of several hundreds of kHz to several MHz, or more preferably in a range of 0.1 MHz to 5 MHz. By projecting ultrasonic having such a frequency to a glass substrate 10, particle and soil removing ability can be further enhanced. Besides, troubles such as damaging a processing object such as the glass substrate 10 or causing changes to characteristics of circuit elements provided in the processing object can be avoided, and therefore, effective processing is ensured.

Normally, the same cleaning liquid is used for both the upper and lower surface cleaning liquids 73 and 75. Concrete examples of the upper surface cleaning liquid 73 and the lower surface cleaning liquid 75 include conventional known cleaning liquids used in ultrasonic cleaning, such as pure water, ultrapure water, hydrogen water, ozone water, a dilute hydrofluoric acid aqueous solution, and a surfactant solution. The cleaning liquid is appropriately selected from among those mentioned above and others, depending on the purpose of cleaning and the type of a cleaning object.

Timings of supply of the upper and lower surface cleaning liquids 73 and 75 to the upper and lower surfaces of the glass substrate 10, respectively, are not particularly limited. For example, taking as an example the case where the upper surface cleaning liquid 73 is supplied to the glass substrate 10 being transported, the operation may be controlled so that the upper surface cleaning liquid 73 should be supplied only when the glass substrate 10 comes to below the nozzle opening of the upper cleaning-liquid-supply nozzle 72. Such timing control enables further reduction of usage of the upper surface cleaning liquid 73. To more accurately control the timings of supply of the upper and lower surface cleaning liquids 73 and 75, a substrate position detecting sensor or the like may be additionally provided.

Incidentally, in the case where ultrasonic cleaning is carried out with respect to only the lower surface of the glass substrate 10, the glass substrate 10 is not necessarily being transported, but may be stopped. In this case, for instance, the lower cleaning-liquid-supply nozzles 74a and 74b are moved in a direction opposite to the foregoing predetermined direction, whereby it is made possible to project ultrasonic uniformly throughout an entirety of the lower surface of the glass substrate 10.

Furthermore, depending on cases, the upper and lower cleaning-liquid-supply nozzles 74a and 74b may be alternately provided in the glass substrate 10 transport direction so that supply of the upper surface cleaning liquid 73 to the upper surface of the glass substrate 10 should be followed by supply of the lower surface cleaning liquid 75 to the lower surface of the glass substrate 10, then subsequently, the upper surface cleaning liquid 73 is again supplied to the upper surface of the glass substrate 10, whereby the glass substrate 10 is cleaned.

The glass substrates 10 thus cleaned by the foregoing cleaning section are transported into the drying section as shown in FIG. 2, where they are dried by air knife drying. Subsequently, the glass substrates 10 are transported to the unloader section, where they are one by one housed in a cassette. Thus, the cleaning treatment with respect to the glass substrates 10 is finished.

According to the arrangement of the ultrasonic cleaning device in accordance with the present embodiment, the vibration of ultrasonic transmitted to the lower surface of the cleaning object is transmitted without attenuation through a solid matter such as the glass substrate 10 or a silicon wafer as a cleaning object. Therefore, the vibration transmitted to the lower surface of the cleaning object is transmitted to the upper surface side thereof without attenuation, thereby ensuring removal of not only fine particles and the like adhering to the lower surface but also those adhering to the upper surface, at the same level as that of the conventional ultrasonic cleaning devices. In it other words, it is possible to clean surfaces of a cleaning object being transported, irrespective of which direction, upward or downward, the front and back sides of the cleaning object face, respectively.

Furthermore, the necessary quantity of the lower surface cleaning liquid 75 to make the surroundings of the ultrasonic oscillation elements 13 filled with the lower surface cleaning liquid 75 (i.e., to prevent bubbles from intruding and residing in the surroundings of the ultrasonic oscillation elements 13) can be drastically reduced, resulting in that the running costs can be lowered. Additionally, a special device or the like for preventing bubbles from intruding or residing in the surroundings of the ultrasonic oscillation elements 13 need not be provided, thereby resulting in simplification of the structure of the ultrasonic cleaning device (particularly, the structure of the ultrasonic oscillation elements), and lowering the device costs.

Incidentally, as described in the description of the first embodiment, the ultrasonic oscillation element (vibrating element) in the present invention indicates an entirety of an element structure that generates ultrasonic by a vibrating action, and is composed of (1) a first conversion section (piezoelectric ceramics, etc.) that is supplied with a power source voltage directly, for converting electric vibration into mechanical vibration; and (2) a second conversion section (the foregoing vibrating plate, etc.) for converting the mechanical vibration into ultrasonic. Further, in the present invention, that "ultrasonic oscillation elements are provided inside a liquid distribution path" means that at least a part of the ultrasonic oscillation element, normally the second conversion section, is provided in the foregoing distribution path. Furthermore, damage and destruction of the ultrasonic oscillation elements indicate that adhesion between the first conversion section and the second conversion section is broken by heat, that conversion accuracy of the two conversion sections is disordered by heat, etc.

Experiments were conducted to examine advantages of the ultrasonic cleaning device in accordance with the present embodiment. A quantity of a cleaning liquid necessary for stable operations of an ultrasonic unit having a 2 mm×100 mm slit-like opening (including one ultrasonic oscillation element) in the case where the cleaning liquid is supplied in a right downward direction and a quantity of the cleaning liquid in the case where the cleaning liquid is supplied in a right upward direction were compared, as an example.

As a result, the following was found: it was necessary to supply the cleaning liquid at a rate of 10 L/min to 15 L/min in the case where the cleaning liquid was supplied in the right downward direction, whereas supply of the cleaning liquid at a rate of 0.5 L/min to 1 L/min was sufficient in the case where the cleaning liquid was supplied in the right upward direction. Therefore, it is easily presumed that with an arrangement of an ultrasonic cleaning device in accordance with the present embodiment as well, the ultrasonic oscillation elements 13 can be stably operated with supply of the cleaning liquid at a lower rate as compared with the arrangement in which the cleaning liquid is supplied in the right downward direction.

More specifically, quantities of cleaning liquids (quantities of an upper surface cleaning liquid and a lower surface cleaning liquid per a unit time, and total quantities [unit: L/min]) necessary in the case where an ultrasonic cleaning device of the foregoing ultrasonic shower type (a device of a type in which cleaning liquid subjected to ultrasonic is supplied to only an upper surface of a substrate, that is, in the right downward direction, while cleaning liquid not subjected to ultrasonic is supplied to a lower surface of the substrate; the device is referred to as "UPPER SURFACE PROCESSING DEVICE" in Table 2) is used, and in the case where an ultrasonic cleaning device in accordance with the present embodiment (referred to as "LOWER SURFACE PROCESSING DEVICE" in Table 2). Since respective times necessary for the foregoing two devices to carry out cleaning operations are substantially equal to each other, it follows that the upper and lower surfaces are cleaned with the cleaning liquid of about ⅓ in quantity as compared with that in the upper surface processing device, irrespective of the substrate size.

Incidentally, collecting means for collecting cleaning liquid having been supplied to the substrate (equivalent to the upper surface cleaning liquid 73 and the lower surface cleaning liquid 75 shown in FIG. 14), and filtering means that filters collected cleaning liquid may be further provided, thereby ensuring recycle and re-use of the cleaning liquid, and further, resulting in reduction of usage of the cleaning liquid.

The foregoing arrangement is applicable in a process in which the cleanness of one of surfaces of a substrate does not matter much, for instance. More specifically, a substrate may be transported in a state in which a surface thereof necessitating higher cleanness faces upward as the upper surface, and after the cleaning liquid supplied to the substrate is collected and filtered, it is re-used as cleaning liquid supplied to the lower surface.

Incidentally, Table 2 below also shows an approximate value of a quantity of leaning liquid necessary in the case where a cleaning operation is carried out by means of the ultrasonic cleaning device in accordance with the present embodiment by recycling the cleaning liquid (RECYCLE TYPE) (usage of cleaning liquid per unit time (a quantity of new liquid used as the upper surface cleaning liquid) [unit: L/min]).

TABLE 2

| SUB-STRATE SIZE (mm) | LOWER SURFACE PROCESSING DEVICE | | | | UPPER SURFACE PROCESSING DEVICE |
|---|---|---|---|---|---|
| | UPPER SUR-FACE | LOWER SUR-FACE | TOTAL | RECYCLE TYPE | |
| 300 × 400 | 4 | 6 | 10 | 4 | 30 |
| 360 × 460 | 5 | 8 | 13 | 5 | 40 |
| 550 × 650 | 9 | 12 | 21 | 9 | 60 |

Incidentally, in the foregoing embodiment, for instance, it is possible to directly project ultrasonic to the upper and lower surfaces of the glass substrate 10 by providing ultrasonic oscillation elements 13 in the upper cleaning-liquid-supply nozzle 72. Furthermore, the present embodiment is herein explained by taking as an example an ultrasonic cleaning operation with respect to a glass substrate 10 having a width greater than the width of the ultrasonic oscillation element 13, but the present invention is not particularly limited to this. For instance, the present invention is applicable when a plurality of glass substrates 10 each having a width smaller than the width of the ultrasonic oscillation element 13 are juxtaposed in the width direction and a processing operation is applied thereto in parallel.

As described above, the arrangement of the ultrasonic processing device in accordance with the present embodiment is applicable to a cleaning process for removing foreign substances such as particles, soils, chemical liquid, etc. adhering to the glass substrate 10, in processes for fabrication of electronic parts of flat displays such as a liquid crystal display element, a PDP (plasma display panel), and an EL (electro-luminescent) panel, sensor elements of plane- or line-scanning types such as an image sensor, and semiconductors. The foregoing arrangement enables fabrication of electronic parts with high quality and high reliability. Further, by using resist-stripping liquid as liquid or processing liquid in the place of the upper and lower surface cleaning liquids 73 and 75, it is possible to apply the foregoing arrangement to a resist-stripping process.

[Fourth Embodiment]

Figure 19:
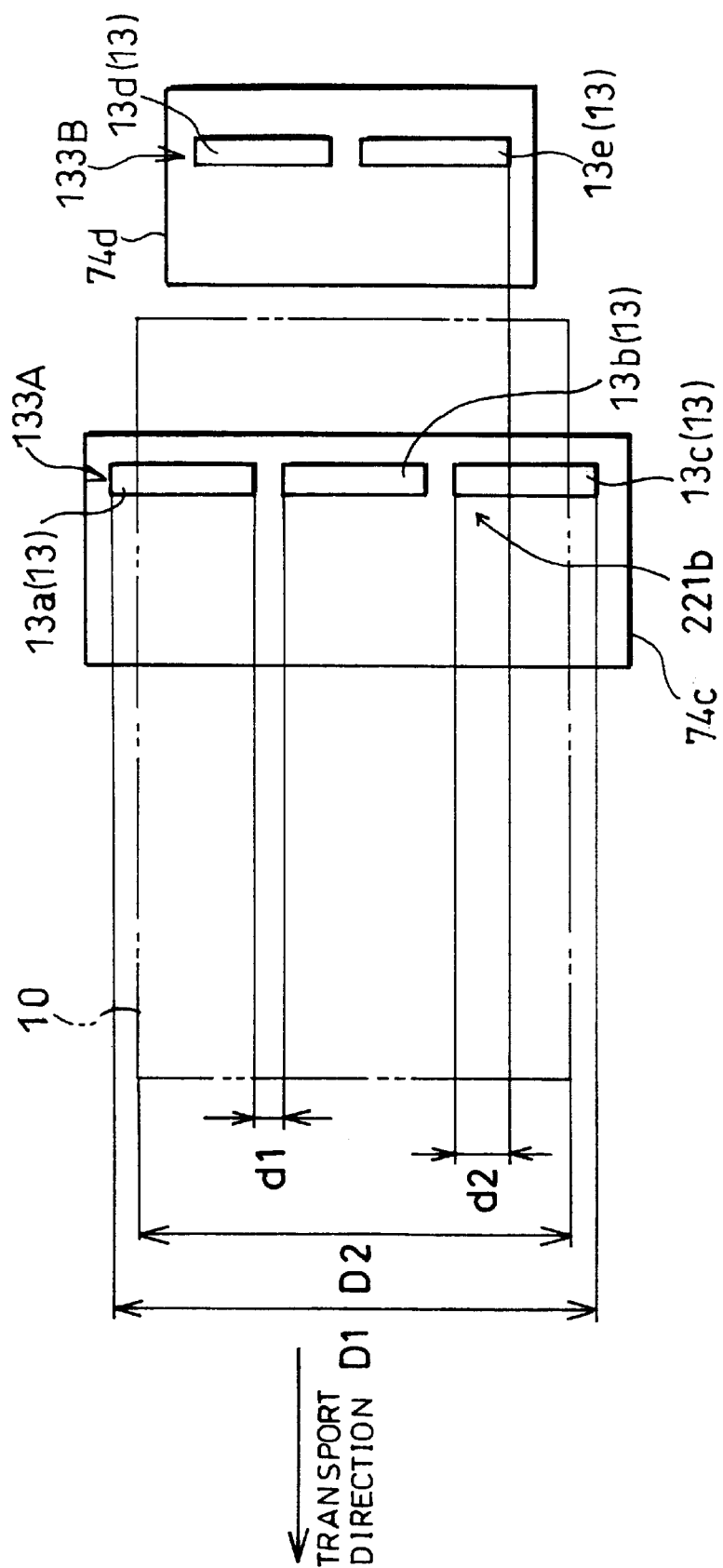
FIG. 19 is an explanatory view illustrating position relationship between the ultrasonic oscillation elements arranged in the ultrasonic processing device shown in FIG. 19 and a glass substrate from a vertical direction.

The following description will explain still another embodiment of the present invention, while referring to FIGS. 18 and 19. However, the present invention is not particularly limited to this. Note that the members having the same structure and function as those in the third embodiment will be designated by the same reference numerals and their description will be omitted.

An ultrasonic processing device in accordance with the present embodiment is applied to fabrication of liquid crystal display (LCD) devices, or more specifically, to a cleaning process for cleaning glass substrates used in such LCD devices. In other words, the ultrasonic processing device in the present embodiment is an ultrasonic cleaning device, and it is used in an ultrasonic cleaning operation for cleaning a glass substrate as a processing object, or specifically, a cleaning object. The following description will explain the present embodiment, focusing on differences from the third embodiment.

The ultrasonic cleaning device is, more concretely, arranged so that the lower cleaning-liquid-supply nozzles 74a and 74b are provided above the glass substrate 10, to supply the lower surface cleaning liquid 75 having been subjected to ultrasonic to the upper surface of the glass substrate 10 (see FIG. 14). Note that the above-described lower cleaning-liquid-supply nozzles 74a and 74b are herein referred to as cleaning liquid supply nozzles (nozzle means) 74c and 74d, and the above-described lower surface cleaning liquid 75 is herein referred to as cleaning liquid (liquid, processing liquid) 75a, for conveniences' sake, though indicating the same matters, respectively.

In the foregoing arrangement, the cleaning liquid supply nozzles 74c and 74d are provided in parallel with respect to the upper surface of the glass substrate 10 as shown in FIG. 18, and the cleaning liquid supply nozzles 74c and 74d are provided so as to have substantially equal height to each other from the upper surface of the glass substrate 10.

In the present embodiment, a whole arrangement of the ultrasonic oscillation elements 13 provided inside the cleaning liquid supply nozzles 74c and 74d is obtained by rotating each ultrasonic oscillation element 13 through 90° in the same direction around a central axis extending in the width direction of each ultrasonic oscillation element 13 in the whole arrangement of the ultrasonic oscillation elements 13 of the third embodiment.

Therefore, the ultrasonic oscillation elements 13 are arranged so as to satisfy the requirements of the whole arrangements (A) and (B) explained in the description of the third embodiment (see FIG. 19). More specifically, the ultrasonic oscillation elements 13 are arranged so that a projection region (equivalent to a projection region A set forth in claims, not shown in the figures) obtained by projecting all the ultrasonic oscillation elements 13 onto a plane perpendicular to the glass substrate 10 transport direction should be formed in one continuous shape, as well as should have a width D1 greater than a width of a projection region (equivalent to a projection region B set forth in claims, not shown in the figures) obtained by projecting one ultrasonic oscillation element 13 appropriately selected from among the ultrasonic oscillation elements 13a through 13e onto the plane perpendicular to the transport direction.

Additionally, the foregoing five ultrasonic oscillation elements 13 are, as shown in FIG. 19, are formed so that the width D1 of the projection region should be equal to or more than the width D2 (400 mm in the present embodiment) of the ultrasonic processing target region of the glass substrate 10 (an entirety of an upper surface of the glass substrate 10 in the present embodiment). Furthermore, the ultrasonic oscillation elements 13a through 13c provided in the element array 133A and the ultrasonic oscillation elements 13d and 13e provided in the element array 133B are arranged in a stagger form, forming superimposition regions 221b (only one is shown).

The above-described whole arrangement of the ultrasonic oscillation elements 13 ensures that ultrasonic non-projection regions produced upon projection of ultrasonic from the element array 133B to the glass substrate can be covered by ultrasonic projection from the element array 133A. Therefore, even in the case where a width of a region requiring ultrasonic processing in the glass substrate 10 is greater than the dimension of the ultrasonic oscillation element 13, ultrasonic can be more uniformly projected on an entirety of the upper surface of the glass substrate 10. Consequently, an entirety of the upper surface of the glass substrate 10 can be more uniformly cleaned, thereby ensuring further enhancement of the cleaning effect as compared with the conventional cases, while allowing the cleaning time to be shortened. This is identical to the third embodiment in that ultrasonic oscillation elements that are easy to get, such as standard products, are applicable.

Note that the type of the ultrasonic oscillation elements 13 used, the relationship between the ultrasonic oscillation elements 13 and the liquid supply openings 76a and 76b, the width d1 between the ultrasonic oscillation elements 13, the width d2 of the superimposition regions 221b, etc. herein are identical to those in the third embodiment described above, and their description will be omitted.

In the present embodiment, the ultrasonic oscillation elements 13 are positioned in a cleaning liquid 75a distribution path on the upstream side to the liquid supply openings 76a and 76b provided in the cleaning liquid supply nozzles 74c and 74d (more concretely, inside the cleaning liquid supply nozzles 74c and 74d), and the foregoing distribution path is arranged so that a portion provided right on the downstream side to the ultrasonic oscillation elements 13 should extend in the horizontal direction from the upstream side to the downstream side. Therefore, when the cleaning liquid 75a is supplied, bubbles produced upon actuation of the ultrasonic oscillation element 13 are discharged to the downstream side easily by the cleaning liquid 75a. Furthermore, the bubbles once discharged to the downstream side to the ultrasonic oscillation elements 13 by no means intrude in the surroundings of the ultrasonic oscillation elements 13.

Therefore, the foregoing arrangement makes it possible to prevent bubbles from residing in the vicinity (surfaces) of the ultrasonic oscillation elements 13. Furthermore, since the ultrasonic oscillation elements 13 are provided in the cleaning liquid supply nozzles 74c and 74d as described above, the ultrasonic projected to the cleaning liquid 75a is transmitted to the upper surface of the glass substrate 10 without attenuation.

Incidentally, in the present embodiment, unlike in the third embodiment, the cleaning liquid supply nozzles 74c and 74d are provided in parallel to the upper surface of the glass substrate 10. Therefore, to effectively remove bubbles from the surroundings of the ultrasonic oscillation elements 13, the present embodiment is more preferably arranged by (1) adjusting angles at which the cleaning liquid supply nozzles 74c and 74d are provided, (2) providing a spare path for removing bubbles from inside the cleaning liquid supply nozzles 74c and 74d, etc.

Furthermore, cleaning liquid such as pure water may be supplied to the lower surface of the glass substrate 10 from below the glass substrate 10 so as to execute ultrasonic cleaning with respect to both the upper and lower surface of the glass substrate 10. In this case, ultrasonic may be projected to the cleaning liquid supplied to the lower surface.

[Fifth Embodiment]

Figure 20:
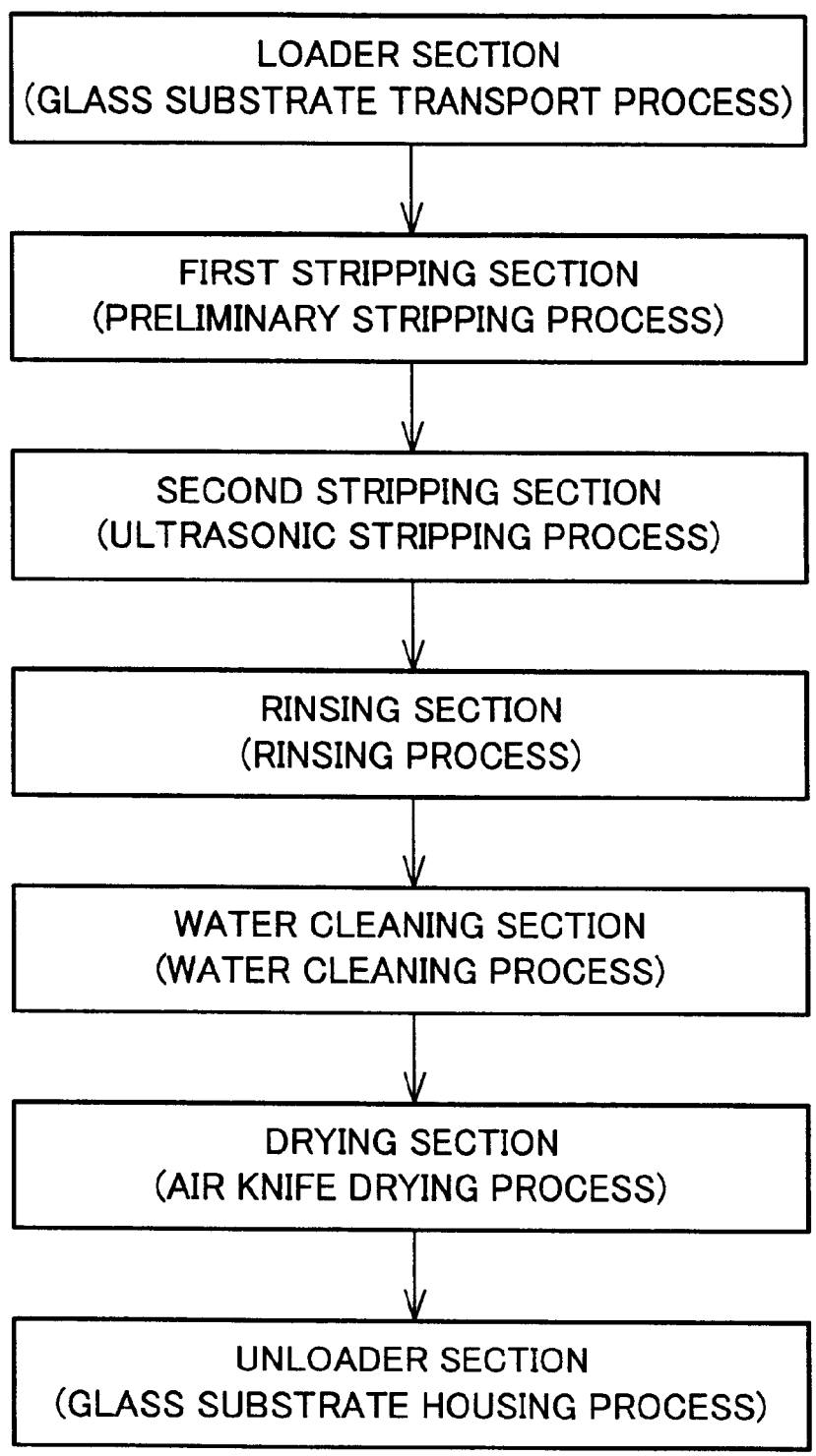
FIG. 20 is a flowchart illustrating a resist-stripping process applied to a glass substrate in an LCD element in which an ultrasonic processing device in accordance with still another embodiment of the present invention is employed.
Figure 21:
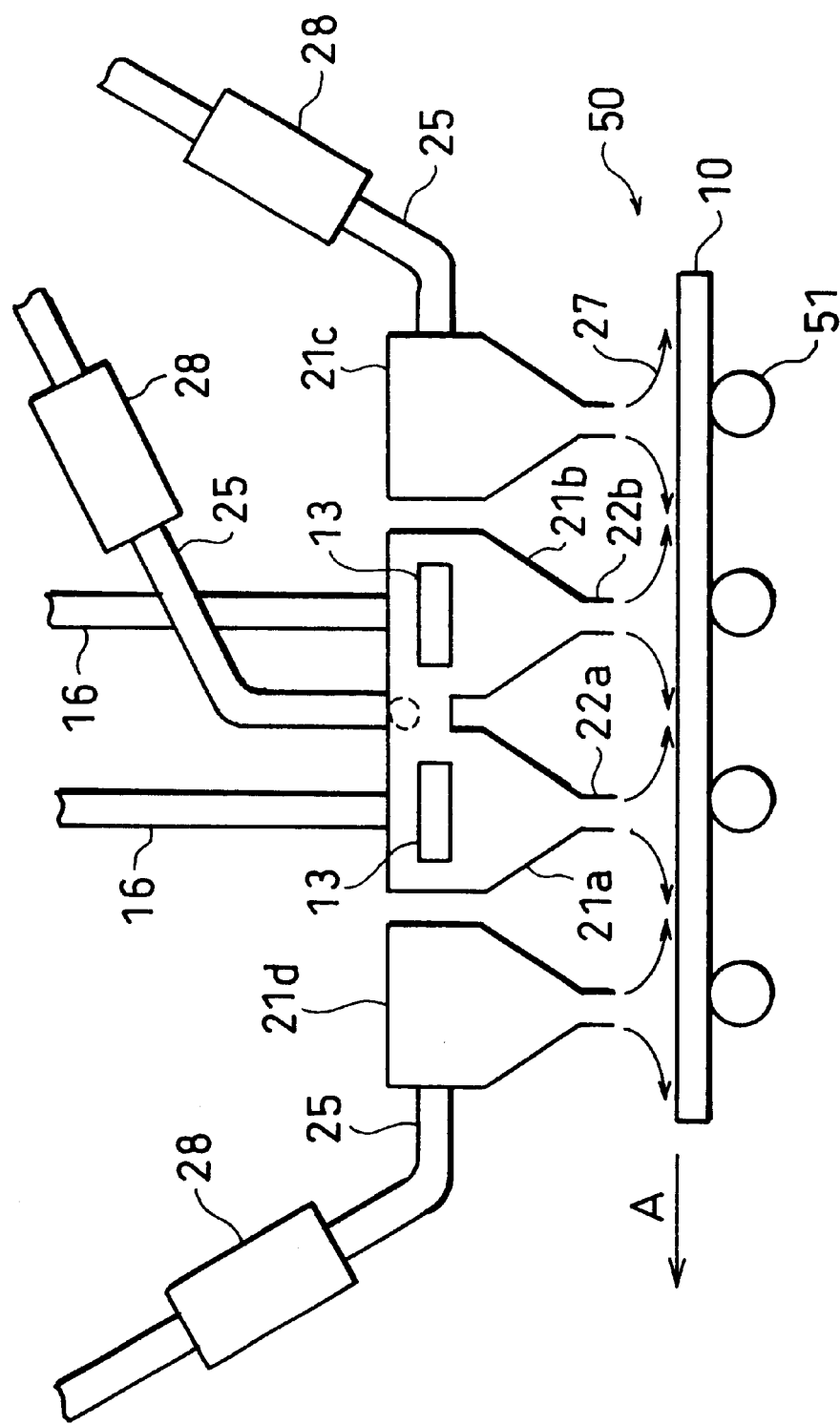
FIG. 21 is a cross-sectional view schematically illustrating an arrangement of an ultrasonic processing device (resist-stripping device) in accordance with still another embodiment of the present invention that is applied to the resist-stripping process shown in FIG. 20.
Figure 22:
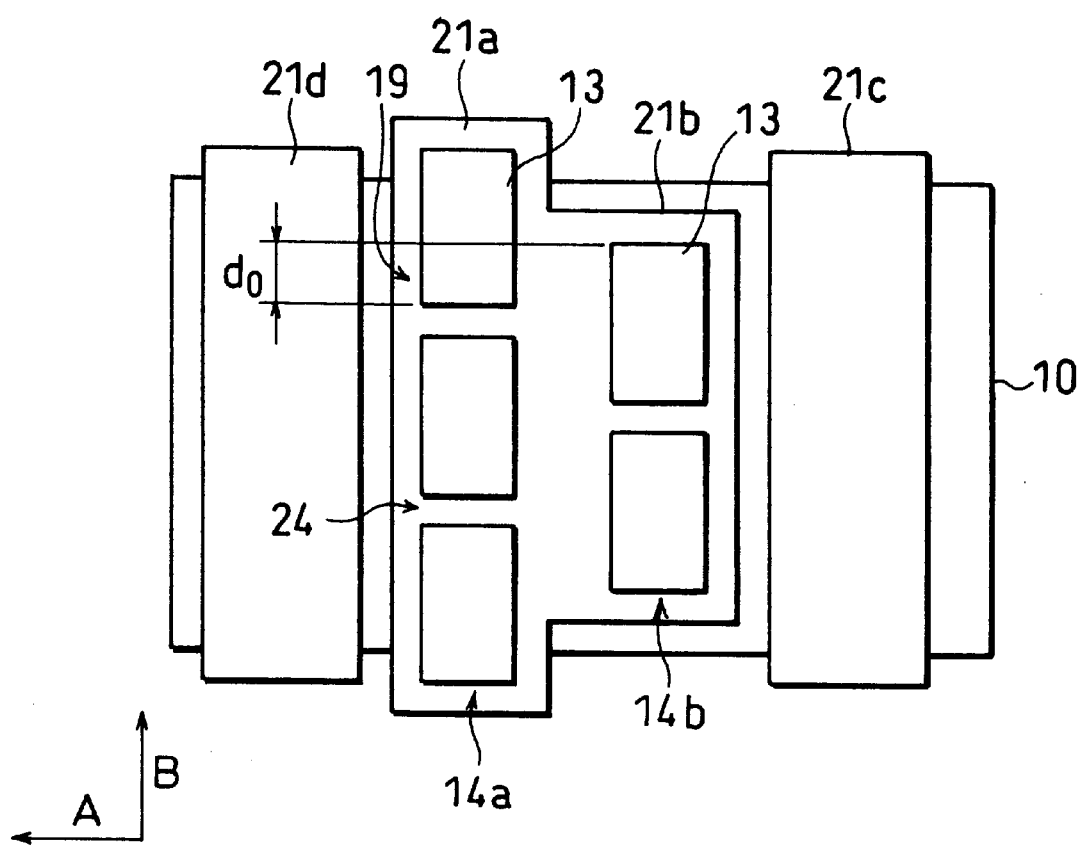
FIG. 22 is an explanatory view illustrating position relationship between ultrasonic oscillation elements arranged in the ultrasonic processing device shown in FIG. 21 and a glass substrate.

The following description will explain still another embodiment of the present invention while referring to FIGS. 20 through 22. Incidentally, the present invention is not particularly limited to this. Note that the members having the same structure and function as those in the first embodiment will be designated by the same reference numerals and their description will be omitted.

The present embodiment of the present invention will be explained by taking as an example a resist-stripping device for stripping resist formed on a surface of a processing object while projecting ultrasonic thereto.

A resist-stripping device in accordance with the present invention is for use in an LCD fabrication process, or more concretely, in a resist-stripping process executed after a photolithography process for forming predetermined patterns on a glass substrate for used in the LCD device. Therefore, laminar resist is formed on a surface of the glass substrate as a processing object of the foregoing resist-stripping device.

In the following description, a surface of the glass substrate on which resist is formed is referred to as resist-processed surface. Furthermore, unless otherwise described, the glass substrate on which resist is formed is simply referred to as glass substrate.

The resist-stripping process with respect to the glass substrate taken for describing the present embodiment is executed by units including a loader section, a conveyer bath (not shown), a first stripping section and a second stripping section in the stated order from an upstream side in a direction of transport of the glass substrate, as shown in FIG. 20, and more preferably further include a rinsing section, a water cleaning section, a drying section, and an unloader section, like in the first embodiment.

Incidentally, in the foregoing resist-stripping process, the glass substrates are transported through each unit by means of transport rollers, but glass substrate transport means is not particularly limited to transport rollers, but may be conveyer means. Furthermore, the foregoing first stripping section and the second stripping section are referred to as the stripping section.

In the loader section, from a transport-use cassette that is capable of housing a plurality of glass substrates (for instance, 20 substrates), the glass substrates are taken out one by one successively, and are horizontally sent out through the conveyer bath to the stripping section at uniform intervals (GLASS SUBSTRATE TRANSPORT PROCESS). More specifically, each glass substrate sent out of the loader section is transported horizontally in a state a surface (back surface) opposite to the resist-processed surface is supported in contact with the transport rollers, with the resist-processed surface facing upward, and is sent into the stripping section (first stripping section). Incidentally, the transport velocity of the glass substrates is, for instance, 900 mm/min., which is common to all the units involved in the resist-stripping process.

The resist-stripping operation with respect to the glass substrates transported to the stripping section is concretely performed as follows. First of all, the first stripping section functions as a preliminary processing section for the second stripping section that executes resist stripping while projecting ultrasonic, and is arranged so as to bring the glass substrate into contact with resist-stripping liquid without ultrasonic projection (preliminary stripping process). More concretely, it sprays heated stripping liquid in a shower form over the glass substrate from above the glass substrate.

Subsequently, in the second stripping section next thereto on the transport direction downstream side, a resist-stripping device (ultrasonic processing device) in accordance with the present invention is adapted, so as to strip resist while projecting ultrasonic to the glass substrate (ultrasonic stripping process).

The foregoing second stripping section is a single-substrate resist-stripping device as shown in FIG. 21, and it is arranged in a manner similar to that of the ultrasonic cleaning device of the first embodiment described above. More specifically, the second stripping section includes a transport path 50 equipped with a plurality of transport rollers 51 for transporting a glass substrate 10 by keeping the glass substrate 10 held on the transport rollers 51, and a stripping-liquid-supply nozzles (nozzle means) 21a and 21b provided above the glass substrate 10 (above the transport path 50).

The stripping-liquid-supply nozzles 21a and 21b have slit-like nozzle openings 22a and 22b, like the cleaning liquid supply nozzles 11a and 11b in accordance with the first embodiment, and are equipped with ultrasonic oscillation elements 13 that generate ultrasonic, inside the openings thereof.

These stripping-liquid-supply nozzles 21a and 21b, different from the cleaning-liquid-supply nozzles 11a and 11b in the first embodiment, are integrally provided in a state of containing the element arrays 14a and 14b (described later, not shown in FIG. 21). More specifically, resist-stripping liquid is supplied from one stripping-liquid-supply pipe 25 to the stripping-liquid-supply nozzles 21a and 21b that are integrated to each other, then the liquid is divided so as to be sprayed as shower 27 by the two nozzle openings 22a and 22b. Needless to say, however, the stripping-liquid-supply nozzles 21a and 21b may be separately provided, like the cleaning-liquid-supply-nozzles 11a and 11b.

Furthermore, in the middle of the stripping-liquid-supply pipe 25, a heating unit 28 is provided for promoting reaction by heating the resist-stripping liquid. Power supply cords 16 for supply electric power to the ultrasonic oscillation elements 13 are also connected to the stripping-liquid-supply nozzles 21a and 21b.

Furthermore, viewing from the stripping-liquid-supply nozzles 21a and 21b, a preliminary nozzle 21c and a finishing nozzle 21d are provided on the upstream side and on the downstream side in the glass substrate 10 transport direction A, respectively. Besides, in the middle of stripping-liquid-supply pipes 25 that supply the resist-stripping liquid to the preliminary nozzle 21c and the finishing nozzle 21d, heating units 28 are preferably provided, respectively. Incidentally, positions at which the heating units 28 are disposed are not particularly limited as long as the resist-stripping liquid can be sufficiently heated and emitted as the shower 27.

The foregoing stripping-liquid supply nozzles 21a and 21b supply resist-stripping liquid having been subjected to ultrasonic, to a resist-processed surface of the glass substrate 10 (upper surface in FIG. 21). The foregoing preliminary nozzle 21c and finishing nozzle 21d supply resist-stripping liquid not subjected to ultrasonic. Incidentally, the numbers of the stripping-liquid-supply nozzles 21a and 21b, preliminary nozzle 21c, and finishing nozzle 21d in the second stripping section are not particularly limited.

Resist-stripping liquid, preferably heated, is supplied from the stripping-liquid-supply pipe 25 to the stripping liquid supply nozzles 21a and 21b, where ultrasonic of a predetermined frequency is projected to the resist-stripping liquid from the ultrasonic oscillation elements 13. Then, the resist-stripping liquid having been subjected to ultrasonic is jetted in a line-like shower form from the nozzle openings 22a and 22b to the upper surface of the glass substrate 10 that is being horizontally transported along the transport path 50.

More specifically, in the second stripping section, the shower 27 of the resist-stripping liquid to which ultrasonic has been projected is jetted from above to the glass substrate, so that resist formed on the surface of the glass substrate 10 should be stripped.

Incidentally, in the case where the stripping-liquid supply nozzles 21a and 21b are provided over a substantially entire resist-processed surface of the glass substrate 10, the glass substrate 10 may be in a state of being slightly vibrated upon supply of the resist-stripping liquid.

The foregoing ultrasonic oscillation elements 13 may be provided anywhere as long as they are provided inside a resist-stripping liquid distribution path, on the upstream side in the resist-stripping liquid (processing liquid) flowing direction, with respect to the nozzle openings 22a and 22b. Like in the first embodiment, however, they are preferably provided inside the striping-liquid-supply nozzles 21a and 21b, as shown in FIG. 21. Furthermore, like in the first embodiment, they are preferably provided at positions as close as possible to the processing object (glass substrate 10), so that attenuation of ultrasonic should be suppressed.

Incidentally, the resist-stripping liquid distribution path is, like the cleaning liquid distribution path in the first embodiment, a path from a stripping liquid supply source including a stripping liquid supply pump (not shown), the stripping liquid supply pipes 25, and the stripping liquid supply nozzles 22a and 22b to a stripping liquid supply opening that is the nozzle openings 22a and 22b. Further, the stripping liquid supply source, including the stripping liquid supply pump and the stripping liquid supply pipes 25 constitutes processing liquid supply means (stripping liquid supply means).

The shapes, sizes, direction of opening, etc. of the nozzle openings 22a and 22b are identical to those of the nozzle openings 12a and 12b in the first embodiment, and their description will be omitted.

Incidentally, in the present embodiment also, W-357LS-380 available from Honda Electronics Co., Ltd. in 100 mm×15 mm size is used as the ultrasonic oscillation element 13, and a glass substrate in 360 mm×465 mm size is used as the glass substrate 10, that is, the processing object, as in the first embodiment. In other words, in the present embodiment as well, the size of the processing object is larger than the size of the ultrasonic oscillation element 13.

Therefore, in the resist-stripping device in accordance with the present embodiment also, as shown in FIG. 22, the ultrasonic oscillation elements 13 are provided so as to planarly extend in the transport direction A and in the width direction B, and that a projected figure obtained when the ultrasonic oscillation elements 13 are projected onto a plane on the transport direction A side forms a single belt-like region having a width exceeding a predetermined width of the ultrasonic processing target region.

More specifically, a plurality of ultrasonic oscillation elements 13 compose element arrays 14a and 14b, and these element arrays 14a and 14b are adjacently provided extending in the width direction B, and further, the ultrasonic oscillation elements 13 composing the element array 14a and the element array 14b are arranged in the stagger form so as to have superimposition regions 19 each having a width $d_0$.

This arrangement ensures that ultrasonic non-projection regions corresponding to the insulating regions 24 in the element array 14a can be covered by ultrasonic projection from the ultrasonic oscillation elements 13 of the element array 14b. Therefore, it is possible to non-defectively project ultrasonic throughout the entire width-direction-B dimension of the processing object (glass substrate 10), resulting in that the resist-stripping operation can be effectively carried out.

Timings at which the resist-stripping liquid is supplied from the foregoing stripping-liquid-supply nozzles 21a and 21b are not particularly limited, but in the resist-stripping operation, but the resist-stripping operation is not an operation of simply jetting the processing liquid to a processing object like in the cleaning operation, but is preferably arranged so that the resist-processing liquid should be continuously emitted since before the glass substrate 10 is transported to the stripping-liquid-supply nozzles 21a and 21b, since reaction of the emitted resist-stripping liquid with photoresist has to be taken into consideration.

In the present embodiment, for instance, the resist-stripping liquid is continuously supplied from the preliminary nozzle 21c, the stripping-liquid-supply nozzles 21a and 21b, and the finishing nozzle 21d, while the glass substrate 10 is being transported to the second stripping section. Consequently, a layer of resist-stripping liquid is formed over an entirety of the resist-processed surface of the glass substrate 10.

Furthermore, at the stripping-liquid-supply nozzles 21a and 21b, ultrasonic is applied to the resist-stripping liquid therein from the foregoing element arrays 14a and 14b, therefore, the resist-stripping liquid shower 27 to which ultrasonic have been projected is jetted to the resist-processed surface of the glass substrate 10, that is, the upper surface thereof. This results in more uniform projection of ultrasonic over the width-direction dimension of the glass substrate 10, thereby realizing transmission of ultrasonic vibration throughout the resist-processed surface of the glass substrate 10.

Consequently, reaction of the resist on the glass substrate (not shown) with the resist-stripping liquid is further uniformly promoted in the width direction B. This allows stripping of the resist from the resist-processed surface, and dissolution of the resist into the resist-stripping liquid to be uniformly promoted in the width direction B of the glass substrate 10. As a result, time required for resist stripping is drastically shortened, as compared with the conventional resist-stripping devices.

Therefore, this allows a length of the resist-stripping device (more specifically, the second stripping section) to be shortened, and a footprint of the device to be made smaller. In addition, this also allows the resist-stripping operation to be swiftly carried out, thereby ensuring that an effect of making a space for storing the resist-stripping liquid smaller and an effect of reducing risks associated with the storage of the resist-stripping liquid can be fulfilled.

Incidentally, a concrete arrangement of the ultrasonic oscillation elements 13 and a range of a width $d_0$ of the superimposition region 19 are identical to those in the first embodiment, and hence their description will be omitted.

The oscillation frequency of the ultrasonic oscillation elements 13 (the frequency of ultrasonic projected to the resist-stripping liquid) is not particularly limited, but like in the first embodiment, the frequency is preferably in a range of 0.1 MHz to 5 MHz, or more preferably in a range of 0.3 MHz to 1 MHz, and further preferably at 0.4 MHz. In the case where the frequency is in the foregoing range, time spent in resist stripping can be drastically shortened, without damaging the glass substrate 10.

Furthermore, as shown in FIG. 21, in the case where the resist-stripping liquid is heated by the heating unit 28 beforehand, the resist adhering to the glass substrate 10 is softened, becoming easy to strip. Therefore, the time spent in resist stripping is further shortened, thereby enabling decrease of the usage of the resist-stripping liquid. A temperature to which the resist-stripping liquid is heated by the heating unit 28 is not particularly limited, but it is preferably in a range of 50° C. to 90° C., or more preferably in a range of 70° C. to 80° C.

The types of the resist-stripping liquid is not particularly limited, but the resist-stripping liquid may be appropriately selected depending on the type of the resist (photoresist) used. In the present embodiment, ELM-R10 (trade name) available from Mitsubishi Gas Chemical Co., Inc. is used.

The glass substrate 10 thus having been processed as described above in the second stripping section is transported to the rising section as shown in FIG. 20 (RINSING PROCESS). In the rinsing section, the resist-stripping liquid remaining on the surface of the glass substrate is replaced with rising liquid such as DMSO (dimethyl sulfoxide) liquid or the like. This prevents the resist-processing liquid and photoresist from being brought into the water cleaning section that is on the downstream side to the rinsing section.

If the resist-stripping liquid and photoresist are brought into the water cleaning section, (1) it causes pure water reservoired in the water cleaning section to exhibit alkalinity, thereby possibly causing erosion of wires provided on the glass substrate 10 (particularly, those made of aluminum-based materials), as well as (2) it causes draining system to become overloaded. Therefore, to prevent problems including those described above, it is desirable to provide the foregoing rising section.

Incidentally, in the present embodiment, since the resist-stripping liquid is continuously supplied through the stripping-liquid-supply nozzles 21a and 21b, all of photoresist stripped and dissolved is washed off from the resist-processed surface when the glass substrate 10 is transported to the rinsing section. Therefore, the rinsing section is not particularly needed, but in order to surely avoid the foregoing problems, the rinsing section is preferably provided.

The glass substrate 10 having passed through the rinsing section is transported to the foregoing water cleaning section provided on the downstream side. In the water cleaning section, first, by showering the glass substrate 10 from above and below, the rinsing liquid is removed from the glass substrate 10. Subsequently, by megasonic shower, fine particles such as organic substances adhering to the glass substrate 10 are removed (WATER CLEANING PROCESS).

The glass substrate 10 thus cleaned in the water cleaning section is transported to the drying section. In the drying section, liquid is removed from both the surface of the glass substrate 10 and the surfaces are dried by air knife (AIR KNIFE DRYING PROCESS). Subsequently, the glass substrate 10 thus dried is housed in a cassette in an unloader section (GLASS SUBSTRATE HOUSING PROCESS). With this, a series of resist-stripping steps with respect to the glass substrate 10 is finished. Incidentally, in a fabrication process for fabricating a TFT substrate used in an active-matrix-type LCD element, such a resist-stripping operation is carried out repeatedly, 5 to 7 times.

Thus, in the resist-stripping device in accordance with the present embodiment, a plurality of element arrays each being composed of ultrasonic oscillation elements linearly arrayed in a direction substantially orthogonal to the glass substrate transport direction are juxtaposed in the transport direction, and projected figures obtained when the ultrasonic oscillation elements are projected onto a plane on the transport direction side include superimposition regions in which projected figures of the ultrasonic oscillation elements composing one element array are partly superimposed on projected figures of the ultrasonic oscillation elements composing the other element array.

Therefore, since a plurality of element arrays are provided, insulating regions in one element array that do not contribute ultrasonic projection are covered by the other element array. Consequently, ultrasonic projection to the glass substrate is further uniform as compared with the conventional case. This enables to ensure a sufficient cleaning effect while to reduce usage of cleaning liquid, thereby realizing sure and efficient cleaning as well as a lower running cost.

Furthermore, like in the first embodiment described above, the present invention is suitably applicable to a fabrication method of electronic parts that includes a resist-stripping process. To state differently, the electronic parts fabrication method in accordance with the present invention includes a resist-stripping process in which, the processing object that is moved in a predetermined direction, while supplied with resist-stripping liquid, is subjected to ultrasonic that is projected from a plurality of ultrasonic oscillation elements so that respective regions to which ultrasonic is projected (ultrasonic-projected regions) by the ultrasonic oscillation elements partly overlap each other, thereby to completely cover an ultrasonic processing target region with a predetermined width.

This allows the present invention to be suitably applied to, apart from the electronic parts fabrication method using the glass substrate as described above, an electronic parts fabrication method with a resist-stripping process, particularly an electronic parts fabrication method in which an ultrasonic processing target region to be subjected to ultrasonic is large.

[Sixth Embodiment]

Figure 23:
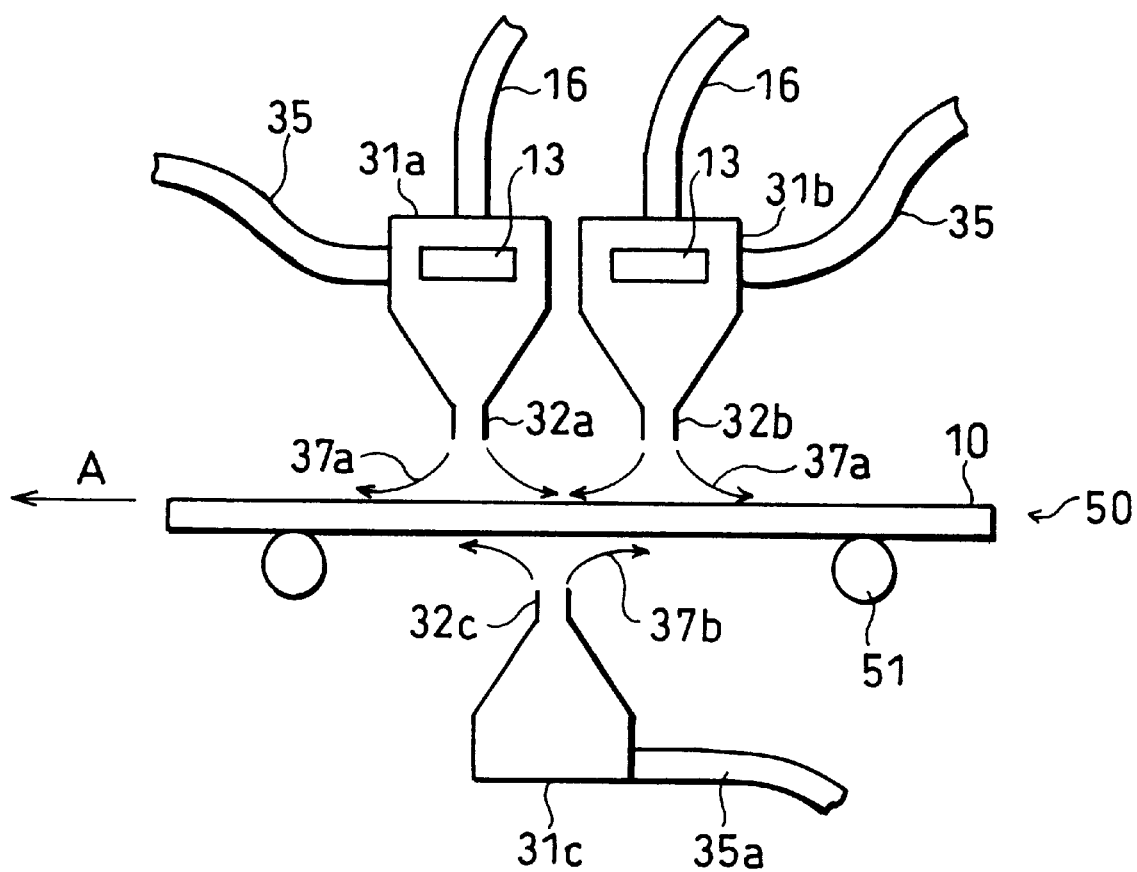
FIG. 23 is a cross-sectional view schematically illustrating an arrangement of an ultrasonic processing device in accordance with still another embodiment of the present invention.
Figure 24:
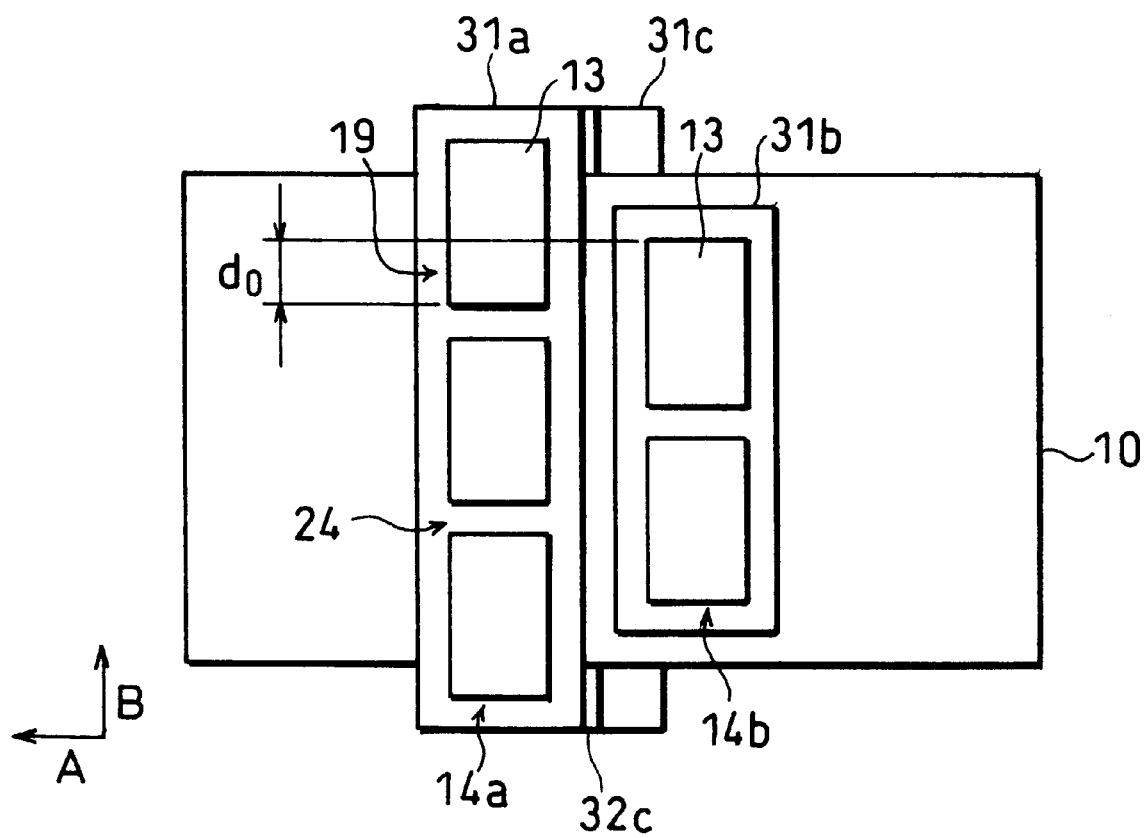
FIG. 24 is an explanatory view illustrating position relationship between ultrasonic oscillation elements arranged in the ultrasonic processing device shown in FIG. 23 and a glass substrate.

The following will describe yet another embodiment of the present invention based on FIG. 23 and FIG. 24. Note that, the present invention is not to be limited by the following. Further, for convenience of explanation, the elements having the same functions as those of the elements used in the First and Fifth embodiments are given the same reference numerals and explanations thereof are omitted here.

The present embodiment describes the resist-stripping device as in the Fifth Embodiment. As such, the resist-stripping device in accordance with the present embodiment is to be adopted in the second stripping section (see FIG. 20) of the Fifth Embodiment.

As shown in FIG. 23, the resist-stripping device in accordance with the present embodiment includes a plurality of transport rollers 51, a transport path 50 for transporting a glass substrate 10 on the transport rollers 51, upper stripping-liquid-supply nozzles 31a and 31b which are disposed above the glass substrate 10 (above transport path 50), and a lower stripping-liquid-supply nozzle 31c which is provided below the glass substrate 10 (below transport path 50).

The upper stripping-liquid-supply nozzles 31a and 31b are for supplying a resist-stripping liquid as the first stripping liquid, and include slit-like nozzle openings 32a and 32b as in the Fifth Embodiment, and a plurality of ultrasonic oscillation elements 13 for oscillating an ultrasonic wave therein. Further, to the upper stripping-liquid supply nozzles 31a and 31b are connected a stripping-liquid-supply tube 35 for supplying the resist-stripping liquid, and a power supply code 16 for supplying power voltage to the ultrasonic oscillation elements 13.

As shown in FIG. 24, the ultrasonic oscillation elements 13, as in the First and Fifth Embodiments, are disposed in an array of element arrays 14a and 14b in the upper stripping-liquid-supply nozzles 31a and 31b, and in a staggered fashion so that the ultrasonic oscillation elements 13 as a whole have a superimposition region 19 of width $d_0$.

On the other hand, the lower stripping-liquid supply nozzle 31c is for supplying a second stripping-liquid to the rear surface of the glass substrate 10 (other side of the upper surface). The basic structure of the lower stripping-liquidsupply nozzle 31c is the same as that of the upper stripping-liquid-supply nozzles 31a and 31b in that a second stripping-liquid-supply tube 35a for supplying the second-stripping liquid is connected thereto and a slit-like nozzle opening 32c is provided, but no ultrasonic oscillation element 13 is provided therein.

The upper stripping-liquid-supply nozzles 31a and 31b project an ultrasonic wave of a predetermined frequency from the ultrasonic oscillation elements 13 (element arrays 14a and 14b) with respect to the first stripping liquid (resist-stripping liquid). The resist-stripping liquid, having being projected with the ultrasonic wave, is sprayed as a shower 37a of a line form from the nozzle openings 32a and 32b with respect to the upper surface of the glass substrate 10 (resist-processed surface) being transported horizontally on the transport path 50. Meanwhile, from the nozzle opening 32c of the lower stripping-liquid-supply nozzle 31c is sprayed the second stripping liquid as a shower 37b of a line form with respect to the rear surface of the glass substrate 10 (other side of resist-processed surface).

In the present embodiment, the reason the second stripping liquid is supplied to the rear surface of the glass substrate 10 is to prevent the problem of a resist component which was stripped and dissolved on the upper surface of the glass substrate 10 from running onto to the rear surface or end portion of the glass substrate 10 together with the first stripping liquid and firmly adhering thereto. Further, supply of the first stripping liquid only from the side of the upper surface lowers the temperature of the first stripping liquid on the upper surface of the glass substrate 10, which lowers the resist stripping reaction rate. For this reason, the second stripping liquid is supplied to the rear surface so as to prevent decrease in resist stripping reaction rate.

When the resist component adheres on the rear surface or end portion of the glass substrate 10 as above, it becomes difficult to perform processes of subsequent steps after the resist stripping step. Further, in the case where, for example, there is a film deposition step by a vacuum deposition device after the resist stripping step, inside the vacuum deposition device is contaminated by the resist component, which prevents the film deposition step from being performed sufficiently. Therefore, adhesion of the resist component is avoided by cleaning the rear surface or end portion with the second stripping liquid beforehand.

The composition of the second stripping liquid is not particularly limited, but to optimize the stripping action on the adhered resist component and considering re-cycle and re-process of the resist-stripping liquid, it is preferable to adopt the composition substantially the same as that of the first stripping liquid or the composition having a slightly increased amount of the volatile solvent component than that contained in the first stripping liquid.

In the present embodiment, as in the Fifth Embodiment, the product ELM-R10 provided by Mitsubishi Gas Chemical Co., Ltd. is used as the first stripping liquid, which is also used for the second stripping liquid.

Note that, the arrangement of the present embodiment may further include the preliminary nozzle and/or finishing nozzle as explained in the Fifth Embodiment. Further, the stripping-liquid-supply-nozzle for supplying the first and second stripping liquids may include a heating unit for heating these liquids.

[Seventh Embodiment]

The following will describe still another embodiment of the present invention based on FIG. 25 through FIG. 28. Note that, the present invention is not to be limited by the following. Also, the elements having the same functions as those of the elements described in the First, Fifth, and Sixth Embodiments are given the same reference numerals and explanations thereof are omitted here.

The foregoing First, Fifth, and Sixth Embodiments employed the arrangement of the shower system (nozzle system or nozzle type) employing the processing-liquid-supply nozzle as the example of the ultrasonic cleaning device or resist-stripping device. However, the present invention is not just limited to this arrangement, and a dip type is also applicable as in the present embodiment. Note that, the present embodiment will describe the case of the resist-stripping device.

Figure 25:
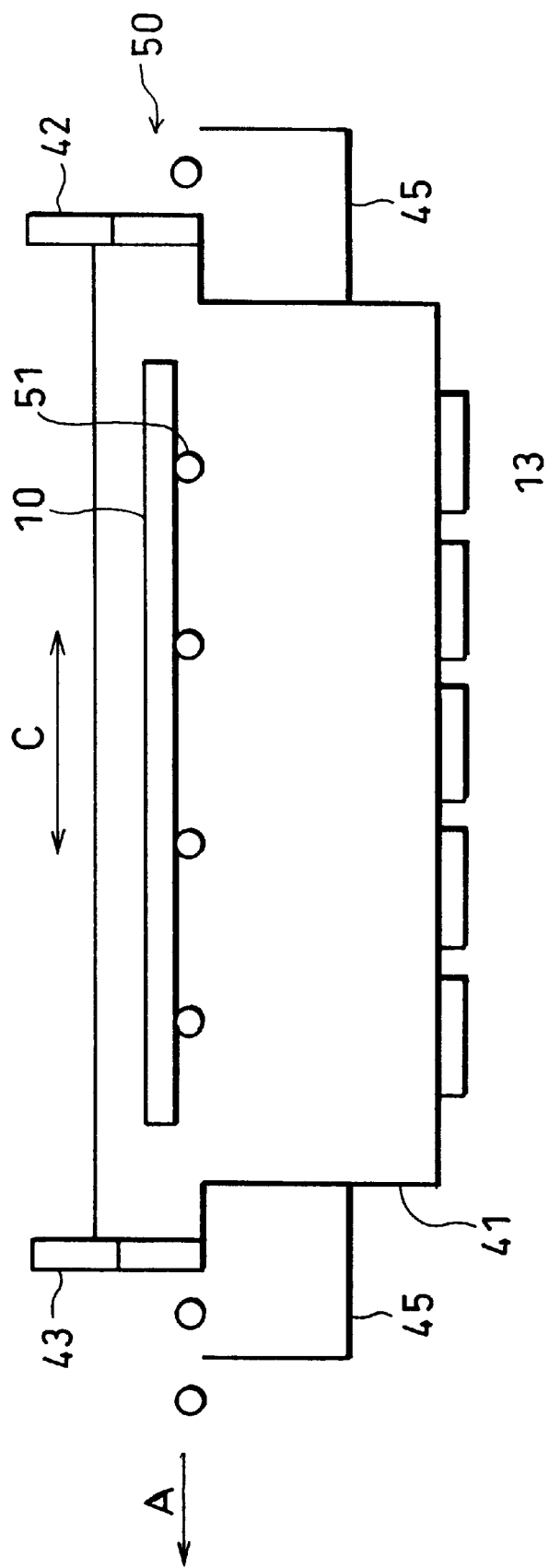
FIG. 25 is a cross-sectional view schematically illustrating an arrangement of an ultrasonic processing device in accordance with still another embodiment of the present invention.

As shown in FIG. 25, a resist-stripping device of a single-substrate dip type in accordance with the present embodiment includes a stripping-liquid tank 41, insertion gate 42, discharge gate 43, and swaying means (not shown), wherein a transport path 50 having a plurality of transport rollers 51 connects the insertion gate 42 and discharge gate 43. On the rear surface of the bottom of the stripping-liquid tank 41 are disposed a plurality of ultrasonic oscillation elements 13.

The transport path 50 is positioned through the stripping-liquid tank 41 via the insertion gate 42 and discharge gate 43. That is, the transport path 50 crosses the stripping-liquid tank 41 at the positions of the insertion gate 42 and discharge gate 43. Note that, while the insertion gate 42 is open, an insertion opening is formed at the portion of the stripping-liquid tank 41 crossing the transport path 50, and while the discharge gate 43 is open, a discharge opening is formed at the portion of the stripping-liquid tank 41 crossing the transport path 50.

The insertion gate 42 and discharge gate 43 are usually closed and are open when inserting or discharging the glass substrate 10 into or out of the stripping-liquid tank 41 to form the insertion opening and discharge opening, respectively. Also, while the insertion gate 42 and discharge gate 43 are open, the lower ends of the insertion and discharge openings are almost at the same level as the plane of the transport path 50 on which the target object (here, glass substrate 10) is placed.

Further, the stripping-liquid tank 41 is filled with the resist-stripping liquid, and the level of the resist-stripping liquid (i.e., highest level on the surface of the resist-stripping liquid in the stripping-liquid tank 41) can be suitably adjusted when opening the insertion gate 42 or discharge gate 43. That is, while the insertion gate 42 or discharge gate 43 is open, the level of resist-stripping liquid is lower than the transport path 50, and while the glass substrate 10 is in the stripping-liquid tank 41, the level of resist-stripping liquid is raised so as to cover the upper surface of the glass substrate 10 entirely.

Figure 26:
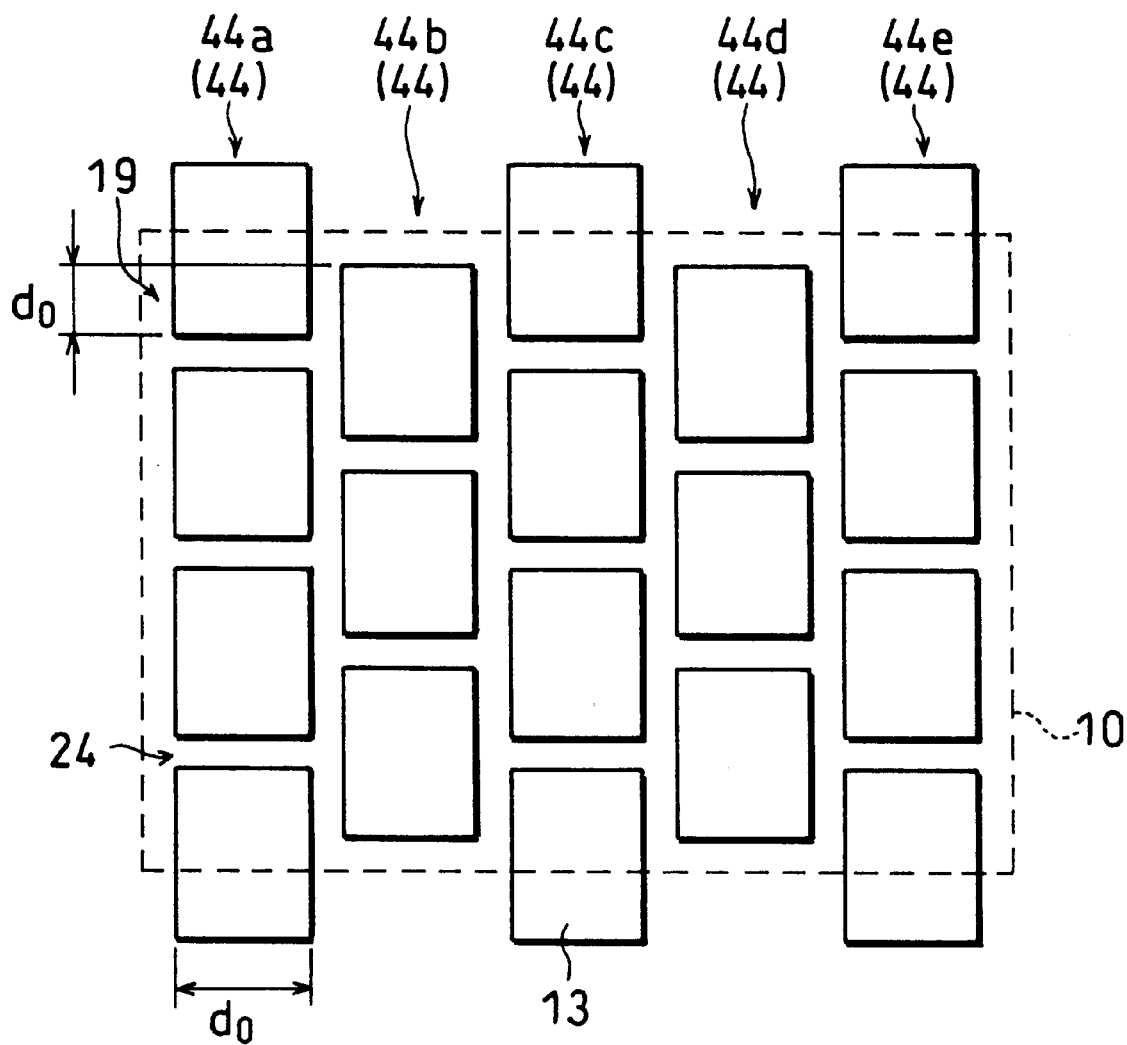
FIG. 26 is an explanatory view illustrating position relationship between ultrasonic oscillation elements arranged in the ultrasonic processing device shown in FIG. 25 and a glass substrate.

The ultrasonic oscillation elements 13, as shown in FIG. 25 and FIG. 26, are disposed so as to cover the lower surface of the stripping-liquid tank 41 entirely. As with the foregoing First, Fourth and Fifth Embodiments, the ultrasonic oscillation elements 13 form a plurality of element arrays 44 (five lines of element arrays 44a through 44e in FIG. 26). Considering the disposition of adjacent two element arrays together (e.g., element arrays 44a and 44b) among these element arrays 44, they are disposed in a staggered fashion to have an superimposition region 19 of width $d_0$, as in the First, Fifth, and Sixth Embodiments. Note that, indicated by dotted line in FIG. 26 is the glass substrate 10.

The following will describe an operation of the resist-stripping device. First, the glass substrate 10 which has been applied with the resist (not shown) over the entire surface is transported on the transported path 50 by the transport rollers 51 to the stripping-liquid tank 41. At this stage, the level of the resist-stripping liquid in the resist-stripping tank 41 is lower than the insertion gate 42. The insertion gate 42 is then opened and the glass substrate 10 is inserted into the resist-stripping tank 41.

The insertion gate 42 is closed when the glass substrate 10 is transported to a predetermined position in the resist-stripping tank 41. Then, the resist-stripping liquid is supplied from the resist-stripping-liquid supply means (not shown) with respect to the resist-stripping liquid tank 41, and the level of the resist-stripping liquid rises to cover the upper surface of the glass substrate 10 entirely, thus filling the resist-stripping tank 41 with the resist-stripping liquid.

With the resist-stripping liquid filling the resist-stripping liquid tank 41, the ultrasonic oscillation elements 13 project an ultrasonic wave with respect to the entire surface of the glass substrate 10 while swaying the glass substrate 10 in a direction along the transport path 50 (direction of arrow C in FIG. 25, i.e., predetermined direction the same as transport direction A) by the swaying means (not shown, e.g., swaying device having teeth for holding the glass substrate 10 at both ends).

The ultrasonic oscillation elements 13 are disposed on the lower surface of the stripping-liquid tank 41 so as to form the element arrays 44 and in a staggered fashion between adjacent element arrays 44. Since an insulation region 24 is formed between ultrasonic oscillation elements 13 making up individual element arrays 44, when the ultrasonic wave is projected without swaying the glass substrate 10, a portion corresponding to the insulation region is not projected with the ultrasonic wave and nonuniform stripping of resist occurs.

However, as described, the glass substrate 10 is swayed by the swaying means in the present embodiment. Therefore, the ultrasonic wave unprojected region corresponding to the insulation region 24, which was generated when the element array 44 of the first line (e.g., element array 44*a*) projects the ultrasonic wave, is covered by the ultrasonic wave which is projected from the element array 44 of the second line (e.g., element array 44*b*). As a result, the ultrasonic wave is uniformly projected over the entire surface of the glass substrate 10, thus preventing nonuniform stripping of resist.

Here, the swaying width of the glass substrate 10 by the swaying means is not particularly limited as long as it allows the ultrasonic waves which are respectively projected from adjacent element arrays 44 to mutually cover their ultrasonic wave unprojected regions corresponding to the insulation regions. However, the lower limit of the swaying width is preferably not less than width $d_e$ of a single element array 44 as shown in FIG. 25, and further preferably not less than $1.2d_e$ incorporating a width of about a 10% margin ($0.1d_0$) with respect to the width $d_e$ in forward and backward directions in the swaying direction of the element array 44. The upper limit of the swaying width is preferably not more than width $2d_e$ of two lines of element arrays 44.

With a swaying width below width $d_e$, the unprojected region corresponding to the insulation region cannot be covered by the ultrasonic wave from the adjacent element array 44 and it is not preferable. Also, the reason the margin of $0.1d_e$ is preferably added to have the swaying width is to increase the swaying width to some degree so as to cover the unprojected region with certainty.

On the other hand, when the swaying width exceeds the swaying width $2d_e$, the swaying width increases and it becomes necessary to increase the tank area of the stripping-liquid tank 41 in which the glass substrate 10 is immersed.

As a result, the problem of increased ground area of the resist-stripping device comes to have more influence than the effect of covering the unprojected area by providing the foregoing margin, and therefore the swaying width exceeding the swaying width $2d_e$ is not preferable.

Upon finishing the resist stripping process by the projection of the ultrasonic wave over a predetermined time period in the stripping-liquid tank 41, the discharge gate 43 is opened to transport the glass substrate 10 out of the stripping-liquid tank 41 and onto a device for performing the next step via the transport path 50.

Figure 27:
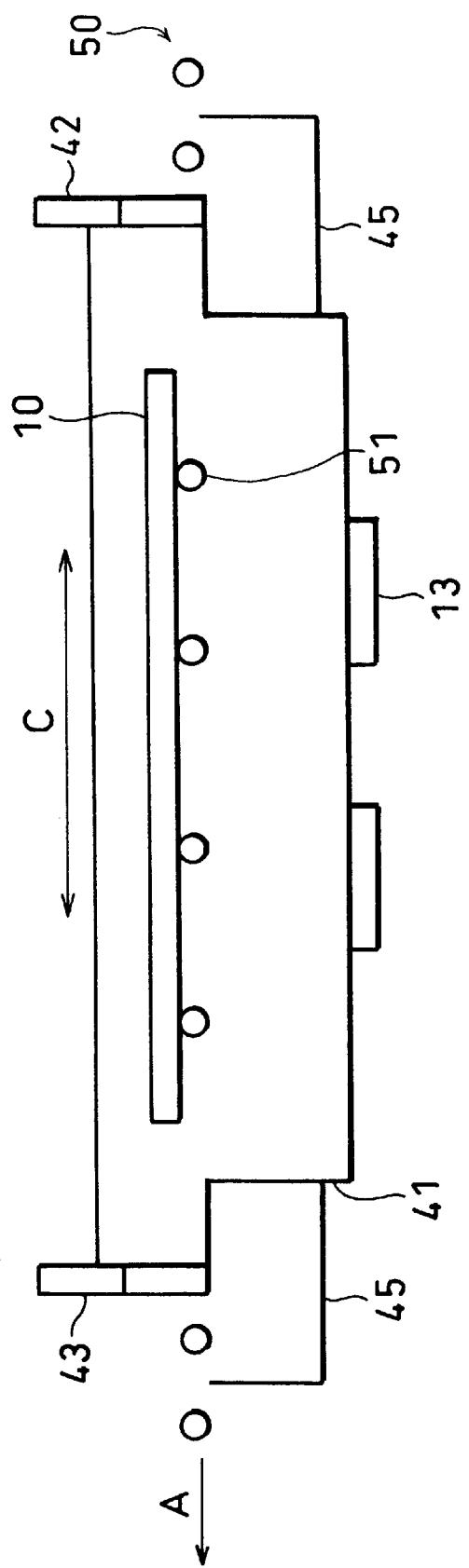
FIG. 27 is a cross-sectional view schematically illustrating still another example of the arrangement of the ultrasonic processing device shown in FIG. 25.
Figure 28:
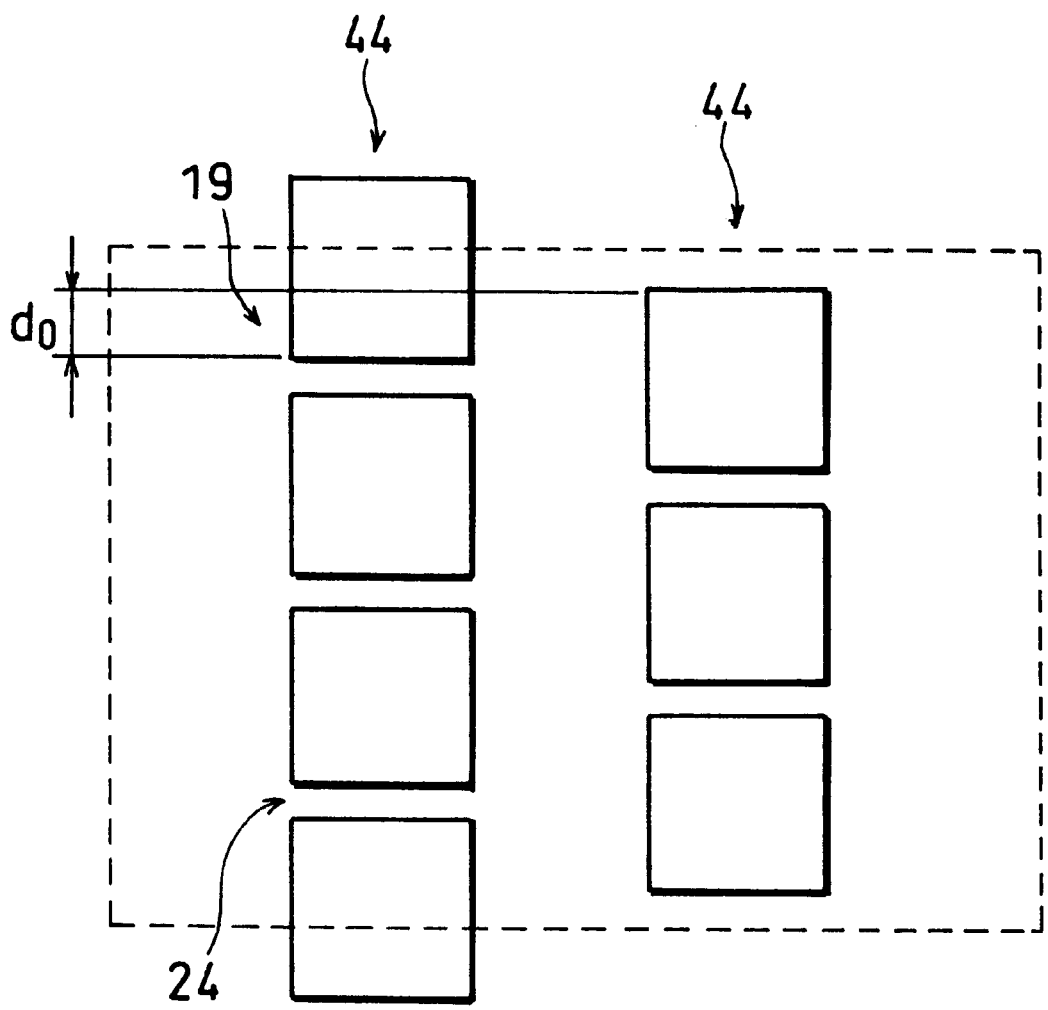
FIG. 28 is an explanatory view illustrating position relationship between ultrasonic oscillation elements arranged in the ultrasonic processing device shown in FIG. 27 and a glass substrate.

Note that, the tank area of the stripping-liquid tank 41 may be increased to some degree, and to decrease the number of ultrasonic oscillation elements 13 used, as shown in FIG. 27 and FIG. 28, the interval between the element arrays 44 may be increased. In this case, evidently, the swaying width by the swaying means needs to be increased according to the interval of the element arrays 44.

By thus increasing the interval between the element arrays 44 to some degree, while the swaying width is also increased, it is possible to greatly reduce the number of ultrasonic oscillation elements 13 compared with the case where the ultrasonic oscillation elements 13 are closely packed together as shown in FIG. 26.

Note that, the interval range of the element arrays 44 is determined based upon the balance between the influence due to increase in tank area in response to increase in swaying width and the influence of reducing cost by reducing the number of ultrasonic oscillation elements 13, and is not particularly limited.

Note that, the resist-stripping devices as shown in FIG. 25 and FIG. 27 are preferably provided with a stripping-liquid holder 45 for preventing the resist-stripping liquid from moving out of the stripping-liquid tank 41, below and for each of the insertion gate 42 and discharge gate 43. The stripping-liquid holder 45 receives the resist-stripping liquid which leaked out of the insertion opening or discharge opening and returns it to resist-stripping liquid recovering means (not shown).

With the provision of the resist-stripping liquid holder, the resist-stripping liquid is prevented from spreading around even when it leaks out of the stripping-liquid tank 41, and less hazard is posed in handling the resist-stripping liquid.

As described above, an ultrasonic processing device in accordance with the present invention is arranged so that a whole arrangement of the plurality of ultrasonic oscillation elements planarly extend in the processing object transport direction and in the width direction, and that projection regions obtained by projecting the ultrasonic oscillation elements to a plane on the motion direction side form a belt-like region of a width exceeding a width of the ultrasonic processing target region.

This allows ultrasonic to be projected throughout an entirety of the ultrasonic processing target region of a predetermined width, thereby ensuring uniform projection of ultrasonic to a large-area region. Furthermore, since the processing time can be shortened, processing costs can be reduced.

The foregoing ultrasonic processing device of the present invention is further arranged so that the plurality of ultrasonic oscillation elements compose a plurality of element arrays provided in the width direction, the element arrays being provided in parallel in the motion direction, and that, when the plurality of element arrays are projected to the plane on the motion direction side, projection regions of the ultrasonic oscillation elements composing one of the element arrays and projection regions of the ultrasonic oscillation elements composing another one of the element arrays overlap each other, forming superimposition regions.

Therefore, ultrasonic is projected so that the projected figures should have superimposition regions, thereby further ensuring ultrasonic projection throughout the entirety of the foregoing ultrasonic processing target region.

The ultrasonic processing device in accordance with the present invention arranged as above may be further arranged so that the plurality of ultrasonic oscillation elements compose a plurality of element arrays provided in the width direction, the element arrays being provided in parallel in the motion direction, and that the ultrasonic oscillation elements composing one of the element arrays are placed at positions corresponding to insulating regions provided between the ultrasonic oscillation elements composing another one of the element arrays.

Therefore, viewing the whole arrangement of the ultrasonic oscillation elements composing the element arrays, the ultrasonic oscillation elements are arranged in a stagger form. Therefore, even if non-projection regions are produced by insulating regions of one element array, the non-projection regions can be subjected to ultrasonic projected from another element array. Therefore, it is possible to further surely project ultrasonic throughout the entirety of the ultrasonic processing target region of a predetermined width.

Further, a manufacturing method of electrical components in accordance with the present invention includes an ultrasonic processing step for projecting the ultrasonic wave so as to completely cover the ultrasonic target region of a predetermined width with a partially superimposed area of the ultrasonic wave from a plurality of ultrasonic oscillation elements with respect to a target object being transported in a predetermined direction.

This allows the use of the present invention suitably in a manufacturing process of electrical components other than the foregoing glass substrate, and in particular, in a manufacturing process of electrical components in which the ultrasonic target region to be projected with the ultrasonic wave is large.

[Eighth Embodiment]

Figure 29:
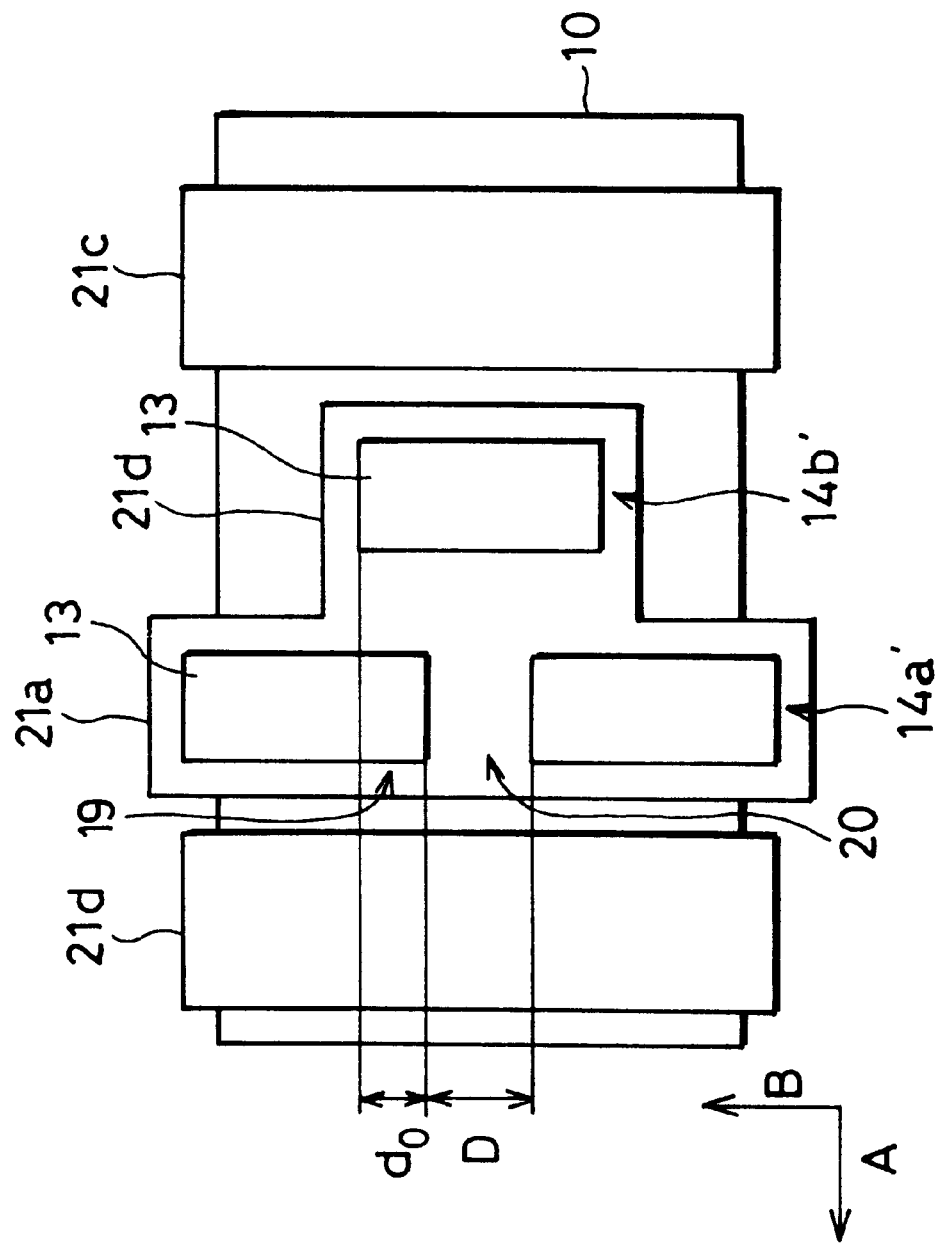
FIG. 29 is an explanatory view illustrating position relationship between a glass substrate and ultrasonic oscillation elements arranged in an ultrasonic processing device in accordance with still another embodiment of the present invention.

The following will describe yet another embodiment of the present invention based on FIG. 20, FIG. 21, and FIG. 29. Note that, the present invention is not to be limited by the following. Also, for convenience of explanation, the elements having the same functions as those of the elements described in the Second and Fifth Embodiments are given the same reference numerals and explanations thereof are omitted here.

In the present embodiment, as with the Fifth Embodiment, the description will be given through the case of a resist-stripping device for stripping a resist formed on the surface of a target object while projecting the ultrasonic wave, as an example of the ultrasonic processing device.

The resist-stripping device used herein is also used for stripping a layered resist formed on the glass substrate, and in the following explanation, the surface of the glass substrate where the resist is formed is regarded as a resist-processed surface. Further, unless noted, the glass substrate having formed the resist thereon will be simply referred to as the glass substrate.

The resist stripping process of the present embodiment, for example, as shown in FIG. 20, includes a loader section, a conveyer tank, and first and second stripping sections in this order from the upstream side in the transport direction of the glass substrate, and more preferably, it is performed through further units of a rinsing section, water cleaning section, drying section, and unloader section.

Also, in the following, the first and second stripping sections will be collectively referred to as the stripping section. Incidentally, the arrangement of the present embodiment is basically the same as that of the Fifth Embodiment with a slight difference in the arrangement of the second stripping section. Therefore, descriptions of the loader section, first stripping section, rinsing section, water cleaning section, drying section, and unloader section are omitted, and only the second stripping section will be described in detail.

The second stripping section adopts the resist-stripping device (ultrasonic processing device) in accordance with the present invention, and performs the resist stripping process while projecting the ultrasonic wave on the glass substrate (ultrasonic wave stripping process).

The second stripping section used here and the second stripping section of the Fifth Embodiment have a common arrangement as shown in FIG. 21, and the only difference is the number of ultrasonic oscillation elements 13 disposed in the stripping-liquid supply nozzles (nozzle means) 21a and 21b (see FIG. 22 and FIG. 29). Therefore, descriptions of transport means 51 composed of the plurality of transport rollers 50, stripping-liquid supply nozzles 21a and 21b, heating unit 28, preliminary nozzle 21c, and finishing nozzle 21d in terms of their arrangements, dispositions, and functions are omitted here, and only the dispositions of the ultrasonic oscillation elements 13 of the present embodiment will be described in detail.

As in the Second Embodiment, as shown in FIG. 29, the plurality of ultrasonic oscillation elements 13 are also disposed in a staggered fashion in the present embodiment. That is, the plurality of ultrasonic oscillation elements 13 are disposed so as to form element arrays 14a' and 14b', and to adapt to the blank region of the ultrasonic oscillation elements 13 including the element space 20 of distance D in the element arrays 14a' and 14b', and to have an superimposition region 19 of width $d_O$, where the distance D of the element space 20 takes the value which exceeds the insulation distance $d_r$.

Here, in the case where the foregoing relationship (1) as explained in the Second Embodiment is satisfied, the number of the ultrasonic oscillation elements 13 composing the element array $14^k$ in the k'th line and the number of the ultrasonic oscillation elements 13 composing the element array $14^{k+1}$ in the k+1'th line are set to $(n+1)/2$ and $(n-1)/2$, respectively, when n is an odd number, while the numbers of the ultrasonic oscillation elements 13 composing the element arrays $14^k$ and $14^{k+1}$ in the k'th and k+1'th lines are both set to n/2, when n is an even number.

With this disposition, the ultrasonic wave unprojected region corresponding to the element space 20 of the element array 14' are covered by the ultrasonic wave projected from the ultrasonic oscillation elements 13 of the element array 14b'. This allows the ultrasonic wave to be projected without a break over the entire width direction B of the target object (glass substrate 10), thus carrying out the resist stripping process efficiently.

Further, since larger distance D can be provided for the element space 20, it is further ensured to reduce the interference effect between the ultrasonic oscillation elements 13, and the number of ultrasonic oscillation elements 13 used can be reduced.

Note that, a specific disposition of the ultrasonic oscillation elements 13, the range of distance D of the element space 20, or the range of width $d_O$ of the superimposition region 19 are as described in the Second Embodiment and explanations thereof are omitted here.

As described, as in the Second Embodiment, the resist-stripping device in accordance with the present embodiment is adopted to dispose the plurality of ultrasonic oscillation elements in such a manner as to form a plurality of element arrays, and to adapt to the blank area of the ultrasonic oscillation elements included in the element arrays, and the ultrasonic oscillation elements are disposed to have the superimposition region, where the distance of the element space takes the value which exceeds the insulation distance.

Further preferably, let the predetermined width of the ultrasonic target region Lmm, let the dimension of the ultrasonic oscillation element be Mmm, and let the number of the oscillation elements be n (n>2), then, in the case where the width Lmm and the dimension Mmm satisfy $(n-1)M \leq L < nM$, the number of the ultrasonic oscillation elements 13 composing the element array in the k'th line and the number of the ultrasonic oscillation elements 13 composing the element array in the k+1'th line are set to (n+1)/2 and (n−1)/2, respectively, when n is an odd number, while the numbers of the ultrasonic oscillation elements 13 composing the element arrays in the k'th and k+1'th lines are both set to n/2, when n is an even number.

In effect, the entire ultrasonic target region is completely covered by the ultrasonic oscillation elements which are readily available and highly reliable, thus projecting the ultrasonic wave further uniformly than conventionally with respect to the glass substrate 10. This allows the amount of resist-stripping liquid to be reduced while maintaining sufficient resist-stripping effect, thus realizing reliable and efficient cleaning and lower running cost.

Further, since the individual ultrasonic oscillation elements are sufficiently separated, stable oscillation of the ultrasonic wave is made possible by drastically suppressing interference effect between the elements, and also the number of elements can be reduced compared with the case where the elements are disposed closely packed together, thereby further simplifying the power supply system and control system of the ultrasonic oscillation elements.

Further, as in the Second Embodiment, the present invention can suitably be used in the manufacturing method of electrical components having the resist stripping step. That is, the manufacturing method of electrical components in accordance with the present invention includes the resist stripping step for supplying the resist-stripping liquid from the plurality of ultrasonic oscillation elements to a target object being transported in a predetermined direction while projecting the ultrasonic wave with partially superimposed ultrasonic wave projected area (ultrasonic wave projected region) so as to completely cover the ultrasonic target region of a predetermined width while providing the element space which exceeds the insulation distance for insulating each element from the other.

Thus, the present invention can suitably be used, whenever the resist stripping step is employed, in a manufacturing process of electrical components other than the foregoing glass substrate, and in particular, in a manufacturing process of electrical components in which the ultrasonic target region to be projected with the ultrasonic wave is large.

[Ninth Embodiment]

Figure 30:
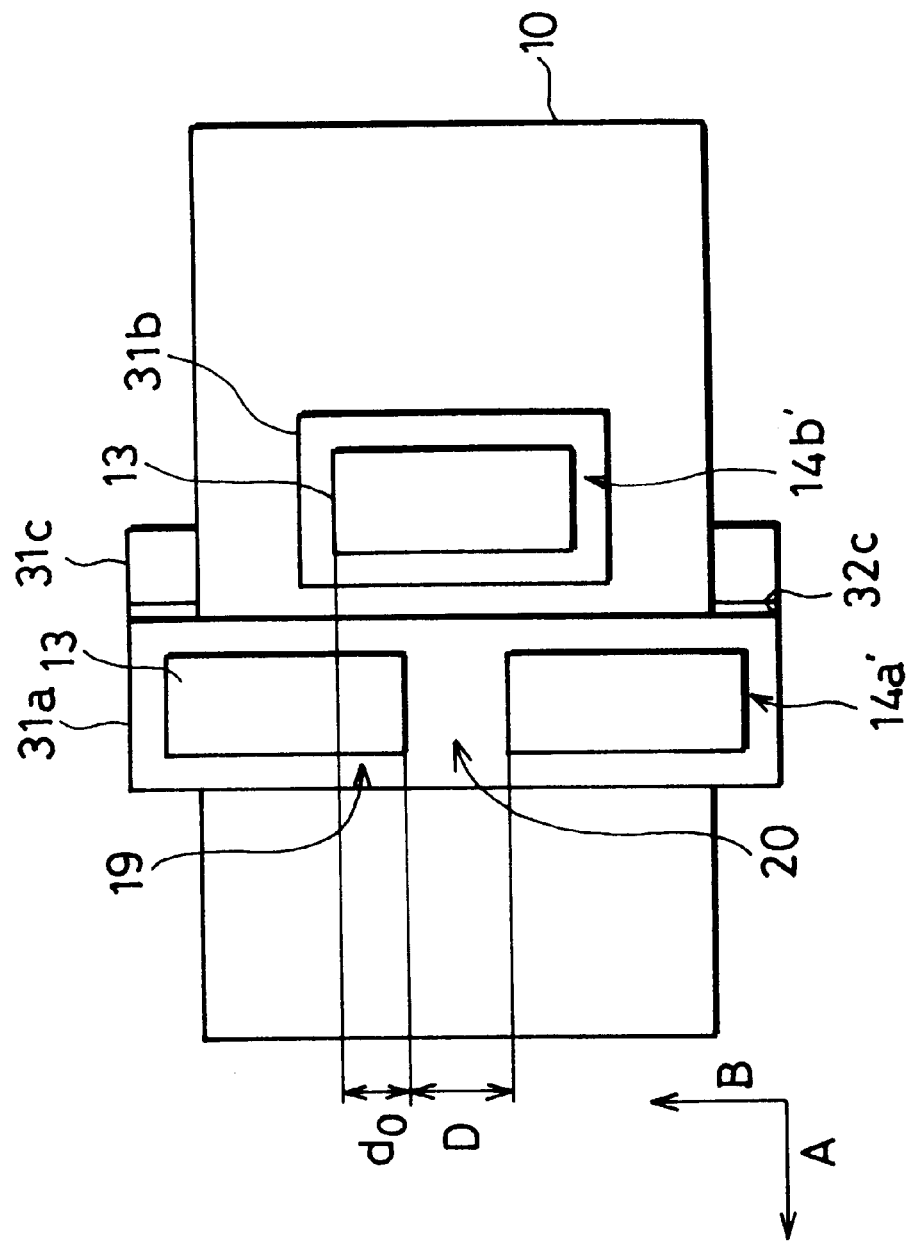
FIG. 30 is an explanatory view illustrating position relationship between a glass substrate and ultrasonic oscillation elements arranged in an ultrasonic processing device in accordance with still another embodiment of the present invention.

The following will describe yet another embodiment of the present invention based on FIG. 23 and FIG. 30. Note that, the present invention is not to be limited by the following. Also, for convenience of explanation, the elements having the same functions as those of the elements described in the Second and Sixth Embodiments are given the same reference numerals and explanations thereof are omitted here.

The present embodiment describes the resist-stripping device as with the Sixth Embodiment. Thus, the resist-stripping device in accordance with the present embodiment is to be applied to the second stripping section (see FIG. 20).

The second stripping section used here and the second stripping section of the Sixth Embodiment have the common structure as shown in FIG. 23 and are only different in the number of ultrasonic oscillation elements 13 disposed in the stripping-liquid supply nozzles (nozzle means) 31a and 31b (see FIG. 23 and FIG. 30). That is, the transport path 50 composed of the plurality of transport rollers 51, stripping-liquid supply nozzles 31a and 31b, and lower stripping-liquid supply nozzle 31c with respect to their arrangements, dispositions, and functions are as described in the Sixth Embodiment, and accordingly only the ultrasonic oscillation elements of the present embodiment with respect to their disposition will be explained.

As shown in FIG. 30, the ultrasonic oscillation elements 13, as with the Eighth Embodiment (see FIG. 29), are disposed in an array of element arrays 14a' and 14b' in the upper stripping-liquid supply nozzles 31a and 31b in a staggered fashion so that the ultrasonic oscillation elements 13 as a whole have a superimposition region 19 of width $d_0$, and the distance D of the element space 20 takes the value which exceeds the insulation distance $d_r$.

Also, preferably, in the case where the relationship (1) as explained in the Second Embodiment holds, the number of the ultrasonic oscillation elements 13 composing the element array $14^k$ in the k'th line (element array 14a') and the number of the ultrasonic oscillation elements 13 composing the element array $14^{k+1}$ in the k+1'th line (element array 14b') are set to (n+1)/2 and (n−1)/2, respectively, when n is an odd number, while the numbers of the ultrasonic oscillation elements 13 composing the element arrays $14^k$ and $14^{k+1}$ in the k'th and k+1'th lines are both set to n/2, when n is an even number.

Note that, as noted in the Second and Sixth Embodiments, any kind of stripping liquid may be used, and a heating unit for heating the stripping liquid may be additionally provided.

[Tenth Embodiment]

The following will describe still another embodiment of the present invention based on the drawings. Note that, the present invention is not to be limited by the following. Also, the elements having the same functions as those of the elements described in the Second, Sixth, and Seventh Embodiments are given the same reference numerals and explanations thereof are omitted here.

The foregoing First, Third, and Fifth Embodiments described the arrangement of the shower system using a processing liquid supply nozzle (nozzle system or nozzle type) as an example of the ultrasonic processing device or resist-stripping device. However, the present invention is not to be limited by this and is also applicable to the dip type as in the present embodiment. Note that, the present embodiment describes the case of the resist-stripping device.

As shown in FIG. 27, the resist-stripping device of a single-substrate type in accordance with the present embodiment includes a stripping liquid tank 41, insertion gate 42, discharge gate 43, and swaying means (not shown), and a transport path 50 having a plurality of transport rollers 51 connects the insertion gate 42 and discharge gate 43. Further, on the rear surface of the bottom of the stripping liquid tank 41 are disposed a plurality of ultrasonic oscillation elements 13. Note that, the arrangement of the resist-stripping device is common to that described in the Seventh Embodiment, and only the number of ultrasonic oscillation elements 13 disposed with respect to the stripping liquid tank 41 is different (see FIG. 28 and FIG. 31).

That is, the transport path 50 having the plurality of transport rollers 51, stripping liquid tank 41, insertion gate 42, discharge gate 43, and swaying means with respect to their arrangements, dispositions, and functions are as described in the Seventh Embodiment and no further explanations will be given. The following describes particularly the disposition of the ultrasonic oscillation elements 13 in detail.

Figure 31:
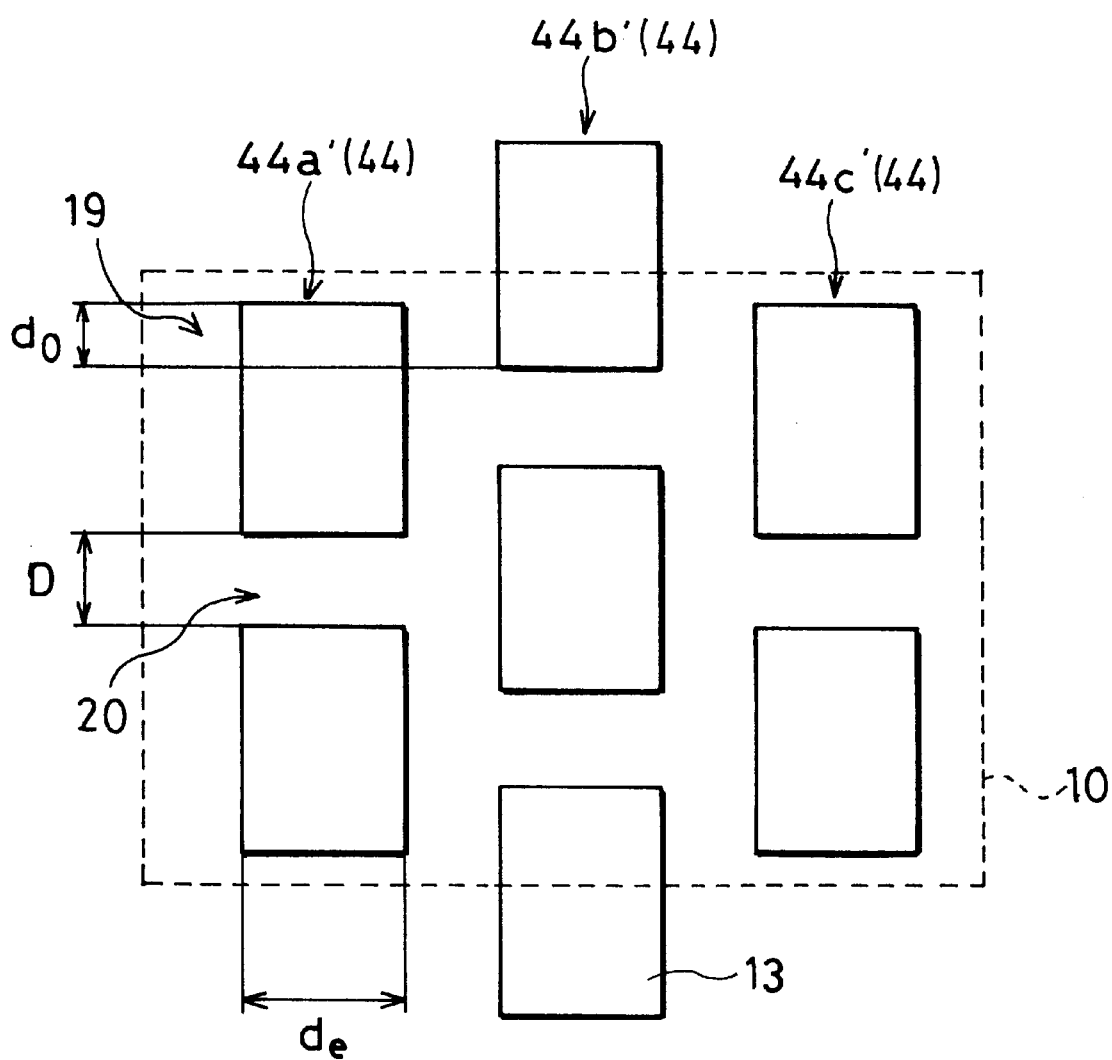
FIG. 31 is an explanatory view illustrating position relationship between a glass substrate and ultrasonic oscillation elements arranged in an ultrasonic processing device in accordance with still another embodiment of the present invention.

As shown in FIG. 27 and FIG. 31, the ultrasonic oscillation elements 13 are disposed over the entire lower surface of the stripping liquid tank 41, and, as in the Second, Eighth, and Ninth Embodiments, make up the plurality of element arrays 44 (three lines of element arrays 44$a'$ through 44$c'$ in FIG. 27). Considering the disposition of the ultrasonic oscillation elements 13 with respect to adjacent two lines of element arrays 44 (e.g., element arrays 44$a'$ and 44$b'$) among the element arrays 44, they are disposed in a staggered fashion to have an superimposition region 19 of width $d_0$, and distance D of the element space 20 exceeds the insulation distance $d_r$. Note that, indicated by dotted line in FIG. 31 is the glass substrate 10.

Also, preferably, in the case where the relationship (1) as explained in the Second Embodiment holds, the number of the ultrasonic oscillation elements 13 composing the element array $44^k$ in the k'th line (element array 44$a'$) and the number of the ultrasonic oscillation elements 13 composing the element array $44^{k+1}$ in the k+1'th line (element array 44$b'$) are set to (n+1)/2 and (n−1)/2, respectively, when n is an odd number, while the numbers of the ultrasonic oscillation elements 13 composing the element arrays $44^k$ and $44^{k+1}$ in the k'th and k+1'th lines are both set to n/2, when n is an even number.

The operation of the resist-stripping device is as described in the Seventh Embodiment. To briefly explain it again, first, the glass substrate 10 having being applied a resist over the entire surface is transported by the plurality of transport rollers 51 to a predetermined position in the stripping liquid tank 41. Then, an ultrasonic wave is projected over the entire surface of the glass substrate 10 by the ultrasonic oscillation elements 13 while swaying the glass substrate 10 by the swaying means in a direction along the transport path 50 with the resist-stripping liquid filling the resist stripping tank 41.

The ultrasonic oscillation elements 13 are disposed on the lower surface of the resist-stripping liquid tank 41 so as to make up the element arrays 44 and in a staggered fashion between adjacent element arrays 44. Between the ultrasonic oscillation elements 13 making up individual element array 44 is formed element space 20, and thus if the ultrasonic wave is projected without swaying the glass substrate 10, the ultrasonic wave is not projected on the portion corresponding to the insulation region, and nonuniform stripping of resist occurs.

However, in the present embodiment, as described, the glass substrate 10 is swayed by the swaying means. Therefore, the ultrasonic unprojected region corresponding to the element space 20, which is generated when the ultrasonic wave is projected from the element array 44 of the first line (e.g., element array 44$a'$), is covered by the ultrasonic wave projected from the element array 44 of the second line (e.g., element array 44$b'$). As a result, the ultrasonic wave is uniformly projected over the entire surface of the glass substrate 10, thus preventing nonuniform stripping of resist.

Further, since the distance D of the element space 20 exceeds the insulation region $d_r$, individual ultrasonic oscillation elements 13 are sufficiently separated from one another and stable oscillation of the ultrasonic wave is made possible by drastically suppressing interference effect between the ultrasonic oscillation elements, and also the number of ultrasonic oscillation elements 13 can be reduced compared with the case where the ultrasonic oscillation elements are closely packed on the lower surface of the stripping-liquid tank 41, thereby further simplifying the power supply system and control system of the ultrasonic oscillation elements 13.

Here, the swaying width of the glass substrate 10 by the swaying means is not particularly limited as long as it allows the ultrasonic waves which are respectively projected from adjacent element arrays 44 to mutually cover their ultrasonic wave unprojected regions corresponding to the insulation regions. However, the lower limit of the swaying width is preferably not less than width $d_e$ of a single element array 44 as shown in FIG. 31, and further preferably not less than 1.2$d_e$ which incorporates a width of about a 10% margin (0.1$d_0$) with respect to the width $d_e$ in forward and backward directions in the swaying direction of the element array 44. The upper limit of the swaying width is preferably not more than width 2$d_e$ of two lines of element arrays 44.

With the swaying width below width $d_e$, the unprojected region corresponding to the insulation region cannot be covered by the ultrasonic wave from the adjacent element array 44 and it is not preferable. Also, the reason the margin of 0.1$d_e$ is preferably added to have the swaying width is to increase the swaying width to some degree so as to cover the unprotected region with certainty.

On the other hand, when the swaying width exceeds the swaying width 2$d_e$, the swaying width increases and it becomes necessary to increase the tank area of the stripping-liquid tank 41 in which the glass substrate 10 is immersed. As a result, the problem of increased ground area of the resist-stripping device comes to have more influence than the effect of covering the unprojected area by providing the margin and therefore the swaying width exceeding the swaying width 2$d_e$ is not preferable.

Upon finishing the resist stripping process by the projection of ultrasonic wave over a predetermined time period in the stripping-liquid tank 41, the discharge gate 43 is opened to transport the glass substrate 10 out of the stripping-liquid tank 41 and onto a device for performing the next step via the transport path 50.

Note that, the interval range of the element arrays 44 is determined based upon the balance between the influence due to increase in tank area in response to increase in swaying width and the influence of reducing coat by reducing the number of the ultrasonic oscillation elements 13, and is not particularly limited.

Also, the advantages of providing the stripping liquid holder 45 as shown in FIG. 27 are as already explained in the Sixth Embodiment and further explanations thereof are omitted here.

As described above, the ultrasonic processing device in accordance with the present invention is arranged so that a plurality of vibrating elements are provided so as to compose a plurality of element arrays that are provided in parallel in the processing object transport direction, wherein (i) element spaces are formed, to a predetermined width each, between adjacent vibrating elements, (ii) at positions corresponding to non-provision regions including the element spaces in one of said element arrays, said vibrating elements composing another one of said element arrays are placed, and (iii) the width of said element space exceeds an insulation distance for insulation between said vibrating elements.

With this arrangement, uniform and high quality ultrasonic processing can also be realized with respect to an ultrasonic target region having a wide width, and the processing time can be reduced, thus reducing processing cost. Further, since the element space exceeds the insulation distance, individual ultrasonic oscillation elements are sufficiently separated from one another and stable oscillation of the ultrasonic wave is made possible by drastically suppressing interference effect of the ultrasonic wave, and also the number of ultrasonic oscillation elements can be reduced, thereby further simplifying the power supply system and control system of the ultrasonic oscillation elements.

Particularly, when the distance between the element space is to be increased as much as possible, preferably, let the predetermined width of the ultrasonic target region Lmm, let the dimension of the ultrasonic oscillation element be Mmm, and let the number of the oscillation elements be n (n>2), then, in the case where the width Lmm and the dimension Mmm satisfy $(n-1)M \leq L < nM$, the number of the ultrasonic oscillation elements 13 composing the element array in the k'th line and the number of the ultrasonic oscillation elements 13 composing the element array in the k+1'th line are set to $(n+1)/2$ and $(n-1)/2$, respectively, when n is an odd number, while the numbers of the ultrasonic oscillation elements 13 composing the element arrays in the k'th and k+1'th lines are both set to n/2, when n is an even number.

This makes it possible to greatly reduce the interference effect of the ultrasonic wave, and stable oscillation of the ultrasonic wave is realized. Further, compared with the case where the oscillation elements are closely packed together, it is ensured that the number of oscillation elements used are reduced, thereby further simplifying the power supply system or control system of the oscillation elements.

Further, the manufacturing method of electrical components in accordance with the present invention includes the ultrasonic processing step of supplying the resist-stripping liquid from the plurality of ultrasonic oscillation elements to a target object being transported in a predetermined direction while projecting the ultrasonic wave with partially superimposed ultrasonic wave projected area (ultrasonic wave projected region) so as to completely cover the ultrasonic target region of a predetermined width while providing the element space which exceeds the insulation distance for insulating each element from the other.

Thus, the present invention can suitably be used in a manufacturing process of electrical components other than the foregoing glass substrate, and in particular, in a manufacturing process of electrical components in which the ultrasonic target region to be projected with the ultrasonic wave is large.

[Eleventh Embodiment]

The following will yet another embodiment of the present invention based on FIG. 20 and FIG. 32 through FIG. 34. Note that, the present invention is not to be limited by the following. Also, for convenience of explanation, the elements having the same functions as those of the elements as described in the Third and Tenth Embodiments are given the same reference numerals and explanations thereof are omitted here.

The present embodiment will describe the present invention through the case of the resist-stripping device for stripping the resist formed on the surface of the target object while projecting the ultrasonic wave, as an example of the ultrasonic processing device.

The resist-stripping device in accordance with the present invention is to be used in the resist-stripping process, which is performed after photolithography process for forming a predetermined pattern on the glass substrate used for the liquid crystal display element, for example, in a manufacturing process of the liquid crystal display element. Thus, a layered resist is formed on the surface of the glass substrate as the target object of the resist-stripping device. Note that, the first and second stripping sections will be collectively referred to as the stripping section.

Also, in the following explanation, the surface of the glass substrate on which the resist is formed will be referred to as the resist-processed surface (ultrasonic target region). Further, unless noted, the glass substrate provided with the resist will simply be referred to as the glass substrate.

The resist stripping process of the glass substrate in the manufacturing process of the liquid crystal display element in the present embodiment includes, for example as shown in FIG. 20, a loader section, conveyer tank, and first and second stripping sections in this order from the upstream side in the transport direction of the glass substrate 10, and more preferably, it is performed through further units of a rinsing section, water cleaning section, drying section, and unloader section.

Note that, in the resist stripping process, the glass substrate is transported to each unit using the transport rollers. However, means for transporting the glass substrate 10 is not just limited specifically to the transport rollers and other means such as conveyer means may be used instead.

The loader section sequentially picks up the glass substrate 10 one by one from a transport cassette capable of storing a plurality of glass substrates 10 (for example, twenty glass substrates) and horizontally sends it out with a certain interval to the stripping section via the conveyer tank. Specifically, the glass substrate 10 which was sent out from the loader section is horizontally transported to the stripping section (first stripping section) with the resist-processed surface facing upward while in contact with and being supported by the transport rollers on the back surface (rear surface) of the resist-processed surface. Note that, the transport speed of the glass substrate 10 in the present embodiment is, for example, 900 mm/minute (or faster) which is common through all units in the resist-stripping device.

The resist stripping process of the glass substrate 10 thus transported is carried out specifically in the following manner. First, the first stripping section functions as a preliminary processing section with respect to the second stripping section which performs the resist stripping process while projecting the ultrasonic wave, and the first stripping section brings the stripping liquid in contact with the glass substrate 10 while the ultrasonic wave is not projected. Specifically, for example, the resist-stripping liquid is supplied as a shower with respect to the resist-processed surface of the glass substrate 10 using, for example, shower means. As a result, the resist on the resist-processed surface swells and is stripped preliminarily. Note that, the resist-stripping liquid has been preferably heated.

Then, in the second stripping section toward the downstream side in the transport direction, employing the resist-stripping device (ultrasonic processing device) in accordance with the present invention, the ultrasonic wave is projected on the glass substrate 10 to strip the resist.

Figure 32:
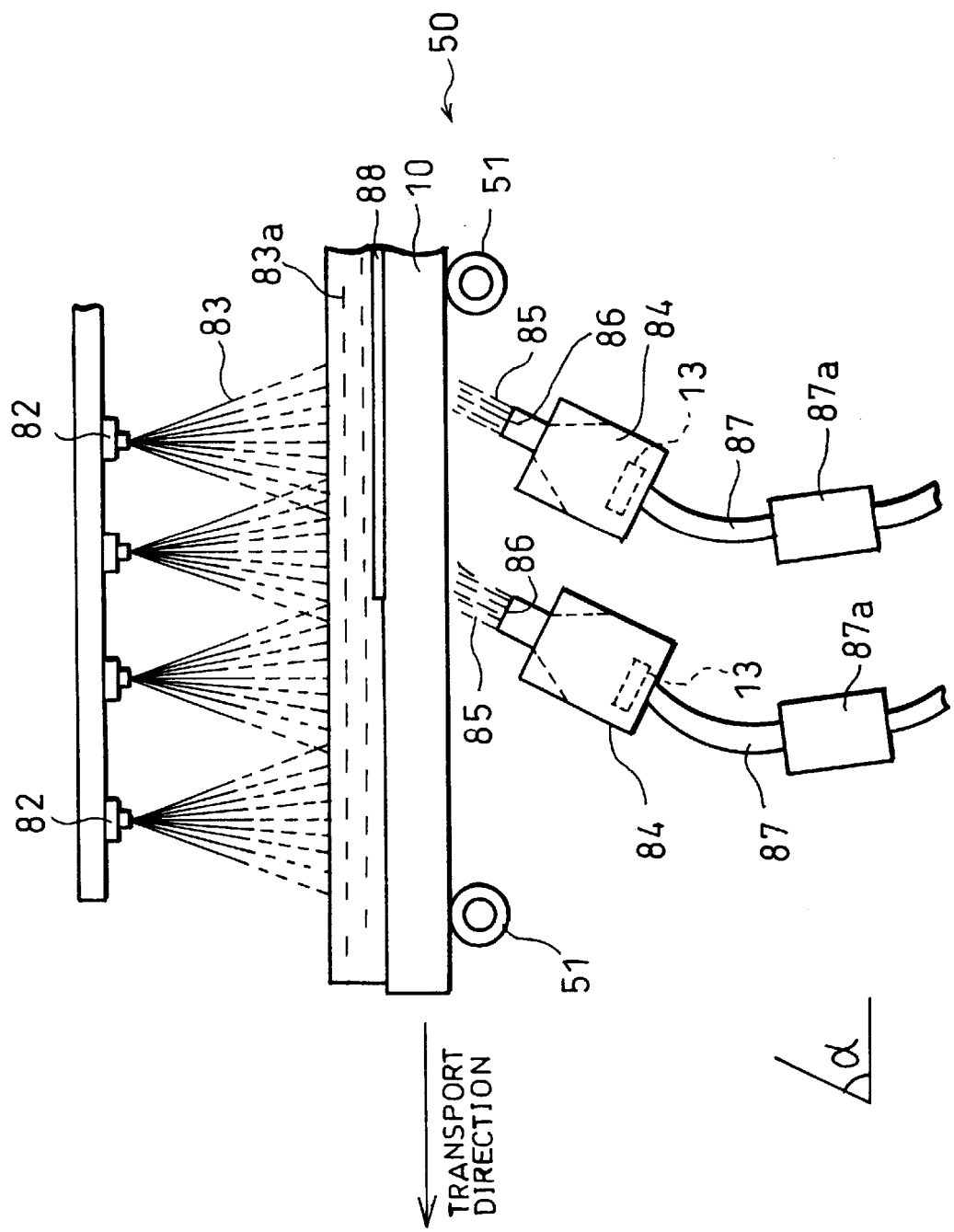
FIG. 32 is a side view schematically illustrating an arrangement of an ultrasonic processing device (resist-stripping device) in accordance with still another embodiment of the present invention that is applied to a resist-stripping operation.

As shown in FIG. 32, the second stripping section is the resist-stripping device of a single-substrate type, and its arrangement is similar to that of the ultrasonic processing device of the Third Embodiment. Specifically, the second stripping section includes stripping liquid supply shower nozzles (part of processing liquid supply means) 82 which are provided above (directly above or with an incline) the glass substrate 10 as the resist target object (target object), ultrasonic nozzles (nozzle means) 84 which are provided below the glass substrate 10 and have been modified to have tapered shape on the inner surface, and transport rollers 51 for transporting the glass substrate 10 in its transport direction (predetermined direction). Note that, "above" or "below" the glass substrate 10 is the same as saying above or below the transport path 50 composed of the transport rollers 51.

The stripping liquid supply shower nozzles 82 have the function of supplying the resist-stripping liquid (processing liquid) 83 on the resist-processed surface of the glass substrate 10, and the ultrasonic nozzles 84 have the function of supplying a liquid 85 which has been projected with the ultrasonic wave by the ultrasonic oscillation elements 13 with respect to the back surface (rear surface) of the resist target object. Note that, the number of stripping liquid supply shower nozzles 82 and ultrasonic nozzles 84 provided in a single stripping section is not particularly limited.

The glass substrate 10 which was sent out by the loader section is horizontally transported into the second stripping section with its resist-processed surface facing upward while in contact with and being supported by the transport rollers 51 on the back surface (rear surface) of the resist-processed surface. The stripping liquid supply shower nozzles 82 provided in the second stripping section continuously supply the resist-stripping liquid 83, for example, while the glass substrate 10 is being transported in the second stripping section. As a result, a resist-stripping liquid layer 83a is formed over the entire resist-processed surface. The type of resist-stripping liquid 83 is not particularly limited and it is suitably selected according to the type or other properties of the photoresist (resist) 88. In the present embodiment, the product ELM-R10 (product name provided by Mitsubishi Gas Chemical Co., Ltd.) is used.

Note that, the method of supplying the resist-stripping liquid 83 with respect to the resist-processed surface is not particularly limited, and, specifically, it is performed, for example, by dropping, spraying, or discharging the resist-stripping liquid 83.

Meanwhile, an ultrasonic shower (liquid 85) of a line form is applied with respect to the back surface (rear surface) of the resist-processed surface from the plurality of ultrasonic nozzles 84, which are provided to have about the same distance from the lower surface of the glass substrate 10 and with a predetermined angle α with respect to the lower surface. The direction the ultrasonic shower is applied is not particularly limited and it may be applied, for example, in a direction substantially perpendicular to the back surface (at the right angle with respect to the transport direction of the glass substrate 10).

When the ultrasonic shower is applied to the back surface of the resist-processed surface, ultrasonic oscillation is propagated through the glass substrate 10 to the resist-stripping liquid layer 8 on the resist-processed surface. This promotes the reaction between the resist-stripping liquid 83 and the photoresist 88. That is, it promotes stripping the photoresist 88 from the resist-processed surface, and dissolving the photoresist 88 in the resist-stripping liquid layer 83a, thereby drastically reducing time for the resist stripping process compared with conventionally. Accordingly, it is possible to reduce the length of the resist-stripping device (more specifically, stripping section), and the size of the foot print. Further, since the amount of resist-stripping liquid used can be reduced, it is possible, for example, to reduce the storage space for the stripping liquid 83 and a potential risk involved in storing the stripping liquid 83.

Note that, by heating the resist-stripping liquid 83 supplied with respect to the resist stripping surface in advance by heating means (not shown), it is possible to further reduce the time for the resist stripping process and also the amount of resist-stripping liquid 83 used. This is achieved by the softening effect on the photoresist 88 as the stripping target object, or by the improved stripping effect due to thermal stress. The temperature of the resist-stripping liquid after having being heated by the heating means is not particularly limited, and it is preferably in a range of 50° C. to 90° C., and more preferably in a range of 70° C. to 80° C.

The frequency of the ultrasonic wave applied on the liquid 85 is not particularly limited, and it is preferably in a range of 0.1 MHz to 5 MHz, and more preferably in a range of 0.3 MHz to 1 MHz, and, in particular, the condition of 0.4 MHz was confirmed to be very suitable. The frequency in the foregoing ranges does not damage the resist target object (glass substrate 10) thus drastically improving time required for the resist stripping process. Note that, ultrasonic oscillation elements which are readily available as semi-standard products include those which oscillate the ultrasonic wave at the frequencies of 0.4 MHz, 1 MHz, and 3 MHz, of which the element oscillating the ultrasonic wave of 0.4 MHz showed superior resist stripping efficiency. Though the reason for this is not clear, it is speculated that the ultrasonic wave of 0.4 MHz is less likely to attenuate, or its oscillation energy is more likely to be absorbed by the photoresist 88 as the stripping target object.

Further, the composition of the liquid 85 is not particularly limited either, but is preferably the resist-stripping liquid 83. This makes it possible to remove organic contaminants such as photoresist (not shown) adhering on the end surface of the resist target object, or photoresist (not shown) which adhered on the back surface of the resist target object in the hot plate process (heating process), etc., in the photolithography process.

Usually, the amount of photoresist which adheres on the back surface of the resist target object is small, and as such, when the resist-stripping liquid (processing liquid) 83 is used as the liquid 85, the life of the liquid 25 is 10 times or greater than that of the usually employed resist-stripping liquid 83 (i.e., the one supplied to the resist-processed surface). In this case, easy re-cycle and re-use of the liquid is possible with the provision of recovery means for recovering the liquid 85, and filtering means for filtering the recovered liquid 85. Note that, pure water may be used as the liquid 25 if (1) the back surface of the resist-processed surface does not have organic contaminants such as photoresist, or if (2) the organic contaminants, if exist, do not present any problem in subsequent processes.

Further, heating means such as a heater 87a may be provided in the flow path of the liquid 85 in its flowing direction, i.e., in the structure, such as the liquid supply tube 87 and ultrasonic nozzle 84, onto the liquid supply opening 86. By heating the liquid 85 in advance by the heating means, it is possible to quickly and surely remove organic contaminants such as photoresist (not shown) adhered on the back surface. Further, by the pre-heated liquid 85 supplied to the glass substrate 10, the resist-stripping liquid layer 83a formed on the resist-processed surface is indirectly heated. As a result, time for the resist stripping process and the amount of resist-stripping liquid 83 used can be reduced.

Note that, in the present embodiment, the heating means is provided on the liquid supply tube 87. Also, the temperature of the liquid 85 after heated by the heating means is not particularly limited, and it is preferably in a range of 50° C. to 90° C., and more preferably a range of 70° C. to 80° C.

In the present embodiment, the liquid supply means includes the flow path of the liquid 85, and inside the flow path, i.e., the ultrasonic oscillation elements 13 provided in the ultrasonic nozzles 84. The following will describe in detail how the ultrasonic oscillation elements 13 provided in the liquid supply means are disposed with respect to their entire structure.

Figure 33:
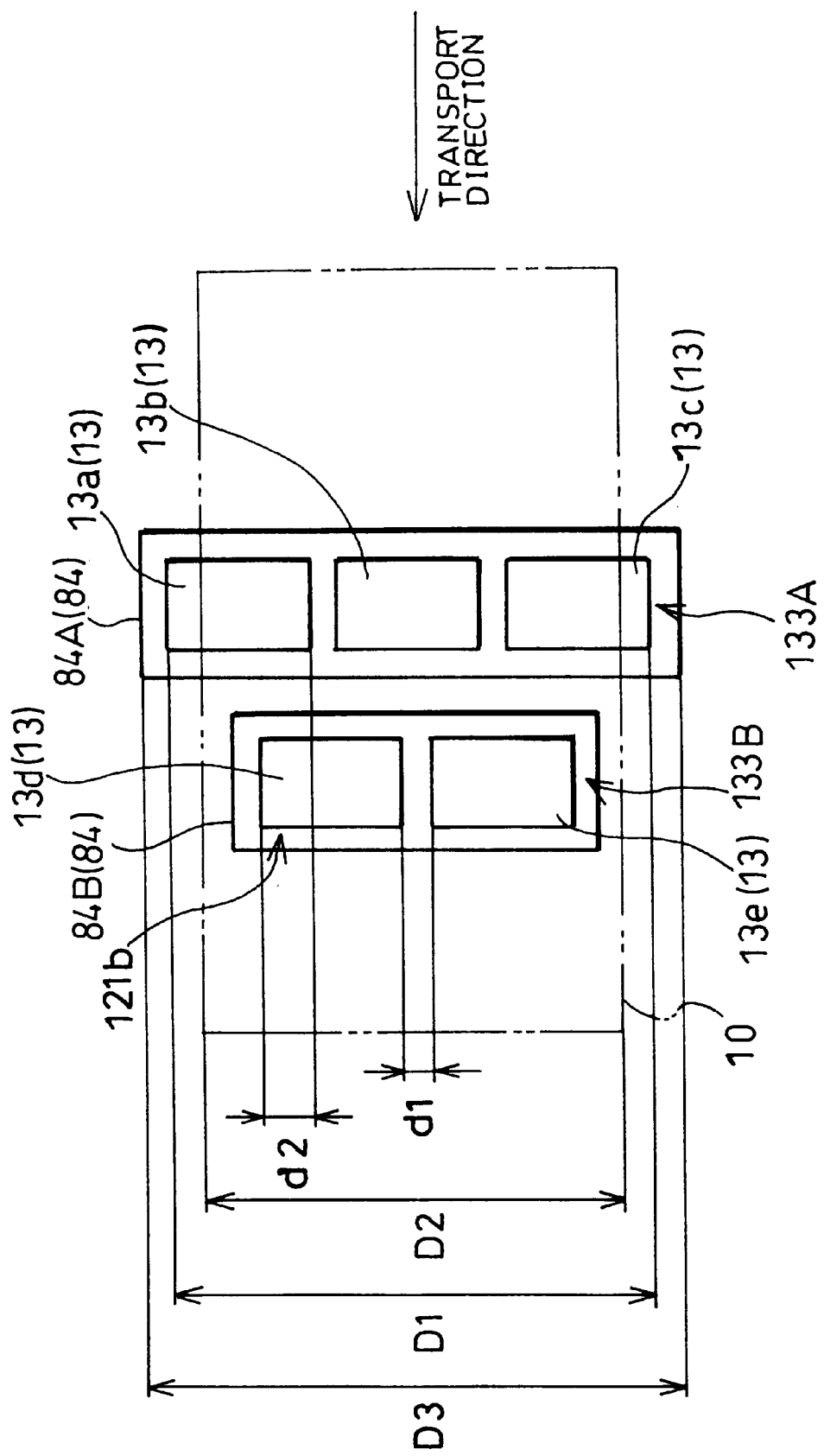
FIG. 33 is an explanatory view illustrating position relationship between ultrasonic oscillation elements arranged in the ultrasonic processing device shown in FIG. 32 and a glass substrate.

First, the following will describe the case when, for example, the number of ultrasonic nozzles 84 provided is two, more specifically, as shown in FIG. 33, when an ultrasonic nozzle 84A composed of ultrasonic oscillation elements 13a through 13c and an ultrasonic nozzle 84B composed of ultrasonic oscillation elements 13d and 13e are disposed in this order in the transport direction.

As described, the ultrasonic nozzles 84A and 84B are provided below the glass substrate 10 with a predetermined angle α with respect to the lower surface thereof. That is, the entire disposition arrangement of the ultrasonic oscillation elements 13 provided in the ultrasonic nozzles 84A and 84B in the present embodiment is obtained from the entire disposition arrangement of the ultrasonic oscillation elements 13 in the Third Embodiment (1) by exchanging in place the element array 133A and element array 133B, and (2) by rotating each ultrasonic oscillation element 13 about the central axis of the same extending in the width direction by angle α in the same-direction.

Thus, the ultrasonic oscillation elements 13 are disposed to satisfy the entire disposition arrangements (A) and (B) as described in the Third Embodiment. That is, the ultrasonic oscillation elements 13 are disposed so that the projection area (equivalent to projection area A; not shown) which is obtained by projecting all the ultrasonic oscillation elements 13 on a place perpendicular to the transport direction of the glass substrate 10 takes a single continuous shape and that the ultrasonic oscillation elements 13 have width D1 which is larger than the projection area (equivalent to projection area B; not shown) which is obtained by projecting any one of the ultrasonic oscillation elements 13a through 13e on the place perpendicular to the transport direction.

Also, the five ultrasonic oscillation elements 13 are formed so that the width D1 of the projection area is the same as or larger than the width D2 (400 mm in the present embodiment) of the ultrasonic target region of imps the glass substrate 10 (entire upper surface of the glass substrate 10 in the present embodiment). Further, the ultrasonic oscillation elements 13a through 13c of the element array 133A and the ultrasonic oscillation elements 13d and 13e of the element arrays 133B adjacent to the element array 133A are disposed in a staggered fashion with a superimposition region 221b (only one is shown).

With this entire disposition arrangement of the ultrasonic oscillation elements 13, the ultrasonic unprojected region, which is generated when the ultrasonic wave is projected on the glass substrate 10 from the element array 133A, can be covered by the ultrasonic wave which is projected from the element array 133B. Thus, it is possible to uniformly project the ultrasonic wave over the entire upper surface of the glass substrate 10 even when the width of the ultrasonic target region of the glass substrate 10 is larger than the size of the ultrasonic oscillation elements 13.

As a result, the photoresist 88 formed on the upper surface of the glass substrate 10 (also, photoresist adhered on the back surface and elsewhere of the resist-processed surface) can be stripped further uniformly, thus further improving the resist stripping effect than conventionally and reducing time for the resist stripping process. Further, because the liquid 85 is supplied, the photoresist 88 which was stripped and removed from the upper surface is prevented from running onto and adhering again on the lower surface. Note that, as described in the Third and other embodiments, conventional ultrasonic oscillation elements such as those available as standard products may be used.

Also, the type of ultrasonic oscillation elements 13 used, correspondence of the ultrasonic oscillation elements 13 and liquid supply openings 86, distance d1 between ultrasonic oscillation elements 13, and width d2 of the superimposition region 221b, etc., are as described in the Third Embodiments and explanations thereof are omitted here.

Figure 34:
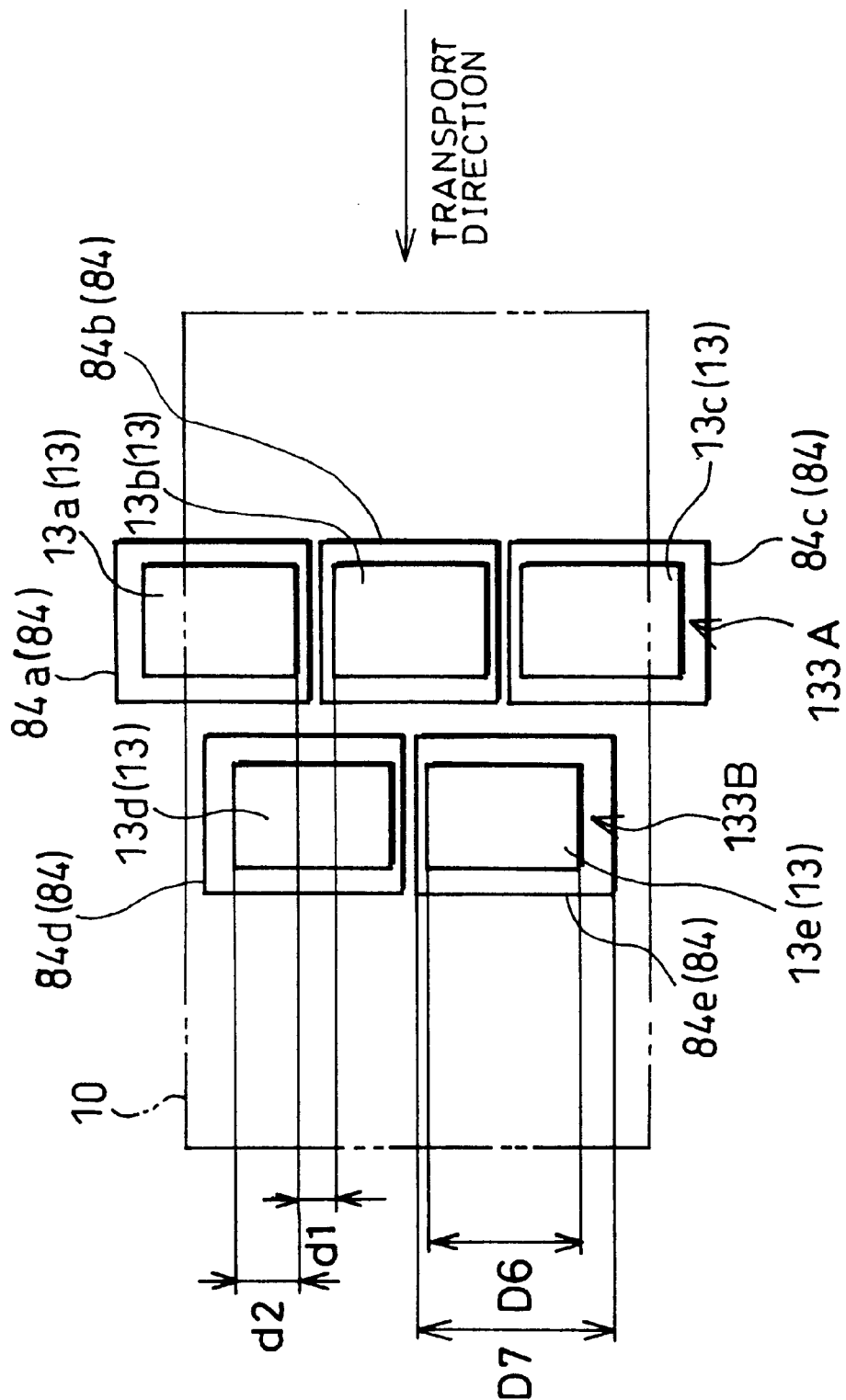
FIG. 34 is an explanatory view illustrating from the vertical direction still another example of an arrangement of ultrasonic oscillation elements in the ultrasonic processing device shown in FIG. 32.
Figure 35:
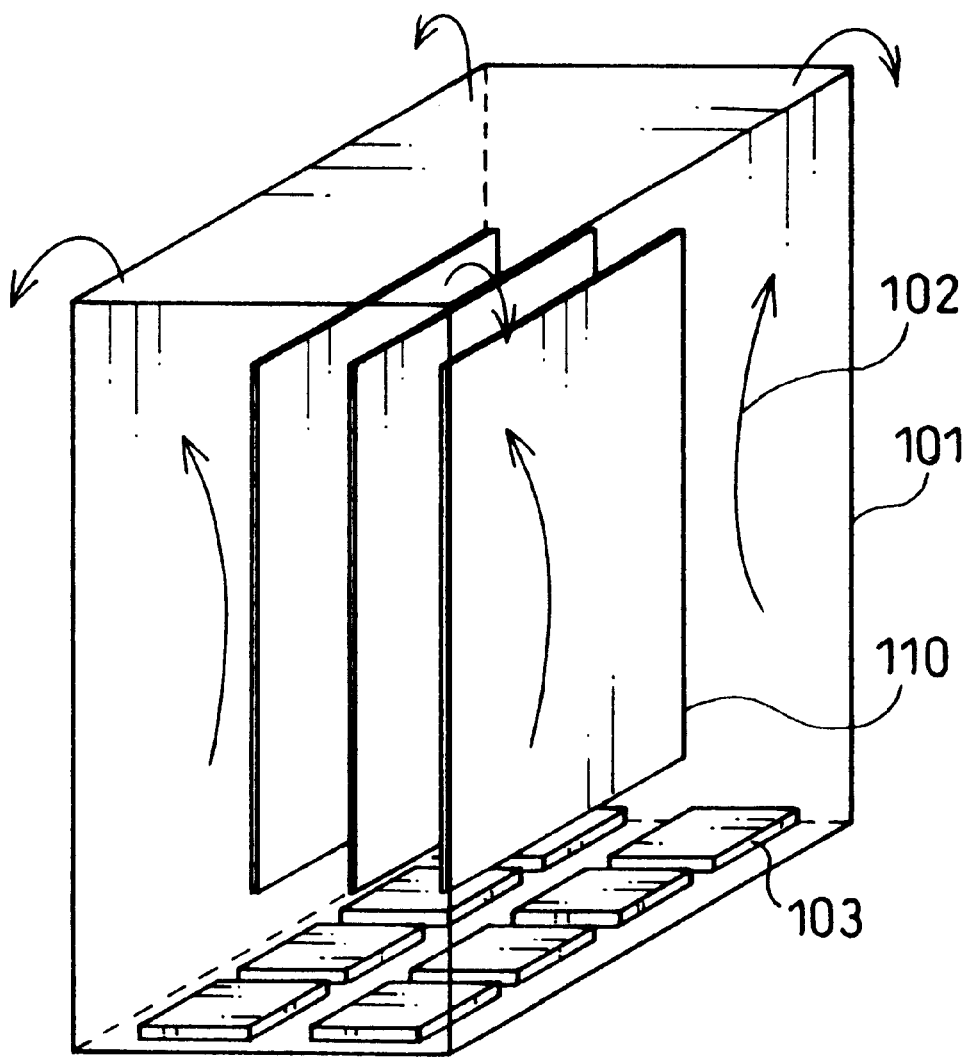
FIG. 35 is an explanatory view illustrating an example of an arrangement of a conventional batch-type ultrasonic processing device.
Figure 36:
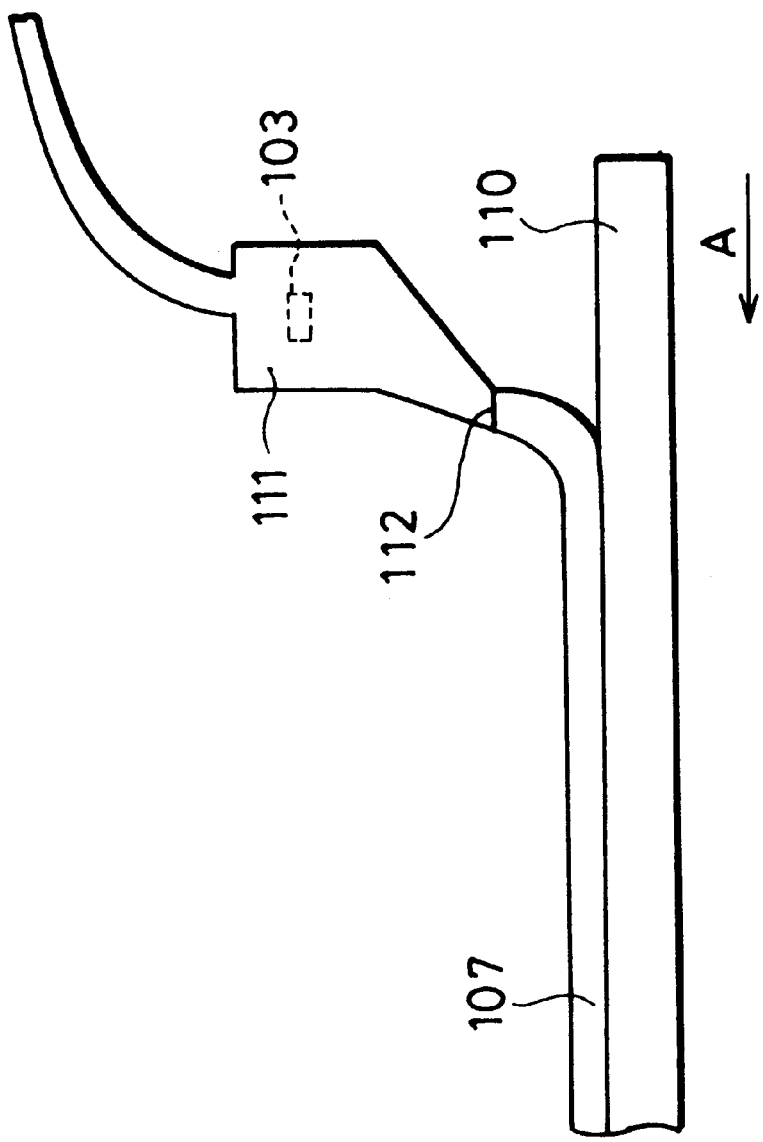
FIG. 36 is an explanatory view illustrating an example of an arrangement of a conventional nozzle-type ultrasonic processing device.
Figure 37:
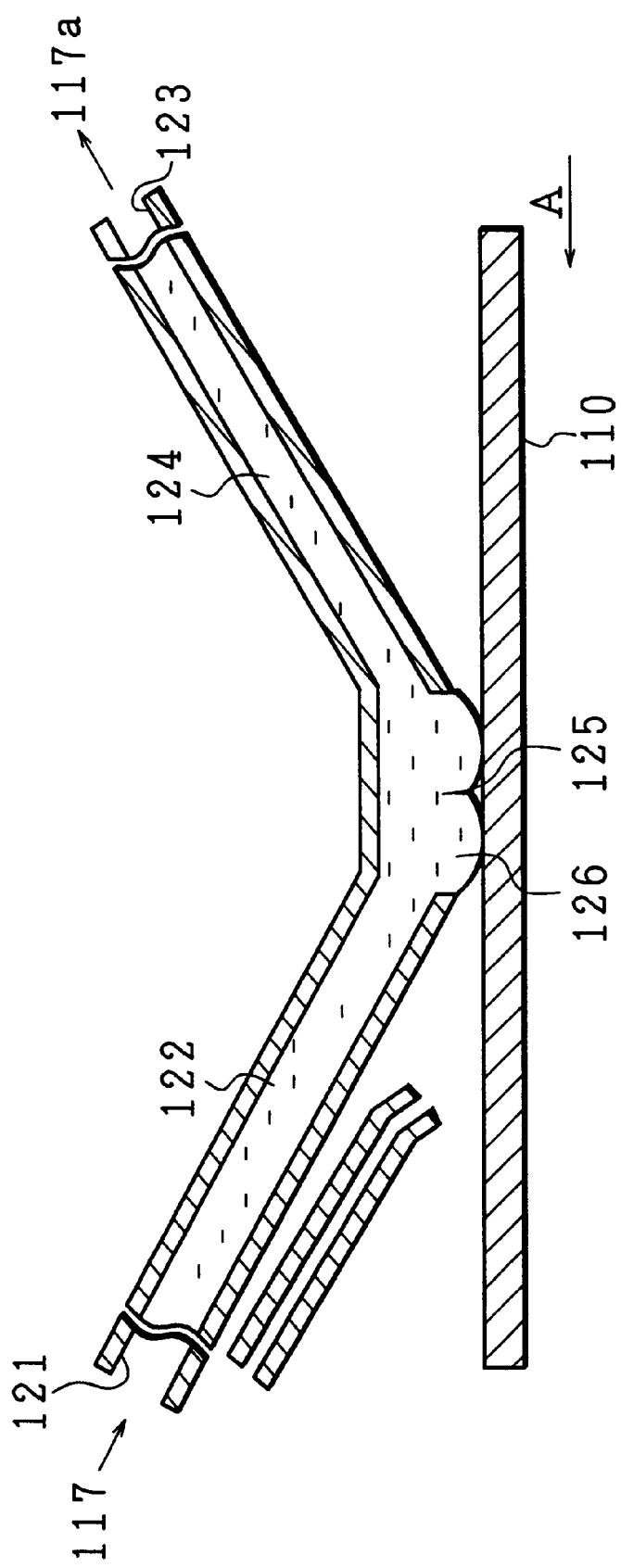
FIG. 37 is an explanatory view illustrating a basic arrangement of a conventional wet processing device.
Figure 38:
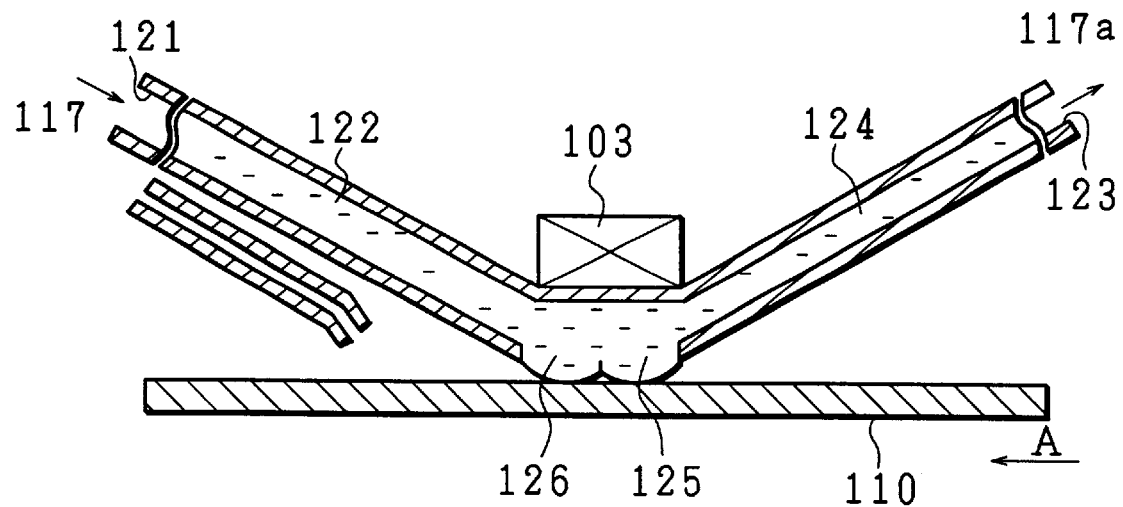
FIGS. 38(a) and 38(b) are explanatory views illustrating examples of an arrangement of the wet processing device shown in FIG. 37 that includes ultrasonic oscillation elements.
Figure 38:
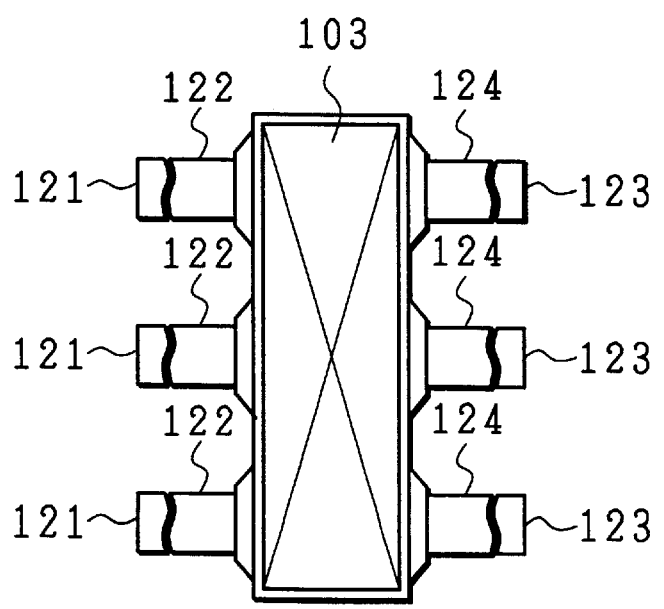
Figure 39:
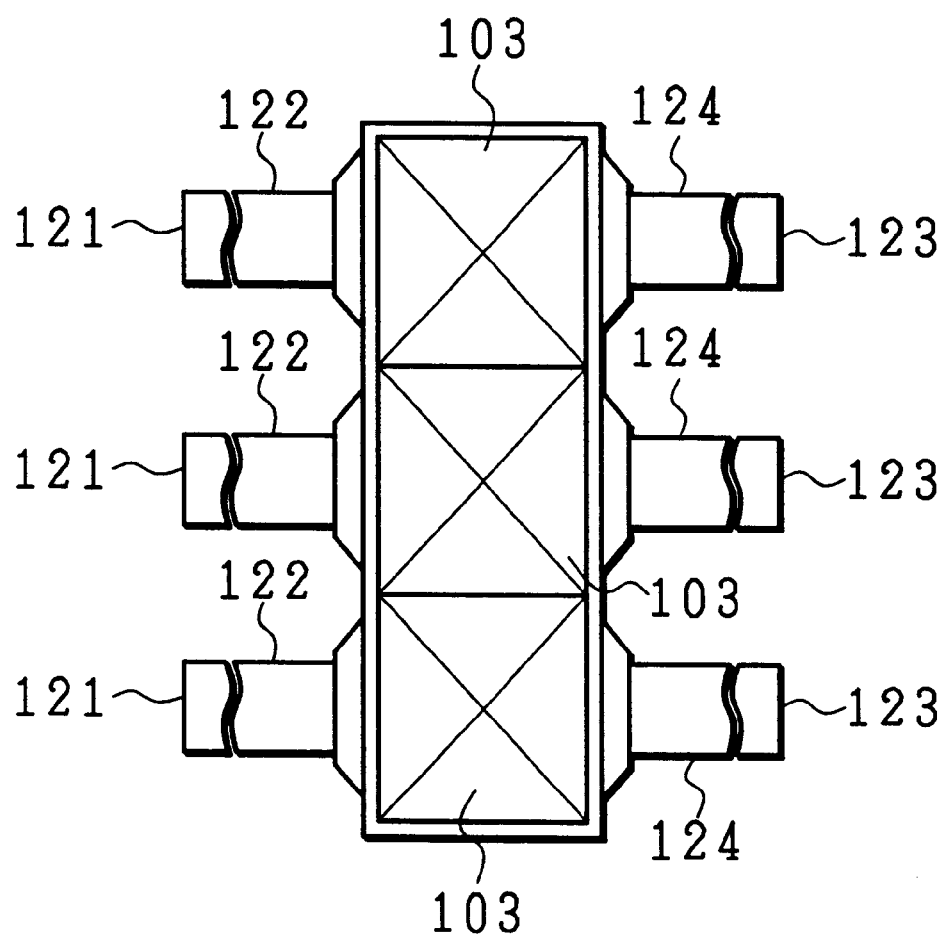
FIG. 39 is an explanatory view illustrating another example of the arrangement of the wet processing device shown in FIG. 37 that includes ultrasonic oscillation elements.
Figure 40:
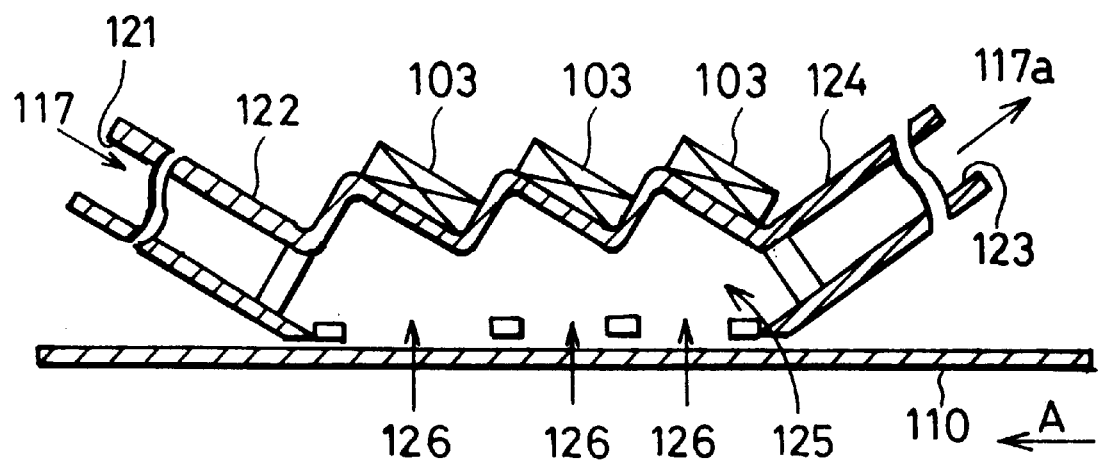
FIGS. 40(a) and 40(b) are explanatory views illustrating still another example of the arrangement of the wet processing device shown in FIG. 37 that includes ultrasonic oscillation elements.
Figure 40:
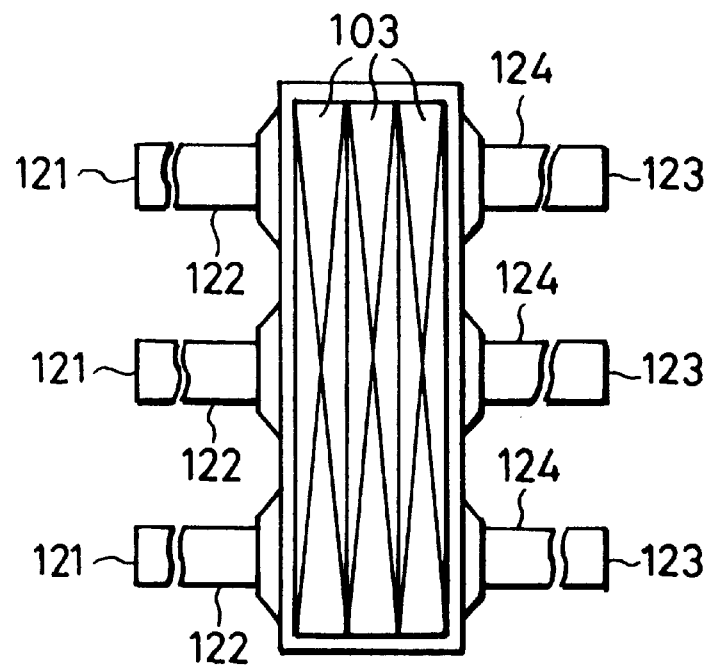
Figure 41:
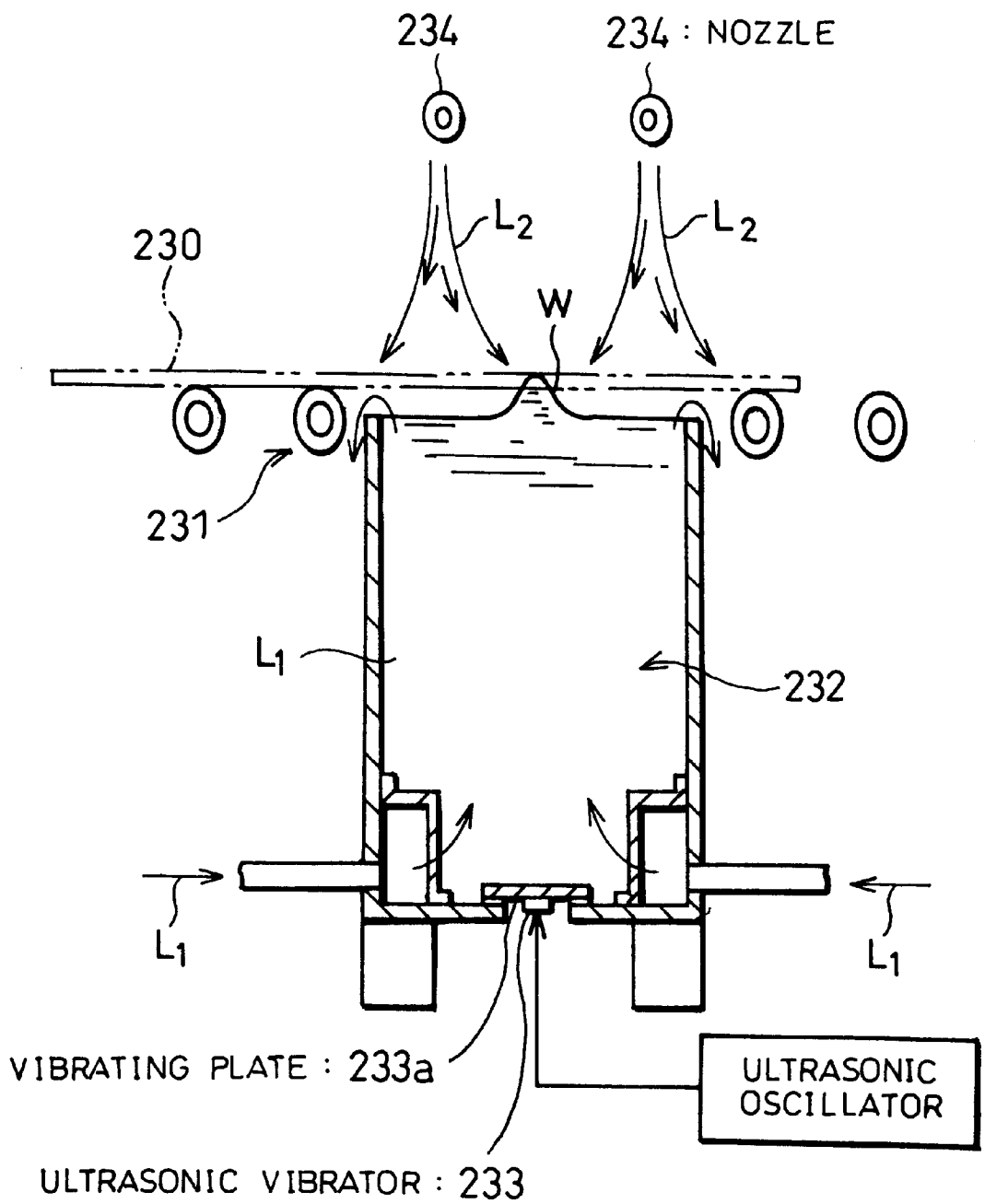
FIG. 41 is an explanatory view illustrating an example of an arrangement of another conventional ultrasonic processing device.
Figure 42:
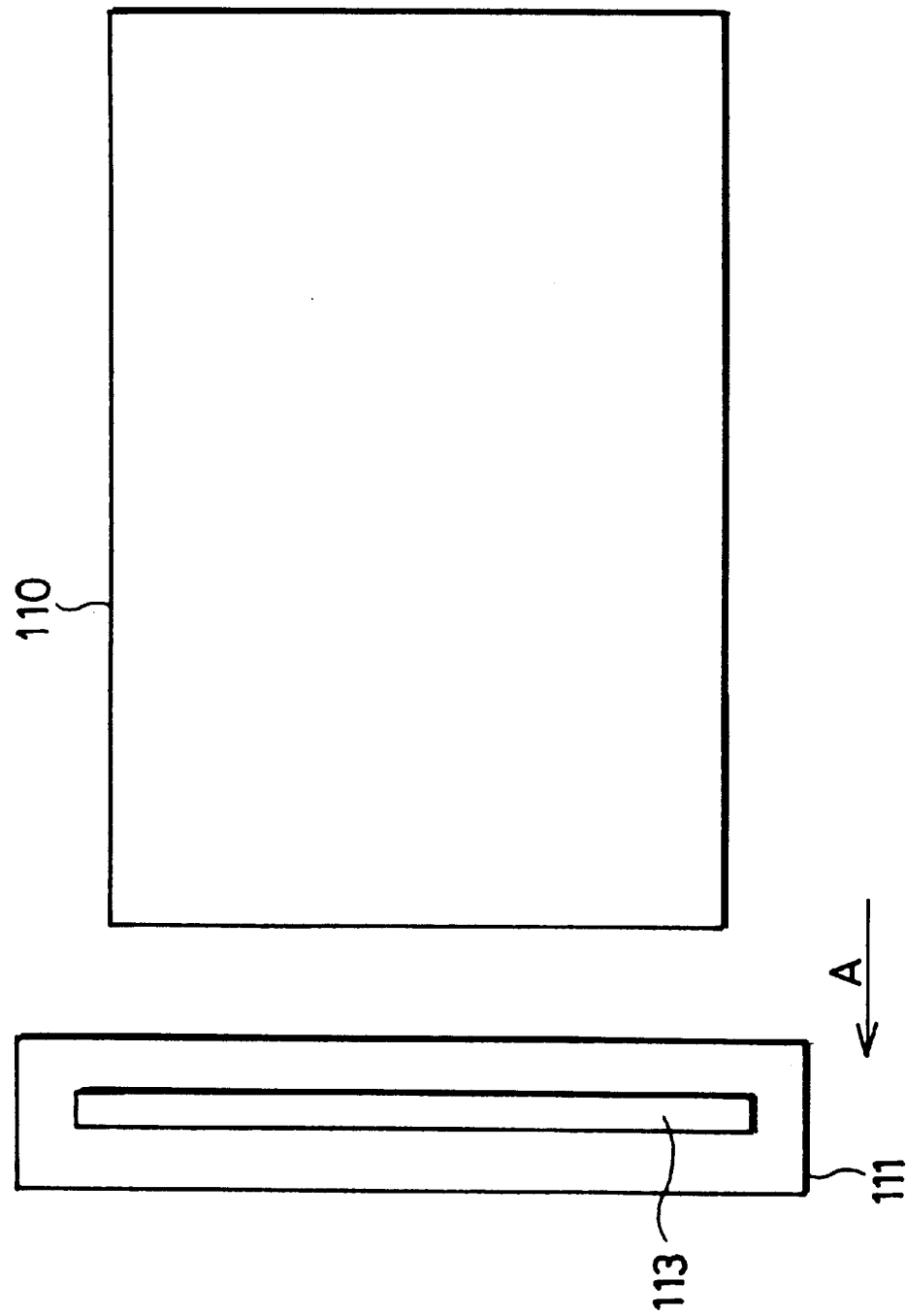
FIG. 42 is an explanatory view illustrating an ideal state of position relationship between the ultrasonic oscillation elements and a substrate in the nozzle-type ultrasonic processing device shown in FIG. 36.
Figure 43:
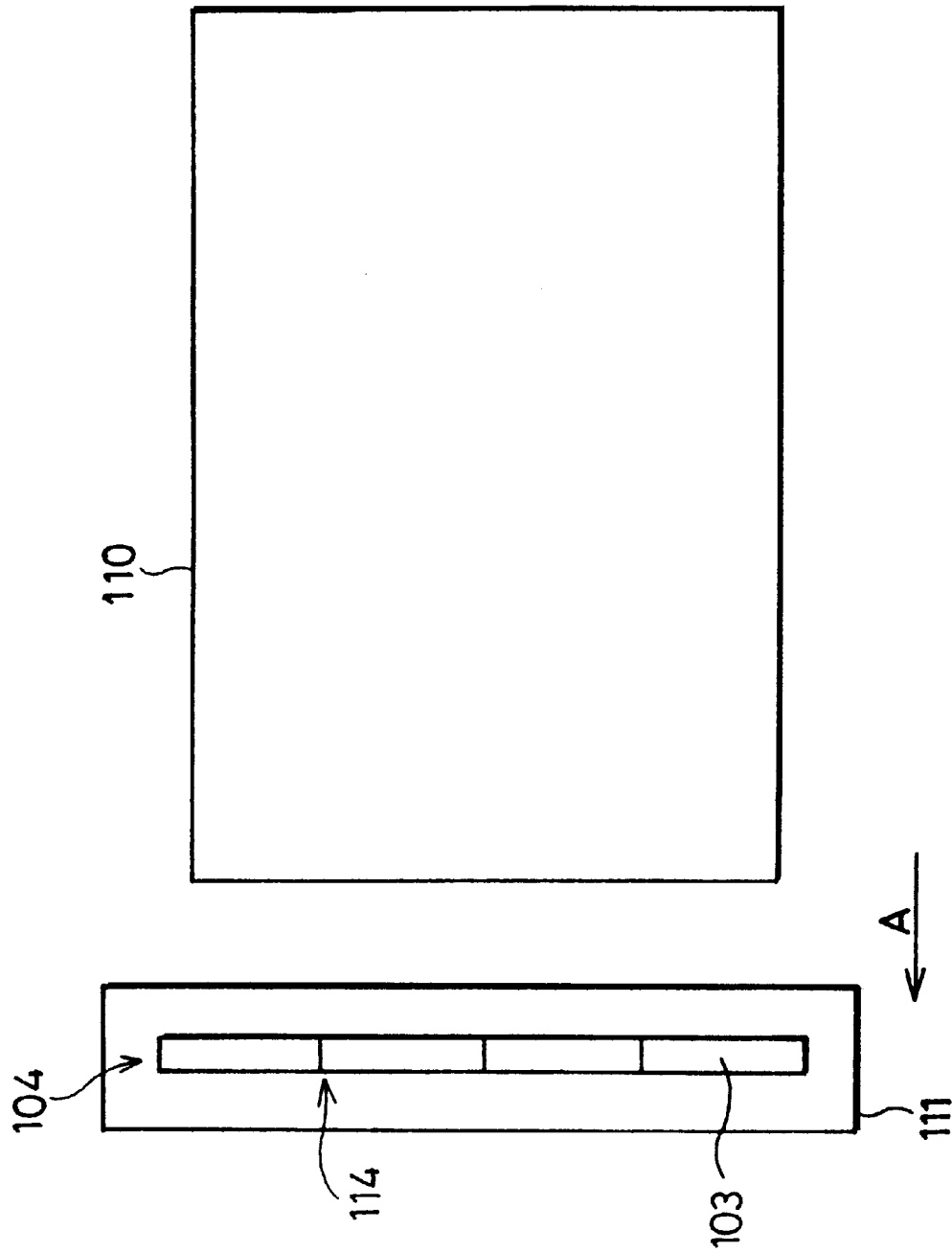
FIG. 43 is an explanatory view illustrating an example of actual position relationship between ultrasonic oscillation elements and a substrate in the nozzle-type ultrasonic processing device shown in FIG. 36.
Figure 44:
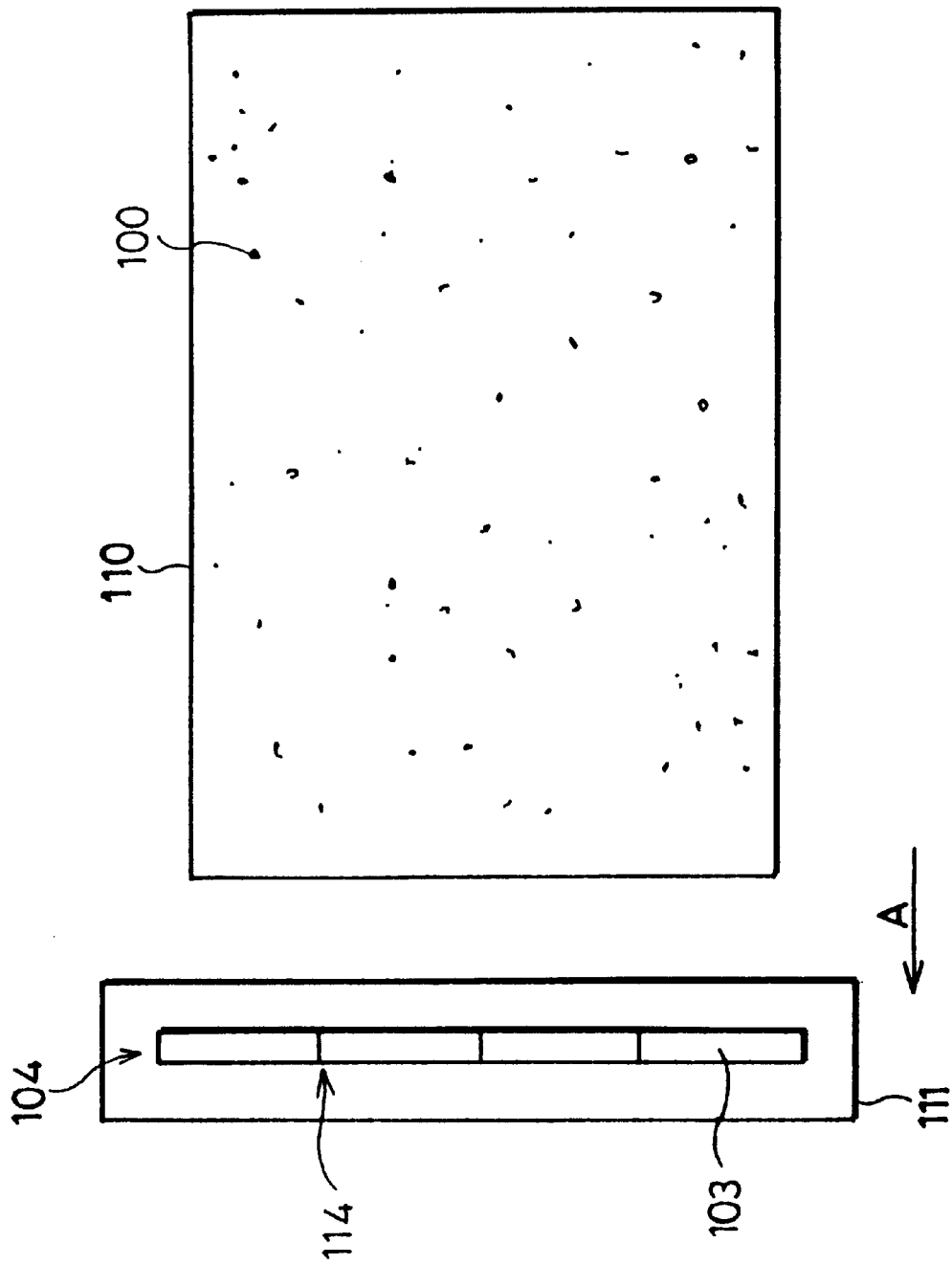
FIG. 44 is an explanatory view illustrating an example of a state in which a substrate cleaning operation is carried out by means of the nozzle-type ultrasonic processing device shown in FIG. 43.
Figure 45A:
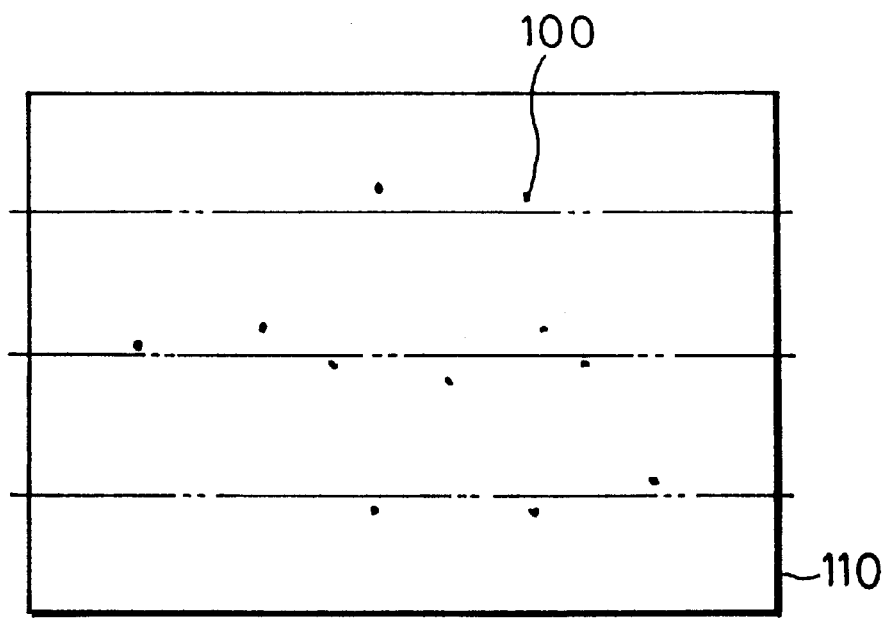
FIG. 45(a) is an explanatory view illustrating a result of a cleaning operation applied to the substrate shown in FIG. 44 for a predetermined time (time of t)
Figure 45B:
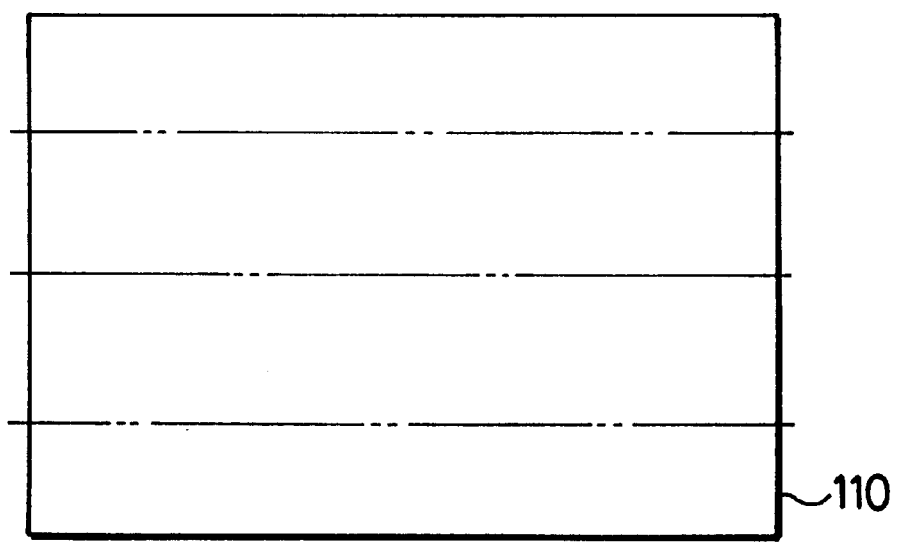
FIG. 45(b) is an explanatory view illustrating a result of a cleaning operation applied to the substrate shown in FIG. 44 for a time not less than twice of the foregoing predetermined time (time of not less than 2 t).
Figure 46:
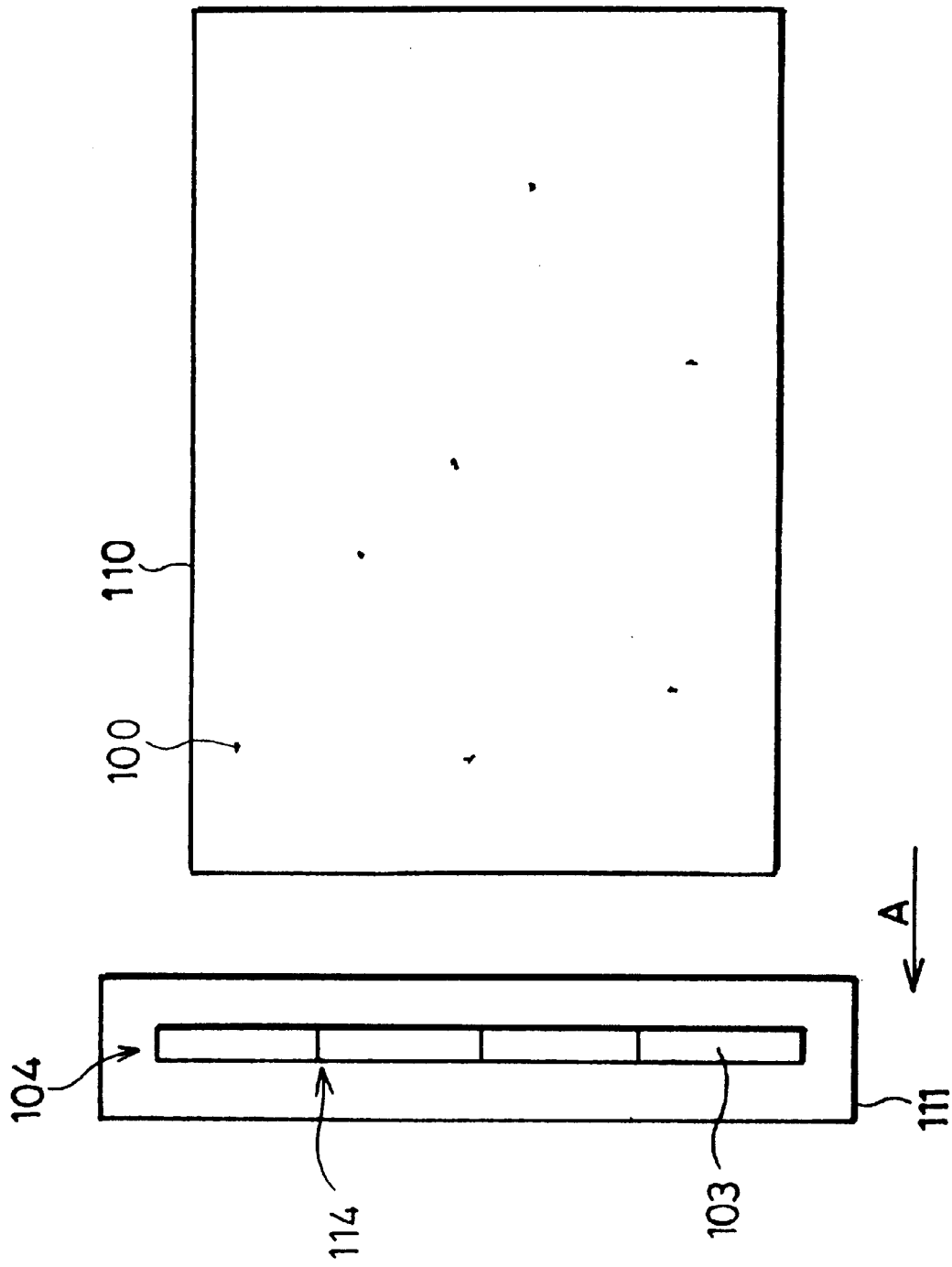
FIG. 46 is an explanatory view illustrating another example of the state in which a substrate cleaning operation is carried out by means of the nozzle-type ultrasonic processing device shown in FIG. 43.
Figure 47A:
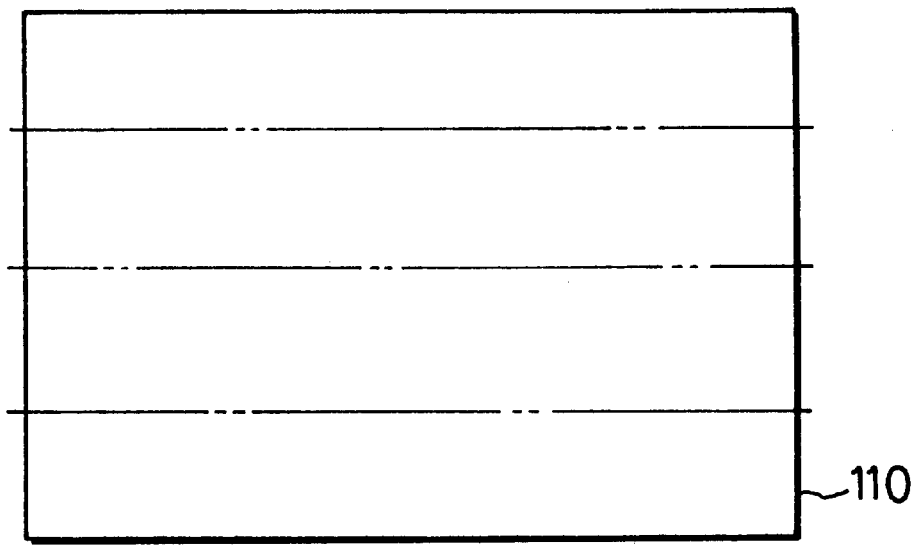
FIG. 47(*a*) is an explanatory view illustrating a result of a cleaning operation applied to the substrate shown in FIG. 46 for a predetermined time (time of t), and FIG. 47(*b*) is an explanatory view illustrating a result of a cleaning operation applied to the substrate shown in FIG. 44 for a time not less than twice of the foregoing predetermined time (time of not less than 2 t).
Figure 47B:
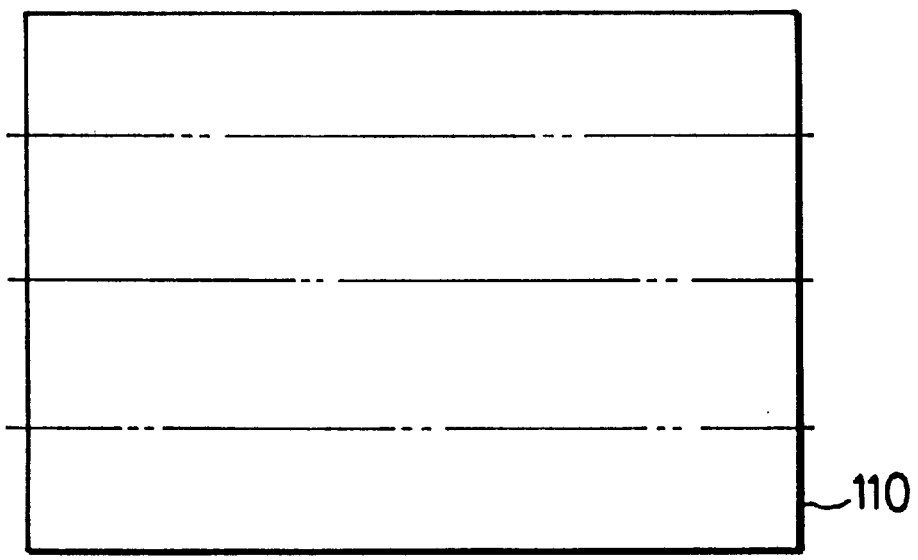
Figure 49A:
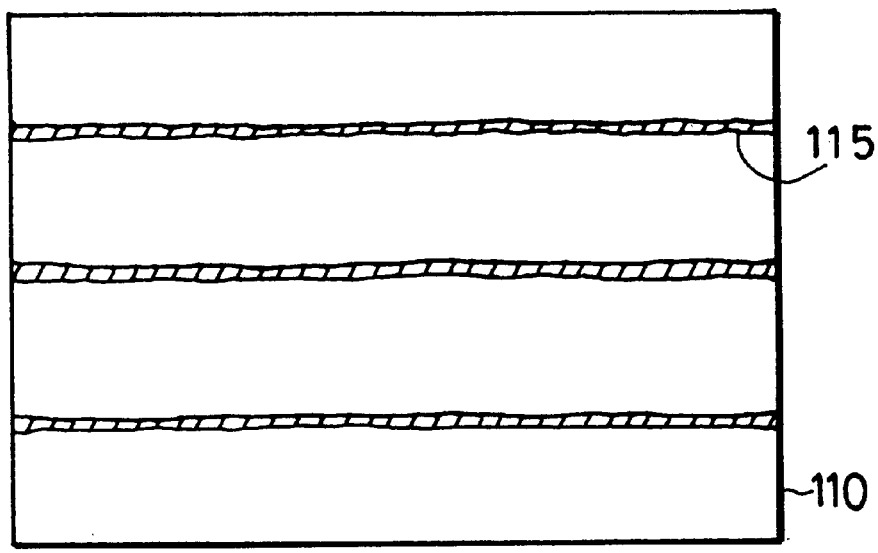
FIG. 49(*a*) is an explanatory view illustrating a result of a resist-processing operation applied to the substrate shown in FIG. 48 for a predetermined time (time of t), and FIG. 49(*b*) is an explanatory view illustrating a result of a resist-stripping operation applied to the substrate shown in FIG. 48 for a time not less than twice of the foregoing predetermined time (time of not less than 2 t).
Figure 49B:
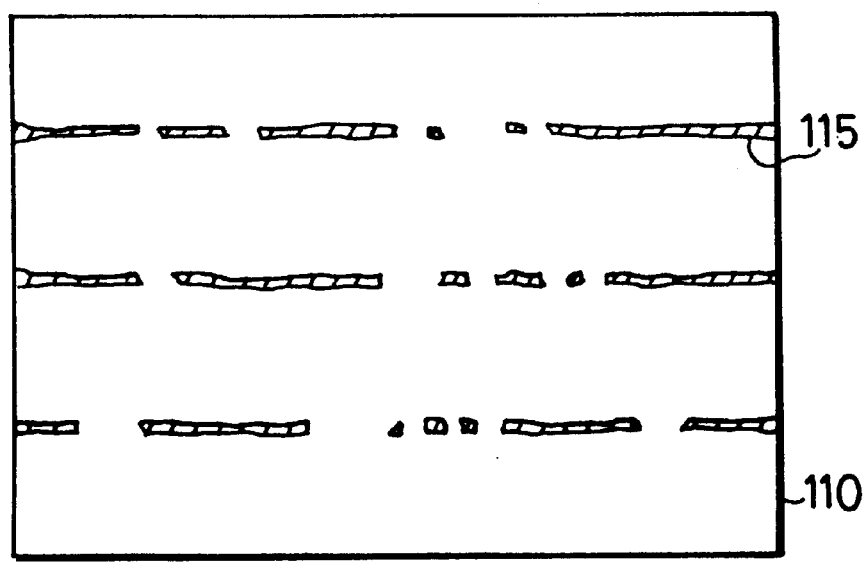

Incidentally, the number of ultrasonic nozzles 84 provided is not particularly limited, and, as shown in FIG. 34, for example, the ultrasonic oscillation element 13 may be provided for each of the five ultrasonic nozzles 84 one by one. More specifically, it is possible to have an arrangement wherein the ultrasonic nozzles 84a through 84e are provided with the ultrasonic oscillation elements 13a through 13e, respectively, corresponding one to one in this order.

The ultrasonic nozzles 84a through 84e are all provided with a slope of a predetermined angle α with respect to the lower surface of the glass substrate 10, as described. That is, in the present embodiment, as with the entire disposition arrangement of the ultrasonic oscillation elements 13 provided in the ultrasonic nozzles 84A and 84B, the entire disposition arrangement of the ultrasonic oscillation elements 13 provided in the ultrasonic nozzles 84a through 84e is obtained from the entire disposition arrangement of the ultrasonic oscillation elements 13 of the Third Embodiment (1) by exchanging in place the element array 133A and element array 133B, and (2) by rotating each ultrasonic oscillation element 13 about the central axis of the same extending in the width direction by angle α in the same direction, and therefore detailed explanations thereof are omitted here. That is, the ultrasonic oscillation elements 13 are disposed to satisfy the entire disposition arrangements (A) and (B) as described in the Third Embodiment.

The following will describe correspondence between the ultrasonic oscillation elements 13 and the liquid supply openings 86 based on the exemplified relationship between the ultrasonic oscillation element 13e and the liquid supply opening 86 of the ultrasonic nozzle 84 corresponding to the ultrasonic oscillation element 13e.

As shown in FIG. 34, the correspondence of these two elements is such that the width D7 of the liquid supply opening 86 corresponding to the ultrasonic oscillation element 13e is the same as or greater than the maximum extended width D6 of the projection area (equivalent to projection area C; not shown) which is obtained by projecting the corresponding ultrasonic oscillation element 13e on a plane perpendicular to the transport direction of the glass substrate 10. With this arrangement, the liquid 85 which was projected with the ultrasonic wave by the ultrasonic oscillation element 13e is supplied to the lower surface of the glass substrate 10 without being converged in the width direction by the liquid supply opening 86. Similarly, the liquid 85 which was projected with the ultrasonic wave by the ultrasonic oscillation elements 13a through 13d is supplied to the lower surface of the glass substrate 10 without being converged in the width direction by the liquid supply openings 86 of their corresponding ultrasonic oscillation elements 13.

Thus, with the entire disposition arrangement of the foregoing ultrasonic oscillation elements 13, the ultrasonic unprojected region, which is generated when the ultrasonic wave is projected on the glass substrate 10 from the element array 133A, can also be covered by the ultrasonic wave projected from the element array 133B. However, as shown in FIG. 33 and elsewhere, with the arrangement in which the plurality of ultrasonic oscillation elements 13 are provided for a single ultrasonic nozzle 84, it becomes easier to realize a uniform propagation state of the ultrasonic wave with respect to the flow of the liquid 85 or the glass substrate 10 along the width direction of the glass substrate 10, thereby stripping the photoresist 88 further uniformly in the width direction.

Further, in the present embodiment, the ultrasonic oscillation elements 13 are provided in the flow path of the liquid 85 (more specifically, in the ultrasonic nozzle 84), on the upstream side of the liquid supply opening 86 provided on the ultrasonic nozzle 84, and the flow path is configured such that the portion on the downstream side of the ultrasonic oscillation elements 13 extends upward with an incline from the upstream side to the downstream side, more specifically, with an angle α with respect to the horizontal plane.

Because the flow path positioned on the downstream side of the ultrasonic oscillation elements 13 extends upward with an incline, when supplying the liquid 85, air bubbles which are generated when the ultrasonic oscillation elements 13 come into operation are easily drained on the downstream side with the liquid 85. Also, the air bubbles which were drained once on the downstream side of the ultrasonic oscillation elements 13 do not enter the vicinity of the ultrasonic oscillation elements 13. Thus, with the foregoing arrangement, air bubbles are prevented from staying in the vicinity (surface of) the ultrasonic oscillation elements 13. Further, since the ultrasonic elements 13 are provided in the ultrasonic nozzle 84 as described, the ultrasonic wave projected on the liquid 85 is propagated to the upper and lower surfaces of the glass substrate 10 without attenuating.

Note that, the portion on the downstream side of the ultrasonic oscillation elements 13 is not just limited to the structure extending upward with an incline from the upstream side to the down stream side, and the foregoing effect can be obtained as long as the structure extends in a direction between the horizontal direction and the upward direction.

The glass substrate 10 transported out of the second stripping section is transported to the rinsing section. The rinsing section is provided to replace a residual resist-stripping liquid on the glass substrate 10 with a rinsing liquid composed of a DMSO liquid, and to prevent the resist-stripping liquid or photoresist from being carried over to the water cleaning section of the downstream side. That is, the rinsing section is provided for the purpose of preventing the problems of (1) wire corrosion (especially those made of aluminum material) on the glass substrate 11 by the pure water stored in the water cleaning section which came to have an alkaline property, and (2) increasing burden on the drain processing equipment, etc. Note that, in the present embodiment, the resist-stripping liquid 83 is continuously supplied from the stripping liquid supply shower nozzles 82, and thus all the photoresist 88 which was removed and dissolved has already been washed off from the resist-processed surface at the time when inserted into the rinsing section.

In the water cleaning section provided on the downstream side of the rinsing section, first, the rinsing liquid is removed by washing through showers from the upper and lower directions of the glass substrate 10. Then, particles such as organic substances adhered on the glass substrate 10 are removed by a megasonic shower.

The glass substrate 10 thus washed in the water cleaning section is then wiped and dried on the both sides by an air knife provided in the drying section, and then stored in the cassette by the unloader section to finish the resist stripping process. The resist stripping process is repeated 5 to 7 times in manufacture of a TFT (Thin Film Transistor) substrate.

Note that, in the second stripping section, means for transporting the glass substrate 10 is not just limited to the transport rollers 51. Further, when the stripping liquid supply shower nozzles 82 are provided with respect to almost the entire surface of the resist-processed surface of the glass substrate 10, transport of the glass substrate 10 may be stopped when supplying the resist-stripping liquid 83.

Also, in order to project the ultrasonic wave on the resist-stripping liquid 83 supplied from the stripping liquid shower nozzles 82, the ultrasonic oscillation element may be provided in the processing liquid supply means. Further, the ultrasonic processing device in accordance with the present embodiment is also applicable to the ultrasonic washing process in manufacture of electrical components, for example, by using a washing liquid instead of the resist-stripping liquid 83 and liquid 85.

As described above, an ultrasonic processing device in accordance with the present invention includes a plurality of vibrating elements that generate ultrasonic, and projects ultrasonic from the ultrasonic oscillation elements to an ultrasonic processing target region of a processing object that moves in a predetermined motion direction so that ultrasonic-projected regions with a predetermined width each in a width direction substantially orthogonal to the motion direction are formed, wherein a whole arrangement of the plurality of vibrating elements planarly extend in the predetermined direction and in the width direction, and is arranged so that projection regions obtained by projecting the vibrating elements to a plane on the motion direction side form a belt-like region of a width exceeding a width of the ultrasonic processing target region.

According to the foregoing arrangement, a plurality of vibrating elements are arranged so that the foregoing belt-like region, ultrasonic is projected throughout the entirety of the ultrasonic processing target region non-defectively. Therefore, this ensures uniform projection of ultrasonic to a large-are region by means of vibrating elements that are easy to get and have high reliability, such as standard products or quasi-standard product.

Therefore, a uniform ultrasonic processing operation with respect to an entirety of a surface of a processing object in a large size can be realized, and ultrasonic processing operations can be uniformly applied to a plurality of processing objects under the same conditions. Consequently, it is possible to realize a uniform ultrasonic processing operation of high performance. Besides, since the processing time can be shortened, processing costs can be reduced.

The ultrasonic processing device of the present invention arranged as above may be further arranged so that the plurality of vibrating elements compose a plurality of element arrays provided in the width direction, the element arrays being provided in parallel in the motion direction, and that, when the plurality of element arrays are projected to the plane on the motion direction side, projection regions of the vibrating elements composing one of the element arrays and projection regions of the vibrating elements composing another one of the element arrays overlap each other, forming superimposition regions.

According to the foregoing arrangement, the vibrating elements composing the element arrays are arranged so that when they are projected on the foregoing plane, their projected figures form a belt-like region in which the projected figures partly overlap each other. Therefore, ultrasonic is projected so that the projected figures should have superimposition regions, thereby further ensuring ultrasonic projection throughout the entirety of the foregoing ultrasonic processing target region. Consequently, the aforementioned effect can be further enhanced.

The ultrasonic processing device in accordance with the present invention arranged as above may be further arranged so that the plurality of vibrating elements compose a plurality of element arrays provided in the width direction, the element arrays being provided in parallel in the motion direction, and that the vibrating elements composing one of the element arrays are placed at positions corresponding to insulating regions provided between the vibrating elements composing another one of the element arrays.

According to the foregoing arrangement, viewing the whole arrangement of the vibrating elements composing the element arrays, the vibrating elements are arranged in a stagger form. Therefore, even if non-projection regions are produced by insulating regions of one element array, the non-projection regions can be subjected to ultrasonic projected from another element array. Therefore, it is possible to further surely project ultrasonic throughout the entirety of the ultrasonic processing target region. Consequently, the above-described effects can be further enhanced.

The ultrasonic processing device in accordance with the present invention may be further arranged so as to include processing liquid supply means for supplying processing liquid used for applying a predetermined processing operation to the processing object.

According to the foregoing arrangement, usage of processing liquid ensures projection of ultrasonic to the processing object via the processing liquid, thereby resulting in that processing operations can be effectively applied to the processing object.

The ultrasonic processing device in accordance with the present invention may be further arranged so that the vibrating elements are arranged so as to project ultrasonic to the processing object via the processing liquid, as well as may be further arranged so as to include nozzle means for converging the processing liquid in the motion direction and supply the same to an entire width-direction dimension of the processing object.

According to the foregoing arrangement, since the ultrasonic is projected to the processing object via the processing liquid, and further, output of ultrasonic is converged by the nozzle means, the output of ultrasonic is intensified, thereby resulting in further improvement of the efficiency of various processing operations.

The ultrasonic processing device in accordance with the present invention is preferably arranged so that a frequency of ultrasonic projected by the vibrating elements is in a range of not less than 0.1 MHz and not more than 5 MHz.

According to the foregoing arrangement, the frequency is set, for example, so as to be desirable for an ultrasonic cleaning operation, or resist-stripping operation. Therefore, damage of the processing object or changes to characteristics of circuit elements provided in the processing object can be avoided, thereby ensuring efficient processing operations.

The ultrasonic processing device in accordance with the present invention arranged as above is more preferably arranged so as to include heating means for heating the processing liquid.

The foregoing arrangement causes the processing liquid heated to be brought into contact with the processing object, thereby allowing various processing operations to be more surely and efficiently carried out due to thermal stress.

The ultrasonic processing device in accordance with the present invention arranged as above may be further arranged so that the processing liquid supply means is arranged so as to supply processing liquid to both upper and lower surfaces of the processing object, and that ultrasonic is projected by the vibrating elements to the processing liquid supplied to the upper surface.

The foregoing arrangement allows the processing operation to be applied to the processing object from below and above both, thereby ensuring that foreign substances removed from an upper surface thereof are prevented from going round to a lower surface thereof and adhering thereto, and further improving the processing efficiency.

The ultrasonic processing device in accordance with the present invention arranged as above may be further arranged so that the processing liquid is cleaning liquid for cleaning the processing object, or resist-stripping liquid for stripping resist formed on a surface of the processing object.

Any one of the foregoing arrangements ensures that the ultrasonic processing device of the present invention can be suitably used as an ultrasonic cleaning device or a resist-stripping device.

An ultrasonic processing device in accordance with the present invention includes a plurality of vibrating elements that generate ultrasonic, and projects ultrasonic from the ultrasonic oscillation elements to an ultrasonic processing target region of a processing object that moves in a predetermined motion direction so that ultrasonic-projected regions with a predetermined width each in a width direction substantially orthogonal to the motion direction are formed, wherein the plurality of vibrating elements are provided in the width direction and compose a plurality of element arrays in each of which element spaces are formed, to a predetermined width each, between the vibrating elements, the element arrays being provided in parallel in the motion direction, and furthermore the ultrasonic processing device may be further arranged so that at positions corresponding to non-provision regions including the element spaces in one of the element arrays, the vibrating elements composing another one of the element arrays are placed, and that the width of the element space exceeds an insulation distance for insulation between the vibrating elements.

According to the foregoing arrangement, a plurality of vibrating elements are provided so as to cover element spaces each other. Therefore, ultrasonic can be projected non-defectively through out an entirety of an ultrasonic processing target region of a predetermined width. Therefore, this ensures uniform projection of ultrasonic to a large-are region by means of vibrating elements that are easy to get and have high reliability, such as standard products or quasi-standard product.

As a result, a uniform ultrasonic processing operation with respect to an entirety of a surface of a processing object in a large size can be surely and efficiently realized, and ultrasonic processing operations can be uniformly applied to a plurality of processing objects under the same conditions. Consequently, it is possible to realize a uniform ultrasonic processing operation of high performance. Besides, since the processing time can be shortened, processing costs can be reduced.

Furthermore, since each element space has a width greater than an insulating distance, this results in that the vibrating elements can be provided at sufficient distances from each other. Therefore, this enables stable generation of ultrasonic by drastically suppressing the interference effect. Furthermore, this allows the number of elements to be decreased as compared with a state in which the elements are densely provided, and makes it possible to further simplify the power supply system and control system for the vibrating elements.

In other words, by securing sufficient distances between the vibrating elements, the vibrating elements can be surely controlled, while the control system can be simplified.

An ultrasonic processing device in accordance with the present invention includes a plurality of vibrating elements that generate ultrasonic, and projects ultrasonic from the ultrasonic oscillation elements to an ultrasonic processing target region of a processing object that moves in a predetermined motion direction so that ultrasonic-projected regions with a predetermined width each in a width direction substantially orthogonal to the motion direction are formed, wherein the plurality of vibrating elements are provided in the width direction and compose a plurality of element arrays in each of which element spaces are formed, to a predetermined width each, between the vibrating elements, the element arrays being provided in parallel in the motion direction, and furthermore the ultrasonic processing device may be further arranged so that (i) at positions corresponding to non-projection regions including the element spaces of the vibrating elements in one element array in a k'th line (k: natural number), the vibrating elements composing one element array in a k+1'th line are placed, and that (ii) when $(n-1)M \leq L < nM$ is satisfied where Lmm is a width of the ultrasonic processing target region of the processing object, Mmm is a dimension of the vibrating element, and besides, n is a natural number (n>2), the number of the vibrating elements composing the element array in the k'th line and the number of the vibrating elements composing the element array in the k+1'th line are set to $(n+1)/2$ and $(n-1)/2$, respectively, when n is an odd number, while the numbers of the vibrating elements composing the element arrays in the k'th and k+1'th lines are set to n/2 each, when n is an even number.

According to the foregoing arrangement, a plurality of vibrating elements are provided so as to cover element spaces each other. Therefore, ultrasonic can be projected non-defectively through out an entirety of an ultrasonic processing target region of a predetermined width. Therefore, this ensures uniform projection of ultrasonic to a large-are region by means of vibrating elements that are easy to get and have high reliability, such as standard products or quasi-standard product.

As a result, a uniform ultrasonic processing operation with respect to an entirety of a surface of a processing object in a large size can be surely and efficiently realized, and ultrasonic processing operations can be uniformly applied to a plurality of processing objects under the same conditions. Consequently, it is possible to realize a uniform ultrasonic processing operation of high performance. Besides, since the processing time can be shortened, processing costs can be reduced.

Furthermore, since the number of the vibrating elements composing each element array is determined, each element space between the vibrating elements can be maximized and secured. Therefore, this enables stable generation of ultrasonic by drastically suppressing the interference effect. Furthermore, this allows the number of elements to be decreased as compared with a state in which the elements are densely provided, and makes it possible to further simplify the power supply system and control system for the vibrating elements.

The ultrasonic processing device in accordance with the present invention arranged as above may be further arranged so that when the plurality of element arrays are projected to the plane on the motion direction side, projection regions of the vibrating elements composing one of the element arrays and projection regions of the vibrating elements composing another one of the element arrays overlap each other, forming superimposition regions, and that a width of each superimposition region is in a range of more than the insulation distance and less than ¼ of a dimension of one vibrating element.

The foregoing arrangement in which a plurality of vibrating elements are arranged so that their projected figures have superimposition regions and form a single belt-like region causes ultrasonic to be non-defectively projected throughout an entirety of the ultrasonic processing target region. This further makes it possible to realize uniform ultrasonic processing operations by means of vibrating elements that are easy to get and have high reliability, thereby realizing uniform ultrasonic processing operations of higher performance. Besides, since the processing time can be shortened, processing costs can be reduced.

Furthermore, since the foregoing superimposition regions are limited to the foregoing range, the element spaces can be set to not smaller than half a length of each vibrating element in the width direction. Therefore, this allows the number of elements to be decreased as compared with a state in which the elements are densely provided.

The ultrasonic processing device in accordance with the present invention arranged as above is preferably arranged so that (1) the plurality of vibrating elements compose a plurality of element arrays so that each element array should include one or more vibrating elements arrayed in the width direction, that (2) the element arrays are provided in parallel in the predetermined direction, and in those in which not less than two of the vibrating elements are arrayed, the vibrating elements are arranged so that element spaces are formed, to a predetermined width each, between adjacent vibrating elements, and that (3) in the case where all the vibrating elements in two adjacent ones of the element arrays are projected to a plane perpendicular to the predetermined direction, (i) projection regions of the vibrating elements composing one of the element arrays and projection regions of the vibrating elements composing the other element array partly overlap each other, becoming formed in one continuous shape of a width equal to or more than a width of the ultrasonic processing target region, and (ii) a sum of widths of superimposition regions in the projection regions at which the projection regions of the vibrating elements are superimposed on the projection regions of the other vibrating elements is smaller than a sum of widths of regions at which the projection regions are not superimposed on the projection regions of the other vibrating elements.

The foregoing arrangement in which a plurality of vibrating elements are arranged so that their projected figures have superimposition regions and form a single belt-like region causes ultrasonic to be non-defectively projected throughout an entirety of the ultrasonic processing target region. Furthermore, since each width of superimposition regions in the projection regions of the vibrating elements is less than half of the length of the vibrating element in the width direction, this allows the number of elements to be decreased as compared with a state in which the elements are densely provided.

An ultrasonic processing device in accordance with the present invention includes (1) a distribution path through which liquid is flown in a distribution direction, (2) a plurality of vibrating elements provided in the distribution path for projecting ultrasonic to the liquid, and (3) liquid supply means for supplying the liquid to which ultrasonic has been projected, to an ultrasonic processing target region of the processing object, which is moved in a predetermined direction relatively with respect to the vibrating elements, via at least one liquid supply opening provided at an end of the distribution path, and the ultrasonic processing device is arranged so that (i) the plurality of vibrating elements are arranged so that a projection region A obtained by projecting all the vibrating elements onto a plane perpendicular to the predetermined direction becomes formed in one continuous shape, and the projection region A has a width that is greater than a width of a projection region B obtained by projecting one vibrating element selected from among the plurality of vibrating elements onto the plane, as well as equal to or greater than a width of the ultrasonic-projected region, (ii) widths of liquid supply openings corresponding to vibrating elements are equal to or greater than respective maximum spread widths of projection regions C that are obtained by projecting all of the vibrating elements that correspond to the liquid supply opening onto the plane, and (iii) a portion of the distribution path for the liquid immediately on the downstream side to the plurality of vibrating elements extends in a direction in a range of a horizontal direction to an upward direction, from the upstream side to the downstream side.

According to the foregoing arrangement, since the plurality of vibrating elements are arranged so that the projection region A as a single continuous region is formed, ultrasonic can be projected non-defectively through out an entirety of an ultrasonic processing target region of a predetermined width. Therefore, this ensures uniform projection of ultrasonic to a large-are region by means of vibrating elements that are easy to get and have high reliability, such as standard products or quasi-standard product. As a result, a uniform ultrasonic processing operation with respect to an entirety of a surface of a processing object in a large size can be realized, and ultrasonic processing operations can be uniformly applied to a plurality of processing objects under the same conditions. Consequently, it is possible to realize a uniform ultrasonic processing operation of high performance. Besides, since the processing time can be shortened, processing costs can be reduced.

Furthermore, since the liquid distribution path positioned right on the downstream side to the plurality of vibrating elements extends in a direction in a range from a horizontal direction to an upward direction from the upstream side to the downstream side, bubbles produced upon actuation of the vibrating elements are easily discharged, along the flow of the liquid toward the downstream side of the distribution path. Furthermore, bubbles once discharged to the downstream side of the distribution path do not intrude in the surroundings of the ultrasonic oscillation elements 13. Therefore, the necessary quantity of the liquid for discharging bubbles toward the downstream side of the distribution path can be drastically reduced. Additionally, a special device or the like for preventing bubbles from residing in the surroundings of the vibrating elements need not be provided, thereby resulting in simplification of the arrangement.

In other words, the foregoing arrangement ensures provision of an ultrasonic processing device that is capable of (1) allowing ultrasonic oscillation elements to carry out a stable operation without a complex structure, passage of a enormous quantity of liquid, and moreover, (2) carrying out uniform, non-defective ultrasonic projection with respect to a processing object.

The ultrasonic processing device in accordance with the present invention may be further arranged so that (1) the plurality of vibrating elements compose a plurality of element arrays so that each element array should include one or more vibrating elements arrayed in an intersection line direction that is a direction of a line at which a horizontal plane and the plane perpendicular to the predetermined direction intersect, and the element arrays are provided in parallel in the predetermined direction, and that (2) when the element arrays are projected to the plane, projection regions D of the vibrating elements composing one of the element arrays and projection regions E of the vibrating elements composing another one of the element arrays partly overlap each other, forming superimposition regions.

According to the foregoing arrangement, the vibrating elements composing different element arrays, respectively, for instance, adjacent element arrays, are arranged so that when they are projected on the foregoing plane, their projected figures form a belt-like region in which the projected figures partly overlap each other. Therefore, ultrasonic is projected so that the projected figures should have superimposition regions, thereby further ensuring ultrasonic projection throughout the entirety of the foregoing ultrasonic processing target region of the predetermined width. Consequently, the aforementioned effect can be further enhanced.

An ultrasonic processing device in accordance with the present invention includes (1) a distribution path through which liquid is flown in a distribution direction, (2) a plurality of vibrating elements provided in the distribution path for projecting ultrasonic to the liquid, and (3) liquid supply means for supplying the liquid to which ultrasonic has been projected, to an ultrasonic processing target region of the processing object, which is moved in a predetermined direction relatively with respect to the vibrating elements, via at least one liquid supply opening provided at an end of the distribution path, and the ultrasonic processing device is arranged so that (i) the plurality of vibrating elements are provided so that ultrasonic-projected regions to which ultrasonic is projected by the vibrating elements via the liquid overlap each other so that the ultrasonic processing target region should be completely covered by the ultrasonic-projected regions, and that (ii) a portion of the distribution path for the liquid immediately on the downstream side to the plurality of vibrating elements extends in a direction in a range of a horizontal direction to an upward direction, from the upstream side to the downstream side.

The foregoing arrangement in which the vibrating elements are provided so that ultrasonic-projected regions respectively corresponding to the vibrating elements overlap each other so that the ultrasonic processing target region should be completely covered by the ultrasonic-projected regions allows ultrasonic to be projected non-defectively through out an entirety of an ultrasonic processing target region of a predetermined width. Therefore, this ensures uniform projection of ultrasonic to a large-are region by means of vibrating elements that are easy to get and have high reliability, such as standard products or quasi-standard product. As a result, a uniform ultrasonic processing operation with respect to an entirety of a surface of a processing object in a large size can be realized, and ultrasonic processing operations can be uniformly applied to a plurality of processing objects under the same conditions. Consequently, it is possible to realize a uniform ultrasonic processing operation of high performance. Besides, since the processing time can be shortened, processing costs can be reduced.

Furthermore, since the liquid distribution path positioned right on the downstream side to the plurality of vibrating elements extends in a direction in a range from a horizontal direction to an upward direction from the upstream side to the downstream side, bubbles produced upon actuation of the vibrating elements are easily discharged, along the flow of the liquid toward the downstream side of the distribution path. Furthermore, bubbles once discharged to the downstream side of the distribution path do not intrude in the surroundings of the ultrasonic oscillation elements 13. Therefore, the necessary quantity of the liquid for discharging bubbles toward the downstream side of the distribution path can be drastically reduced. Additionally, a special device or the like for preventing bubbles from residing in the surroundings of the vibrating elements need not be provided, thereby resulting in simplification of the arrangement.

The ultrasonic processing device in accordance with the present invention arranged as above may be further arranged so that the liquid supply means includes nozzle means for converging the liquid to which ultrasonic has been projected, and supplying the same to the processing object, and the plurality of vibrating elements are provided in the nozzle means.

According to the foregoing arrangement, since output of ultrasonic is converged by the nozzle means, the output of ultrasonic is intensified, thereby resulting in further improvement of the efficiency of various processing operations. Furthermore, since the vibrating elements are provided in the nozzle means, the ultrasonic projected to the liquid is transmitted to the processing object, with substantially no attenuation of the same.

The ultrasonic processing device in accordance with the present invention arranged as above may be further arranged so as to include processing liquid supply means for supplying processing liquid used for applying a predetermined processing operation to the processing object, wherein (1) the liquid supply means supplies processing liquid as the liquid to which ultrasonic has been projected, to a lower surface of the processing object, and (2) the processing liquid supply means supplies the processing liquid to an upper surface of the processing object.

According to the foregoing arrangement, in a state in which the processing liquid is being supplied to the upper surface of the processing object, the processing liquid as liquid to which ultrasonic has been projected is supplied to the lower surface of the processing body. The vibration of the ultrasonic transmitted to the lower surface is also transmitted to the upper surface, thereby ensuring application of desired operations to the upper and lower surfaces both. Consequently, the processing efficiency can be further improved. Additionally, foreign substances removed from an upper surface thereof are prevented from going round to a lower surface thereof and adhering thereto, and damage of the processing object caused by such foreign substances can be prevented, for instance.

Furthermore, an electronic parts fabrication method in accordance with the present invention may be arranged so as to include the ultrasonic processing step for projecting ultrasonic to a processing object moving in a predetermined motion direction from a plurality of vibrating elements having spaces therebetween, each space exceeding an insulation distance for insulation between the vibrating elements, so that ultrasonic-projected regions of the vibrating elements should be caused to partly overlap each other on an ultrasonic processing target region of the processing object, in order to cause ultrasonic to be projected to a complete entirety of the ultrasonic processing target region.

According to the foregoing arrangement, the projection regions (ultrasonic-projected regions) of the vibrating elements partly overlap each other so as to cover an entirety of the ultrasonic processing target region, and ultrasonic generated therefrom, and moreover, the element spaces each exceeding the insulation distance are secured between the plurality of vibrating elements. Therefore, ultrasonic is projected throughout an entirety of the ultrasonic processing target region non-defectively, while the interference effect of ultrasonic can be decreased. This makes it possible to realize uniform ultrasonic projection to a large-area region by means of vibrating elements that are easy to get and have high reliability. Besides, since the processing time can be shortened, processing costs can be reduced. Furthermore, this allows the number of elements to be decreased as compared with a state in which the elements are densely provided.

The electronic parts fabrication method in accordance with the present invention arranged as above may be further arranged so that the ultrasonic processing step further includes the sub-step of supplying cleaning liquid for cleaning the processing object, or resist-stripping liquid for stripping resist applied on a surface of the processing object, while projecting ultrasonic thereto.

The foregoing method allows the electronic parts fabrication method of the present invention to be applied to an ultrasonic cleaning operation or a resist-stripping operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ultrasonic processing device for applying an ultrasonic processing operation to a processing object, said device comprising:

a plurality of vibrating elements for generating ultrasonic; and means for moving said processing object in a predetermined direction relatively with respect to said vibrating elements, wherein:

regions to which said vibrating elements project ultrasonic are ultrasonic-projected regions each having a predetermined width in a width direction that is substantially orthogonal to said predetermined direction, and a whole arrangement of said plurality of vibrating elements planarly extends in said predetermined direction and in said width direction; and by moving said processing object relatively in said predetermined direction, ultrasonic-projected regions of said vibrating elements are caused to cover an ultrasonic processing target region of said processing object, so that ultrasonic should be projected to a complete entirety of said ultrasonic processing target region, wherein:

said plurality of vibrating elements composes a plurality of element arrays so that each element array should include one or more vibrating elements arrayed in said width direction; and said element arrays are provided in parallel in said predetermined direction, and in those in which not less than two of said vibrating elements are arrayed, said vibrating elements are arranged so that:

an element space is formed, to a predetermined width each, between adjacent vibrating elements, at a position corresponding to a non-provision region including the element space in one of said element arrays, said vibrating element composing another one of said element arrays is placed, and the width of said element space exceeds an insulation distance for insulation between said vibrating elements.

2. The ultrasonic processing device as set forth in claim 1, wherein:

the whole arrangement of said plurality of vibrating elements is further arranged so that projection regions obtained by projecting said vibrating elements to a plane perpendicular to said predetermined direction form a single belt-like region of a width exceeding a width of said ultrasonic processing target region.

3. The ultrasonic processing device as set forth in claim 2, wherein:

when said plurality of element arrays is projected to said plane perpendicular to said predetermined direction, a projection region of said vibrating element composing one of said element arrays and projection region of said vibrating element composing another one of said element arrays overlap each other, forming a superimposition region.

4. The ultrasonic processing device as set forth in claim 2, wherein:

said vibrating element composing one of said element arrays is placed at a position corresponding to an insulating region provided between an adjacent vibrating element composing another one of said element arrays.

5. The ultrasonic processing device as set forth in claim 1, further comprising:

processing liquid supply means for supplying processing liquid used for applying a predetermined processing operation to said processing object.

6. The ultrasonic processing device as set forth in claim 5, wherein:

said vibrating elements are arranged so as to project ultrasonic to said ultrasonic processing target region of said processing object via said processing liquid, said ultrasonic processing device further comprising:
nozzle means for converging said processing liquid in said predetermined direction and supply the same to said processing object.

7. The ultrasonic processing device as set forth in claim 5, further comprising:

heating means for heating said processing liquid.

8. The ultrasonic processing device as set forth in claim 5, wherein:

said processing liquid supply means is arranged so as to supply processing liquid to both upper and lower surfaces of said processing object; and ultrasonic is projected by said vibrating elements to said processing liquid supplied to said upper surface.

9. The ultrasonic processing device as set forth in claim 5, wherein:

said processing liquid is cleaning liquid for cleaning said processing object.

10. The ultrasonic processing device as set forth in claim 5, wherein:

said processing liquid is resist-stripping liquid for stripping resist formed on a surface of said processing object.

11. The ultrasonic processing device as set forth in claim 1, wherein:

a frequency of ultrasonic projected by said vibrating elements is in a range of not less than 0.1 MHz and not more than 5 MHz.

12. The ultrasonic processing device as set forth in claim 1, wherein:

when said plurality of element arrays are projected to a plane perpendicular to said predetermined direction, a projection region of said vibrating element composing one of said element arrays and projection regions of said vibrating elements composing another one of said element arrays overlap each other, forming superimposition regions; and a width of each superimposition region is in a range of more than said insulation distance and less than ¼ of a dimension of one vibrating element.

13. The ultrasonic processing device as set forth in claim 1, wherein:

by moving said processing object relatively in said predetermined direction, portions of ultrasonic-projected regions of said vibrating elements are caused to overlap each other on an ultrasonic processing target region of said processing object, so that ultrasonic should be projected to a complete entirety of said ultrasonic processing target region.

14. An ultrasonic processing device for applying an ultrasonic processing operation to a processing object, said device comprising:

a plurality of vibrating elements for generating ultrasonic; and means for moving said processing object in a predetermined direction relatively with respect to said vibrating elements, wherein:

regions to which said vibrating elements project ultrasonic are ultrasonic-projected regions each having a predetermined width in a width direction that is substantially orthogonal to said predetermined direction, and a whole arrangement of said plurality of vibrating elements planarly extends in said predetermined direction and in said width direction; and by moving said processing object relatively in said predetermined direction, ultrasonic-projected regions of said vibrating elements are caused to cover an ultrasonic processing target region of said processing object, so that ultrasonic should be projected to a complete entirety of said ultrasonic processing target region, wherein:

said plurality of vibrating elements composes a plurality of element arrays so that each element array should include one or more vibrating elements arrayed in said width direction; and said element arrays are provided in parallel in said predetermined direction, and in those in which not less than two of said vibrating elements are arrayed, said vibrating elements are arranged so that:

an element space is formed, to a predetermined width each, between adjacent vibrating elements;

at a position corresponding to a non-projection region including the element space of said vibrating elements in one element array in a k'th line (k: natural number), said vibrating element composing one element array in a k+1'th line is placed; and when $(n-1)M \leq L < nM$ is satisfied where L is a width of said ultrasonic processing target region of said processing object, M is a dimension of said vibrating element, and n is a natural number not less than 3, the number of said vibrating elements composing said element array in the k'th line and the number of said vibrating element composing said element array in the k+1'th line are set to (n+1)/2 and (n−1)/2, respectively, when n is an odd number, while the numbers of said vibrating elements composing said element arrays in the k'th and k+1'th lines are set to n/2 each, when n is an even number.

15. The ultrasonic processing device as set forth in claim 14, wherein:
when said plurality of element arrays are projected to a plane perpendicular to said predetermined direction, a projection region of said vibrating element composing one of said element arrays and projection regions of said vibrating elements composing another one of said element arrays overlap each other, forming superimposition regions; and
a width of each superimposition region is in a range of more than said insulation distance and less than ¼ of a dimension of one vibrating element.

16. The ultrasonic processing device as set forth in claim 14, wherein:
the whole arrangement of said plurality of vibrating elements is further arranged so that projection regions obtained by projecting said vibrating elements to a plane perpendicular to said predetermined direction form a single belt-like region of a width exceeding a width of said ultrasonic processing target region.

17. The ultrasonic processing device as set forth in claim 16, wherein:
when said plurality of element arrays is projected to said plane perpendicular to said predetermined direction, a projection region of said vibrating element composing one of said element arrays and projection region of said vibrating element composing another one of said element arrays overlap each other, forming a superimposition region.

18. The ultrasonic processing device as set forth in claim 16, wherein:
said vibrating element composing one of said element arrays is placed at a position corresponding to an insulating region provided between an adjacent vibrating element composing another one of said element arrays.

19. The ultrasonic processing device as set forth in claim 14, further comprising:
processing liquid supply means for supplying processing liquid used for applying a predetermined processing operation to said processing object.

20. The ultrasonic processing device as set forth in claim 19, wherein:
said vibrating elements are arranged so as to project ultrasonic to said ultrasonic processing target region of said processing object via said processing liquid,
said ultrasonic processing device further comprising:
nozzle means for converging said processing liquid in said predetermined direction and supply the same to said processing object.

21. The ultrasonic processing device as set forth in claim 19, further comprising:
heating means for heating said processing liquid.

22. The ultrasonic processing device as set forth in claim 19, wherein:
said processing liquid supply means is arranged so as to supply processing liquid to both upper and lower surfaces of said processing object; and
ultrasonic is projected by said vibrating elements to said processing liquid supplied to said upper surface.

23. The ultrasonic processing device as set forth in claim 19, wherein:
said processing liquid is cleaning liquid for cleaning said processing object.

24. The ultrasonic processing device as set forth in claim 19, wherein:
said processing liquid is resist-stripping liquid for stripping resist formed on a surface of said processing object.

25. The ultrasonic processing device as set forth in claim 14, wherein:
a frequency of ultrasonic projected by said vibrating elements is in a range of not less than 0.1 MHz and not more than 5 MHz.

26. The ultrasonic processing device as set forth in claim 14, wherein:
by moving said processing object relatively in said predetermined direction, portions of ultrasonic-projected regions of said vibrating elements are caused to overlap each other on an ultrasonic processing target region of said processing object, so that ultrasonic should be projected to a complete entirety of said ultrasonic processing target region.

27. An ultrasonic processing device for applying an ultrasonic processing operation to a processing object, said device comprising:
a plurality of vibrating elements for generating ultrasonic; and
means for moving said processing object in a predetermined direction relatively with respect to said vibrating elements, wherein:
regions to which said vibrating elements project ultrasonic are ultrasonic-projected regions each having a predetermined width in a width direction that is substantially orthogonal to said predetermined direction, and a whole arrangement of said plurality of vibrating elements planarly extends in said predetermined direction and in said width direction, and
by moving said processing object relatively in said predetermined direction, ultrasonic-projected regions of said vibrating elements are caused to cover an ultrasonic processing target region of said processing object, so that ultrasonic should be projected to a complete entirety of said ultrasonic processing target region; and
a distribution path through which liquid is flown in a distribution direction, said plurality of vibrating elements being provided in said distribution path so as to project ultrasonic to the liquid; and
liquid supply means for supplying said liquid to which ultrasonic has been projected, to an ultrasonic processing target region of said processing object, which is moved in a predetermined direction relatively with respect to said vibrating elements, via at least one liquid supply opening provided at an end of said distribution path, wherein:
a portion of said distribution path for said liquid immediately on the downstream side to said plurality of vibrating elements extends in a direction in a range of a horizontal direction to an upward direction, from the upstream side to the downstream side, wherein:
said plurality of vibrating elements is arranged so that a projection region A obtained by projecting all said vibrating elements onto a plane perpendicular to said predetermined direction becomes formed in one continuous shape, and said projection region A has a width that is greater than a width of a projection region B obtained by projecting one vibrating element appropriately selected from among said plurality of vibrating elements onto said plane, as well as equal to or greater than a width of said ultrasonic-projected region; and a width of a liquid supply opening corresponding to said vibrating elements is equal to or greater than a maximum spread width of a projection region C that is obtained by projecting all of said vibrating elements that correspond to said liquid supply opening onto said plane.

28. The ultrasonic processing device as set forth in claim 27, wherein:

said plurality of vibrating elements compose a plurality of element arrays so that each element array should include one or more vibrating elements arrayed in an intersection line direction that is a direction of a line at which a horizontal plane and said plane perpendicular to said predetermined direction intersect, and said element arrays are provided in parallel in said predetermined direction; and when said element arrays are projected to said plane, a projection region D of said vibrating element composing one of said element arrays and projection region E of said vibrating element composing another one of said element arrays partly overlap each other, forming a superimposition region.

29. The ultrasonic processing device as set forth in claim 27, wherein:

said liquid supply means includes nozzle means for converging said liquid to which ultrasonic has been projected, and supplying the same to said processing object, and said plurality of vibrating elements are provided in said nozzle means.

30. The ultrasonic processing device as set forth in claim 27, wherein:

said liquid is processing liquid used for applying a predetermined processing operation to said processing object.

31. The ultrasonic processing device as set forth in claim 30, wherein:

a frequency of ultrasonic projected by said vibrating elements is in a range of not less than 0.1 MHz and not more than 5 MHz.

32. The ultrasonic processing device as set forth in claim 30, further comprising:

processing liquid supply means for supplying processing liquid used for applying a predetermined processing operation to said processing object, wherein:

said liquid supply means supplies processing liquid as said liquid to which ultrasonic has been projected, to a lower surface of said processing object; and said processing liquid supply means supplies said processing liquid to an upper surface of said processing object.

33. The ultrasonic processing device as set forth in claim 30, further comprising:

heating means for heating said processing liquid.

34. The ultrasonic processing device as set forth in claim 30, wherein:

said processing liquid is cleaning liquid for cleaning said processing object.

35. The ultrasonic processing device as set forth in claim 30, wherein:

said processing liquid is resist-stripping liquid for stripping resist applied on a surface of said processing object.

36. An ultrasonic processing device for applying an ultrasonic processing operation to a processing object, said device comprising:

a plurality of vibrating elements for generating ultrasonic; and means for moving said processing object in a predetermined direction relatively with respect to said vibrating elements, wherein:

regions to which said vibrating elements project ultrasonic are ultrasonic-projected regions each having a predetermined width in a width direction that is substantially orthogonal to said predetermined direction, and a whole arrangement of said plurality of vibrating elements planarly extends in said predetermined direction and in said width direction; and by moving said processing object relatively in said predetermined direction, ultrasonic-projected regions of said vibrating elements are caused to cover an ultrasonic processing target region of said processing object, so that ultrasonic should be projected to a complete entirety of said ultrasonic processing target region, wherein:

said plurality of vibrating elements compose a plurality of element arrays so that each element array should include one or more vibrating elements arrayed in said width direction;

said element arrays are provided in parallel in said predetermined direction, and in those in which not less than two of said vibrating elements are arrayed, said vibrating elements are arranged so that an element space is formed, to a predetermined width each, between adjacent vibrating elements; and in the case where all said vibrating elements in two adjacent ones of said element arrays are projected to a plane perpendicular to said predetermined direction, projection regions of said vibrating elements composing one of said element arrays and projection regions of said vibrating elements composing the other element array partly overlap each other, becoming formed in one continuous shape of a width equal to or more than a width of said ultrasonic processing target region, and in each projection region, a sum of a width of a superimposition region at which said projection region of said vibrating element is superimposed on said projection region of the other vibrating element is smaller than a sum of a width of a region at which said projection region is not superimposed on said projection region of the other vibrating elements.

37. The ultrasonic processing device as set forth in claim 36, further comprising:

processing liquid supply means for supplying processing liquid used for applying a predetermined processing operation to said processing object.

38. The ultrasonic processing device as set forth in claim 37, wherein:
said vibrating elements are arranged so as to project ultrasonic to said ultrasonic processing target region of said processing object via said processing liquid,
said ultrasonic processing device further comprising:
nozzle means for converging said processing liquid in said predetermined direction and supply the same to said processing object.

39. The ultrasonic processing device as set forth in claim 37, further comprising:
heating means for heating said processing liquid.

40. The ultrasonic processing device as set forth in claim 37, wherein:
said processing liquid supply means is arranged so as to supply processing liquid to both upper and lower surfaces of said processing object; and
ultrasonic is projected by said vibrating elements to said processing liquid supplied to said upper surface.

41. The ultrasonic processing device as set forth in claim 37, wherein:
said processing liquid is cleaning liquid for cleaning said processing object.

42. The ultrasonic processing device as set forth in claim 37, wherein:
said processing liquid is resist-stripping liquid for stripping resist formed on a surface of said processing object.

43. The ultrasonic processing device as set forth in claim 36, wherein:
a frequency of ultrasonic projected by said vibrating elements is in a range of not less than 0.1 MHz and not more than 5 MHz.

44. The ultrasonic processing device as set forth in claim 36, wherein:
by moving said processing object relatively in said predetermined direction, portions of ultrasonic-projected regions of said vibrating elements are caused to overlap each other on an ultrasonic processing target region of said processing object, so that ultrasonic should be projected to a complete entirety of said ultrasonic processing target region.

45. An electronic parts fabrication method, comprising an ultrasonic processing step for applying an ultrasonic processing operation to a processing object, wherein said ultrasonic processing step comprises:
providing a plurality of vibrating elements for generating ultrasonic, wherein
said plurality of vibrating elements composes a plurality of element arrays so that each element array should include one or more vibrating elements arrayed in a width direction; and
said element arrays are provided in parallel in a predetermined direction, and in those in which not less than two of said vibrating elements are arrayed, said vibrating elements are arranged so that:
an element space is formed, to a predetermined width each, between adjacent vibrating elements, at a position corresponding to a non-provision region including the element space in one of said element arrays, said vibrating element composing another one of said element arrays is placed, and
the width of said element space exceeds an insulation distance for insulation between said vibrating elements; and
moving said processing object in a predetermined direction relatively with respect to said vibrating elements, so that ultrasonic-projected regions of said vibrating elements should be caused to partly overlap each other on an ultrasonic processing target region of said processing object, in order to cause ultrasonic to be projected to a complete entirety of said ultrasonic processing target region.

46. The electronic parts fabrication method as set forth in claim 45, wherein:
spaces each having a width exceeding an insulation distance for insulation between said vibrating elements are provided between said vibrating elements.

47. The electronic parts fabrication method as set forth in claim 45, wherein:
said ultrasonic processing step further includes the sub-step of supplying cleaning liquid for cleaning said processing object, or resist-stripping liquid for stripping resist applied on a surface of said processing object, while projecting ultrasonic thereto.

48. An electronic parts fabrication method, comprising the ultrasonic processing step for applying an ultrasonic processing operation to a processing object, wherein said ultrasonic processing step comprises:
providing a plurality of vibrating elements for generating ultrasonic; wherein:
said plurality of vibrating elements composes a plurality of element arrays so that each element array should include one or more vibrating elements arrayed in a width direction, and
said element arrays are provided in parallel in a predetermined direction, and in those in which not less than two of said vibrating elements are arrayed, said vibrating elements are arranged so that:
an element space is formed, to a predetermined width each, between adjacent vibrating elements, at a position corresponding to a non-projection region including the element space of said vibrating elements in one element array in a k'th line (k: natural number), said vibrating element composing one element array in a k+1'th line is placed, and
when $(n-1)M \leq L < nM$ is satisfied where Lmm is a width of said ultrasonic processing target region of said processing object, Mmm is a dimension of said vibrating element, and n is a natural number not less than 3, the number of said vibrating elements composing said element array in the k'th line and the number of said vibrating element composing said element array in the k+1'th line are set to $(n+1)/2$ and $(n-1)/2$, respectively, when n is an odd number, while the numbers of said vibrating elements composing said element arrays in the k'th and k+1'th lines are set to $n/2$ each, when n is an even number; and
moving said processing object in said predetermined direction relatively with respect to said vibrating elements, so that ultrasonic-projected regions of said vibrating elements should be caused to partly overlap each other on an ultrasonic processing target region of said processing object, in order to cause ultrasonic to be projected to a complete entirety of said ultrasonic processing target region.

49. The electronic parts fabrication method as set forth in claim 48, wherein:
spaces each having a width exceeding an insulation distance for insulation between said vibrating elements are provided between said vibrating elements.

50. The electronic parts fabrication method as set forth in claim 48, wherein:

said ultrasonic processing step further includes the sub-step of supplying cleaning liquid for cleaning said processing object, or resist-stripping liquid for stripping resist applied on a surface of said processing object, while projecting ultrasonic thereto.

51. An electronic parts fabrication method, comprising the ultrasonic processing step for applying an ultrasonic processing operation to a processing object, wherein said ultrasonic processing step comprises:

providing a plurality of vibrating elements for generating ultrasonic; wherein:

said plurality of vibrating elements compose a plurality of element arrays so that each element array should include one or more vibrating elements arrayed in a width direction, said element arrays are provided in parallel in a predetermined direction, and in those in which not less than two of said vibrating elements are arrayed, said vibrating elements are arranged so that an element space is formed, to a predetermined width each, between adjacent vibrating elements; and in the case where all said vibrating elements in two adjacent ones of said element arrays are projected to a plane perpendicular to said predetermined direction, projection regions of said vibrating elements composing one of said element arrays and projection regions of said vibrating elements composing the other element array partly overlap each other, becoming formed in one continuous shape of a width equal to or more than a width of said ultrasonic processing target region, and in each projection region, a sum of a width of a superimposition region at which said projection region of said vibrating element is superimposed on said projection region of the other vibrating element is smaller than a sum of a width of a region at which said projection region is not superimposed on said projection region of the other vibrating elements; and moving said processing object in said predetermined direction relatively with respect to said vibrating elements, so that ultrasonic-projected regions of said vibrating elements should be caused to partly overlap each other on an ultrasonic processing target region of said processing object, in order to cause ultrasonic to be projected to a complete entirety of said ultrasonic processing target region.

52. The electronic parts fabrication method as set forth in claim 51, wherein:

spaces each having a width exceeding an insulation distance for insulation between said vibrating elements are provided between said vibrating elements.

53. The electronic parts fabrication method as set forth in claim 51, wherein:

said ultrasonic processing step further includes the sub-step of supplying cleaning liquid for cleaning said processing object, or resist-stripping liquid for stripping resist applied on a surface of said processing object, while projecting ultrasonic thereto.

* * * * *